United States Patent [19]

Smayling et al.

[11] Patent Number: 5,204,541
[45] Date of Patent: Apr. 20, 1993

[54] GATED THYRISTOR AND PROCESS FOR ITS SIMULTANEOUS FABRICATION WITH HIGH- AND LOW-VOLTAGE SEMICONDUCTOR DEVICES

[75] Inventors: Michael C. Smayling, Missouri City; Lembit Soobik, Houston, both of Tex.

[73] Assignee: Texas Instruments Incorporated, Dallas, Tex.

[21] Appl. No.: 723,082

[22] Filed: Jun. 28, 1991

[51] Int. Cl.⁵ .................. H01L 29/74; H01L 27/02
[52] U.S. Cl. .................................. 257/138; 257/140
[58] Field of Search .................. 357/43, 46, 38, 42; 307/630, 274, 275

[56] References Cited

U.S. PATENT DOCUMENTS

| | | | |
|---|---|---|---|
| 4,553,041 | 11/1985 | Yim | 307/630 |
| 4,569,117 | 2/1986 | Baglee et al. | 29/571 |
| 4,581,543 | 4/1986 | Herberg | 307/630 |
| 4,669,177 | 6/1987 | D'Arrigo et al. | 29/571 |
| 4,797,372 | 1/1989 | Verret et al. | 437/34 |
| 4,887,142 | 12/1989 | Bertotti et al. | 357/43 |
| 4,975,764 | 12/1990 | Hsu | 357/43 |
| 5,014,102 | 5/1991 | Adler | 357/43 |
| 5,041,895 | 8/1991 | Contiero | 357/42 |

OTHER PUBLICATIONS

Q. Huang et al., "Analysis on N-Channel MOS-Controlled Thyristors", IEEE Transactions on Electron Devices, vol. 38, No. 7, pp. 1612-1618 (Jul. 1991).
Surinder Krishna et al., "An Analog Technology Integrates Bipolar, CMOS and High-Voltage DMOS Transistors", IEEE, 1984, pp. 89-95.
Sahir Parpia et al., "Modeling and Characterization of CMOS-Compatible High Voltage Device Structures", IEEE, 1987, pp. 2335-2343.
Dumitru Cioaca et al., "A Million-Cycle CMOS 256K EEPROM", IEEE, 1987, pp. 684-691.
K. Y. Chang et al., "An Advanced High Voltage CMOS Process for Custom Logic Circuits with Embedded EEPROM", IEEE, 1988, Custom Integrated Circuits Conference, 25.5.1-25.5.5.

Primary Examiner—Jerome Jackson, Jr.
Attorney, Agent, or Firm—Robby T. Holland; Richard L. Donaldson; William Hiller

[57] ABSTRACT

One embodiment of the present invention is a gated thyristor formed at a face of semiconductor layer of a first conductivity type, comprising: a first well formed at the face to be of a second conductivity type opposite the first conductivity type; a second well of a first conductivity type formed at the face to be enclosed by the first well; an emitter region of the second conductivity type formed at the face to be enclosed by the second well; first and second highly doped regions formed at the face to be of the first conductivity type, the first highly doped region formed within the first well and the second highly doped region formed in the first well and at least partially within the second well, a subregion of the first well spacing apart the first and second highly doped regions and operable to act as a base of a first bipolar transistor; third, fourth and fifth highly doped regions formed at the face to be of the second conductivity type, the third and fourth highly doped regions spaced from the first well, the fifth highly doped region formed to be at least partially within the first well, channel regions of the semiconductor layer spacing apart the third region from the fourth region and the fourth region from the fifth region, the third region and the fifth region spaced apart, conductive gates insulatively disposed over the channel regions; and said third region conductively connected to the second highly doped region, the fourth region conductively connected to the emitter region.

13 Claims, 49 Drawing Sheets

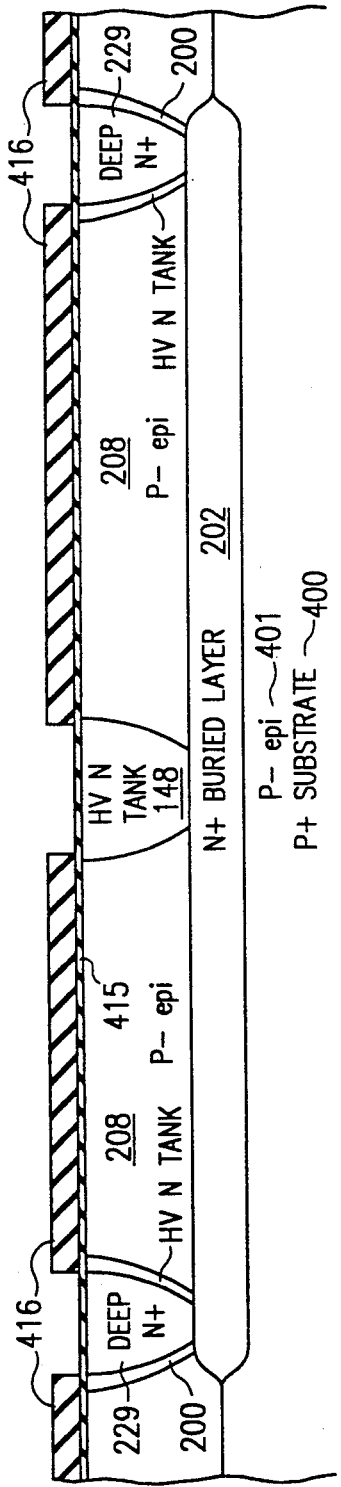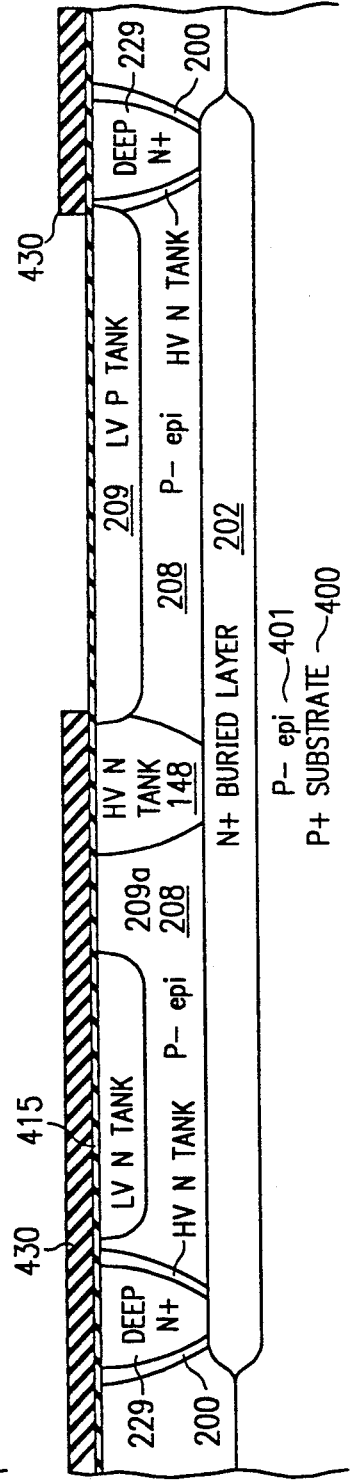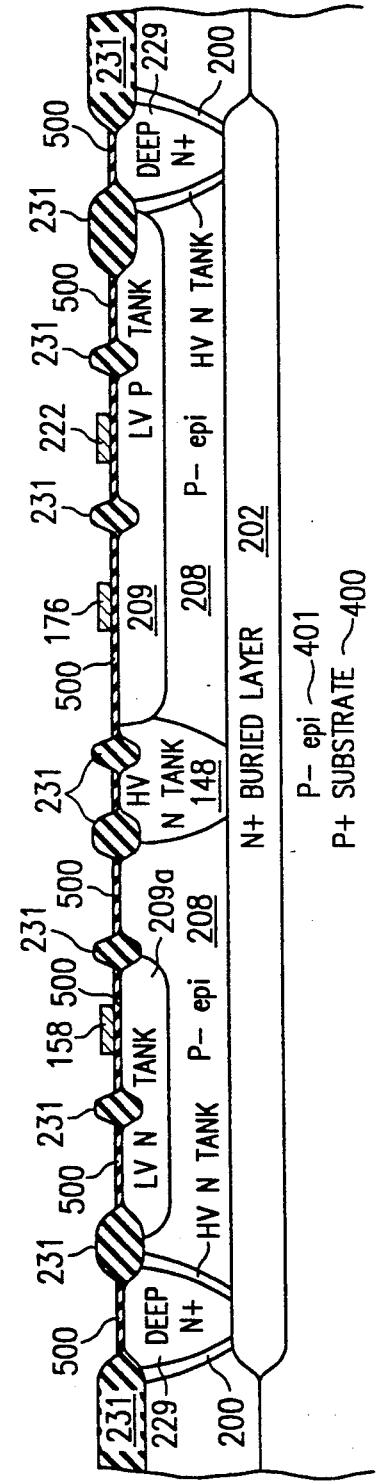

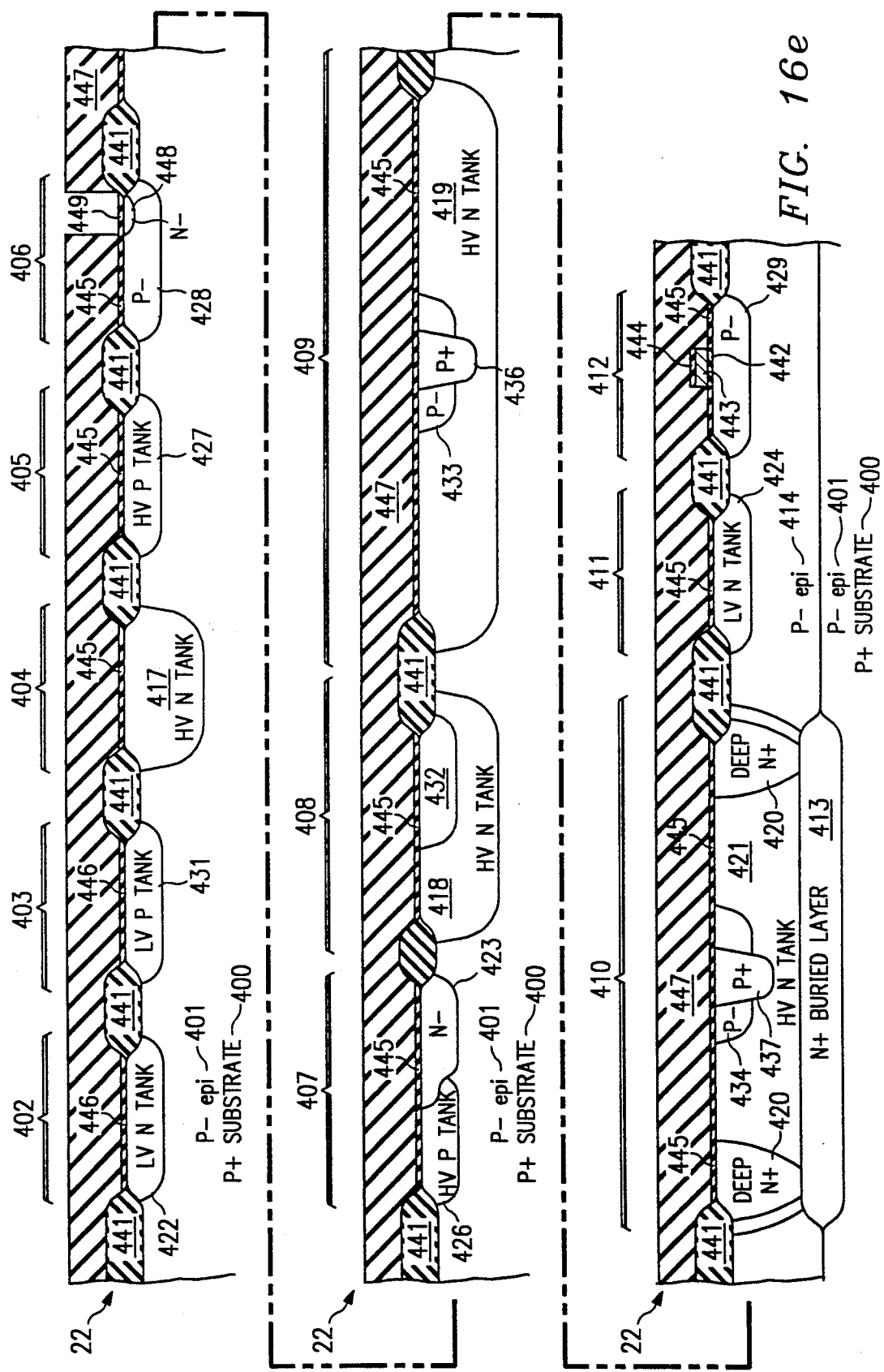

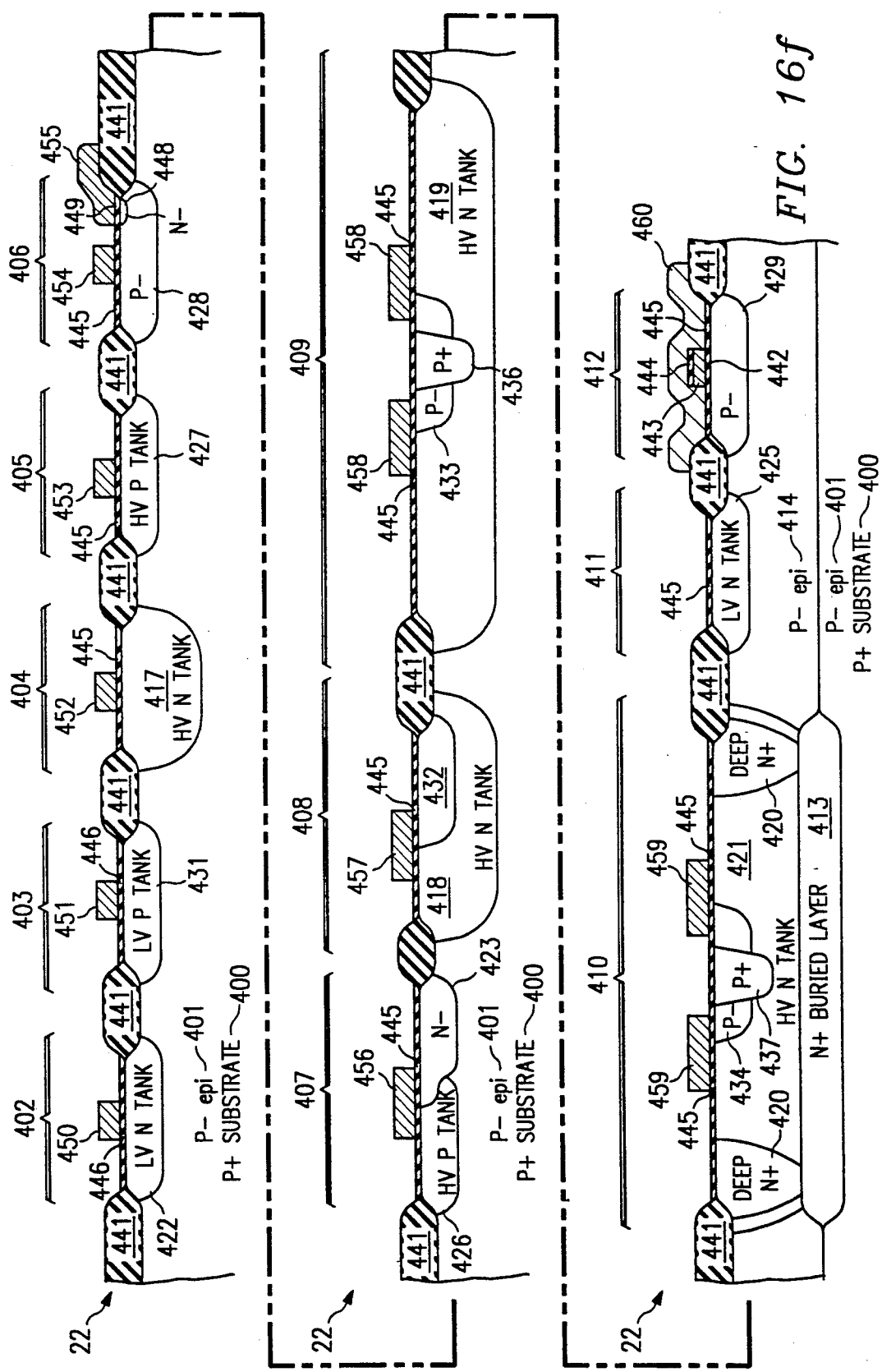

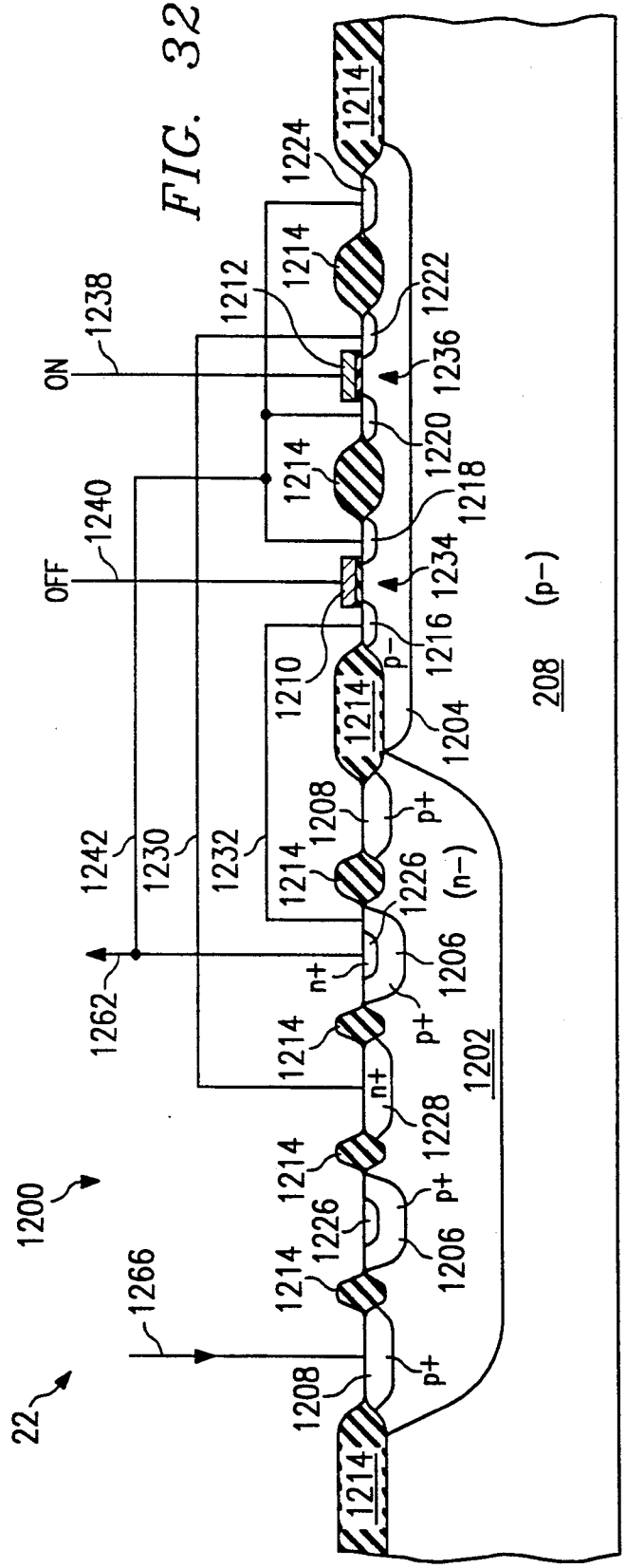

GATED THYRISTOR AND PROCESS FOR ITS SIMULTANEOUS FABRICATION WITH HIGH- AND LOW-VOLTAGE SEMICONDUCTOR DEVICES

NOTICE (C) Copyright, *M* Texas Instruments Incorporated 1990. A portion of the disclosure of this patent document contains material which is subject to copyright and mask work protection. The copyright and mask works owner has no objection to the facsimile reproduction by anyone of the patent document or the patent disclosure, as it appears in the Patent and Trademark Office patent file or records, but otherwise reserves all copyright and mask work rights whatsoever.

CROSS-REFERENCE TO RELATED APPLICATIONS

The following coassigned copending patent applications are hereby incorporated by reference:

| Ser. No. | Filing Date | TI Case No. |
| --- | --- | --- |
| 07/617,850 | 11/21/90 | TI-15089 |
| 07/618,279 | 11/21/90 | TI-15094 |
| 07/618,351 | 11/21/90 | TI-15095 |
| 07/618,273 | 11/21/90 | TI-15096 |
| 07/618,353 | 11/21/90 | TI-15090 |

TECHNICAL FIELD OF THE INVENTION

This invention generally relates to integrated circuit power devices, processes and integrated circuits produced thereby, and more particularly to gated thyristors and processes for their simultaneous fabrication with low-voltage semiconductor devices, integrated circuits containing the same, systems and methods.

BACKGROUND OF THE INVENTION

Without limiting the scope of the invention, its background is described in conjunction with automotive electrical systems, as an example.

Conventional automobile microcontrollers, limited as they are to low-power components, are connected to the rest of an automobile's electrical system through intermediary relays and high-power devices. For example, an automobile microcontroller may be connected to an indicator light, cornering lamp or even a headlamp through a relatively high-power lamp driver. A low-power, low-voltage signal line is typically connected to a signal input of a lamp driver. The lamp driver is connected to a 12 volt automobile power supply and the lamp to be driven. The provision of separate integrated circuits divided among power and non-power devices requires more space, separate packaging, an increased number of part-to-part external connections and incrementally greater assembly costs.

Heretofore, in this field, high-power electronic components had to be fabricated on integrated circuit chips separate from IC chips for low-power, logic components. Conventionally, high-power transistors had different processing requirements that were not easily integrable with low-power logic devices, such as 5-volt insulated-gate field transistors. On the one hand, certain voltage regulator and power devices mandate that power transistors directly exposed to the usual 12-volt conventional automobile electrical system be capable of withstanding transients that may be as high as 60 volts. On the other hand, the implantation, isolation and doping characteristics of these devices made their cofabrication with smaller, process-labile devices difficult. For example, submicron devices are usually sited within tanks having relatively high dopant concentrations. The implantation energies and concentrations of these tanks are generally incompatible with the corresponding implantation energies and dopant concentrations for high-voltage, high-power devices. It is, however, desirable for automobile system microcontrollers to be monolithic, i.e., fabricated on the surface of one semiconductor chip, rather than have one chip for voltage regulation and other high-power applications and another chip for the performance of logic and the like.

SUMMARY OF THE INVENTION

According to one aspect of the invention, a gated thyristor circuit includes first and second bipolar transistors of opposite conductivity types. An emitter of a first of the bipolar transistors is coupled to a first supply voltage. A base-emitter junction of the first bipolar transistor has a first resistance value. A collector of the first bipolar transistor is coupled to the base of the second bipolar transistor. The collector of the second bipolar transistor is coupled to the base of the first bipolar transistor. The base-emitter junction of the second bipolar transistor has a second resistance value. The emitter of the second bipolar transistor is coupled to the second supply voltage. A third transistor has a current path and a control electrode, with the control electrode operable to control the conductance of the current path upon a signal being selectively impressed thereon. The current path couples the base of the first bipolar transistor to the first supply voltage. The conductance of the current path is substantially more than the conductance of the base-emitter junction of the first bipolar transistor in response to a preselected state of said signal. A fourth transistor has a current path and a control electrode, with the control electorde operable to control the conductance of the current path upon a second signal being selectively impressed thereon. The current path couples the base of the second bipolar transistor to the second supply voltage. The conductance of the current path is substantially more than the conductance of the base having an emitter junction of the second bipolar transistor in response to a preselected state of the second signal.

According to another aspect of the invention, a fifth transistor is provided which selectively couples the collector of the second bipolar transistor to the second supply voltage. By sinking current through the base-emitter junction of the first bipolar transistor to the second supply voltage, the fifth transistor is operable to latch the thyristor into an on condition.

According to other aspects of the invention, the gated thyristor may be formed as a portion of an automotive microcontroller, wherein the process for fabricating a single microcontroller chip has been integrated such that low and high power devices may be simultaneously formed. The gated thyristor of the invention may be formed over a buried layer and within a guard ring of a conductivity type opposite the semiconductor layer in which the device is otherwise formed. In this embodiment, a somewhat central high-voltage tank region of the second conductivity type divides the remaining device area into two regions, both having the first conductivity type. In another physical form of the gated thyristor, the switching transistors are formed outside of a well of a second conductivity type opposite the conductivity type of the semiconductor layer, while the bipolar components are formed entirely or mostly within the well.

The present invention conveys distinct technical advantages in that a relatively high-power thyristor or switch is provided with a simple turn-on and turn-off mechanism which can be built in an integrated process with both other high-power and low-power devices.

BRIEF DESCRIPTION OF THE DRAWINGS

For a more complete understanding of the present invention, and the advantages thereof, reference is now made to the following description taken in conjunction with the accompanying drawings, in which:

FIGS. 7a, b, f and g are highly magnified, schematic elevational sectional views of a semiconductor substrate or layer, showing respective stages in the fabrication of a first physical embodiment of the thyristor of the invention;

FIGS. 7g-1 is a highly magnified schematic sectional view of a second physical embodiment of a thyristor according to the invention;

FIGS. 16a-16g are highly magnified schematic sectional views of different portions of a microcontroller chip showing successive stages in the simultaneous fabrication of several different semiconductor devices, the devices being shown in close association with each other only for the purpose of illustrating the effects of the integrated process on the devices;

FIG. 16g-1 is a more detailed schematic sectional view of a vertical DMOS transistor shown in FIGS. 16a-h;

FIG. 16h-1 is a plan view of the vertical DMOS transistor shown in FIG. 16g-1, FIG. 16g-1 being taken substantially along line g-1—g-1 of FIG. 16h-1;

FIG. 32 is a highly magnified schematic sectional view of a further physical embodiment of a thyristor according to the invention;

DETAILED DESCRIPTION OF THE INVENTION

Preferred embodiments of the processes, devices and systems described herein and their advantages are best understood by referring to FIGS. 1 through 31 of the drawings, like numerals being used for like and corresponding parts within the various drawings.

Figure 1:
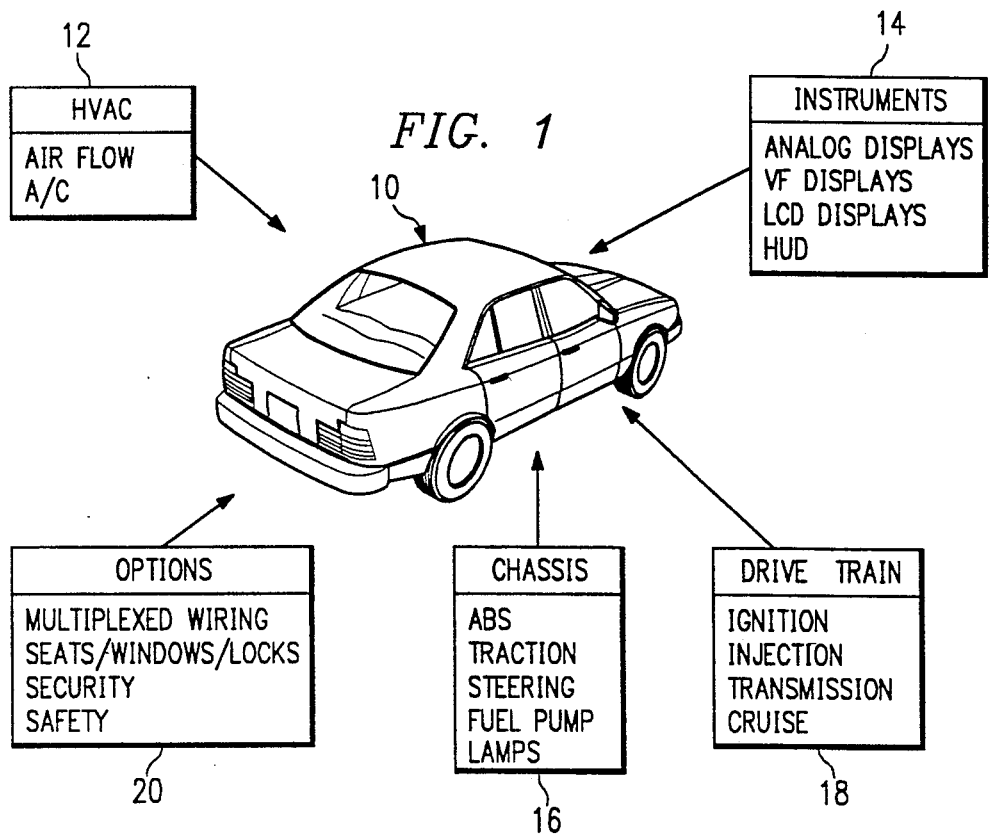
FIG. 1 is a schematic diagram showing an automobile with a plurality of microcontrollers fabricated according to the process described herein for use in controlling automobile ignition, running lamp and solenoid drivers, and performing other functions.

Referring first to FIG. 1, a perspective view of an automobile 10 is shown, in which one or more microcontrollers fabricated according to the integrated process described herein may be employed. Microcontrollers can be used, for example, in the heating, ventilating and air conditioning (HVAC) system 12 to control relative amounts of air flow and whether the air conditioning system should be engaged. Microcontrollers may also be used in the instrumentation 14 of the automobile, where they can function to drive analog gauges, VF displays, liquid crystal displays and heads-up displays. Microcontrollers can be used in the chassis 16 to control, for example, an antilock breaking system, limited slip differential traction, differential power steering, the fuel pump and lamp, including headlights. In the drive train 18, microcontrollers can be used to control the ignition, fuel injection, gearing and shift pattern of the transmission, as well as a cruise computer. Microcontrollers also may be used to control the operation of any of several popular automobile options 20, including power seats, windows and locks, security systems, safety features such as air bags and seat belt sensors and multiplexed wiring for serving any and all of these.

Figure 2:
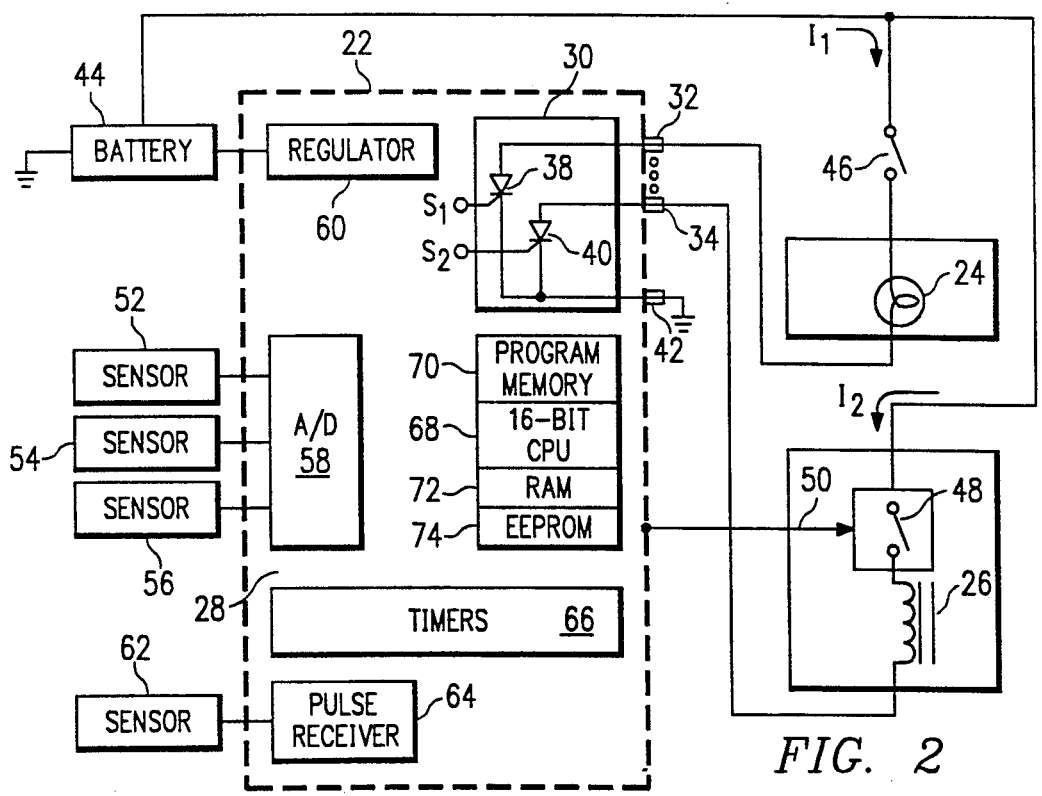
FIG. 2 is a simplified electrical circuit diagram showing the connection of a microcontroller to various lamps and solenoids as driven components.

Referring next to FIG. 2, a schematic representation of a microcontroller chip 22 is shown as employed as a lamp and solenoid driver for driving a lamp unit 24 and a solenoid 26.

The chip 22 has a microcontroller integrated circuit region 28 and a thyristor power switch integrated circuit region 30. Remarkably, these two regions are integrated onto the same integrated circuit chip or die 22. The preferred embodiment resists interference to microcontroller 28 due to electrical transients in switching by thyristor power switch integrated circuit region 30.

Controlled electrical elements such as the lamp unit 24 and the solenoid 26 are directly connected to contact elements 32 and 34 which are sized and coordinated for currents in the multi-ampere range. Thyristor circuits 38 and 40 are integrated on-chip and have anodes connected to the contact elements 32 and 34 respectively. The cathodes are connected to a heavy common contact element 42 (or respective contact elements as desired) which is connected for return of power currents to a battery 44. Thyristors 38 and 40 are each sized to conduct peripheral device operating current on the order of at least hundreds of milliamperes, and preferably in the multi-ampere range. Battery 44 is connected by a switch assembly 46 to deliver a current $I_1$ to the lamp unit 24. A relayed switch 48 is operable to connect battery 44 to solenoid 26 responsive to a preselected signal on control line 50. Control line 50 may, for example, be connected back to chip 22, where it may emanate from an output register (not shown) on chip 22. This output register could store a bit for operating the solenoid switch or relay 48 in response to the on-chip microprocessor (described below).

A set of sensors 52, 54, . . . 56 (only three shown; there could be several more) are connected to the microcontroller 28. The sensors 52-56 are shown to be analog, and an analog to digital converter (ADC) 58 is suitably provided on-chip or off-chip if desired.

The 12-volt automobile battery 44 is connected to a voltage regulator and power supply 60 located on chip 22. The location of the regulator on-chip mandates that certain kinds of high-voltage power transistors be on this chip that are capable of withstanding transients that may be as high as 60 volts in automobile electrical systems. These power transistors therefore have different processing requirements than lower voltage logic transistors. The low-voltage logic transistors (see, e.g., transistors 402 and 403 in FIG. 16g) typically have channel lengths of less than one micron. Conventionally, the different process requirements of these power transistors have necessitated their location in a separate integrated circuit. The integrated process described herein, however, allows the power transistors, which for example are included in voltage regulator 60, the thyristor circuits 38 and 40, and the other high-voltage or high power components on the chip 22, to be fabricated in a single process together with the rest of the devices on the chip 22. Regulator 60 supplies a variety of voltages to the rest of chip 22, including eighteen volts, five volts and zero volts.

A sensor 62 may, for example, count wheel revolutions and may pulse the number of these revolutions to a pulse receiver 64 located on chip 22. Various timers 66 may be included on chip 22, including a "watch dog" timer for automatically resetting the currently running program to a beginning state responsive to either internally or externally induced software errors. Timer block 66 also includes clock generators (see FIGS. 3 and 4) to supply synchronous signals to the rest of chip 22.

The microcontroller chip 22 also includes a preferably 16-bit CPU 68 for the performance of program instructions, a program memory 70 for the storage of such instructions, a random access memory 72 and an electrically erasable and programmable read-only memory 74. The CPU 68 includes a controller. The results of the instructions carried out by the CPU 68 may be stored in RAM 72. The EEPROM block 74 may be used, for example, for program memory for the program run on CPU 68, data storage, or constants concerning operation of the chip 22 or of the automobile 10 which are supplied by the user.

Figure 3:
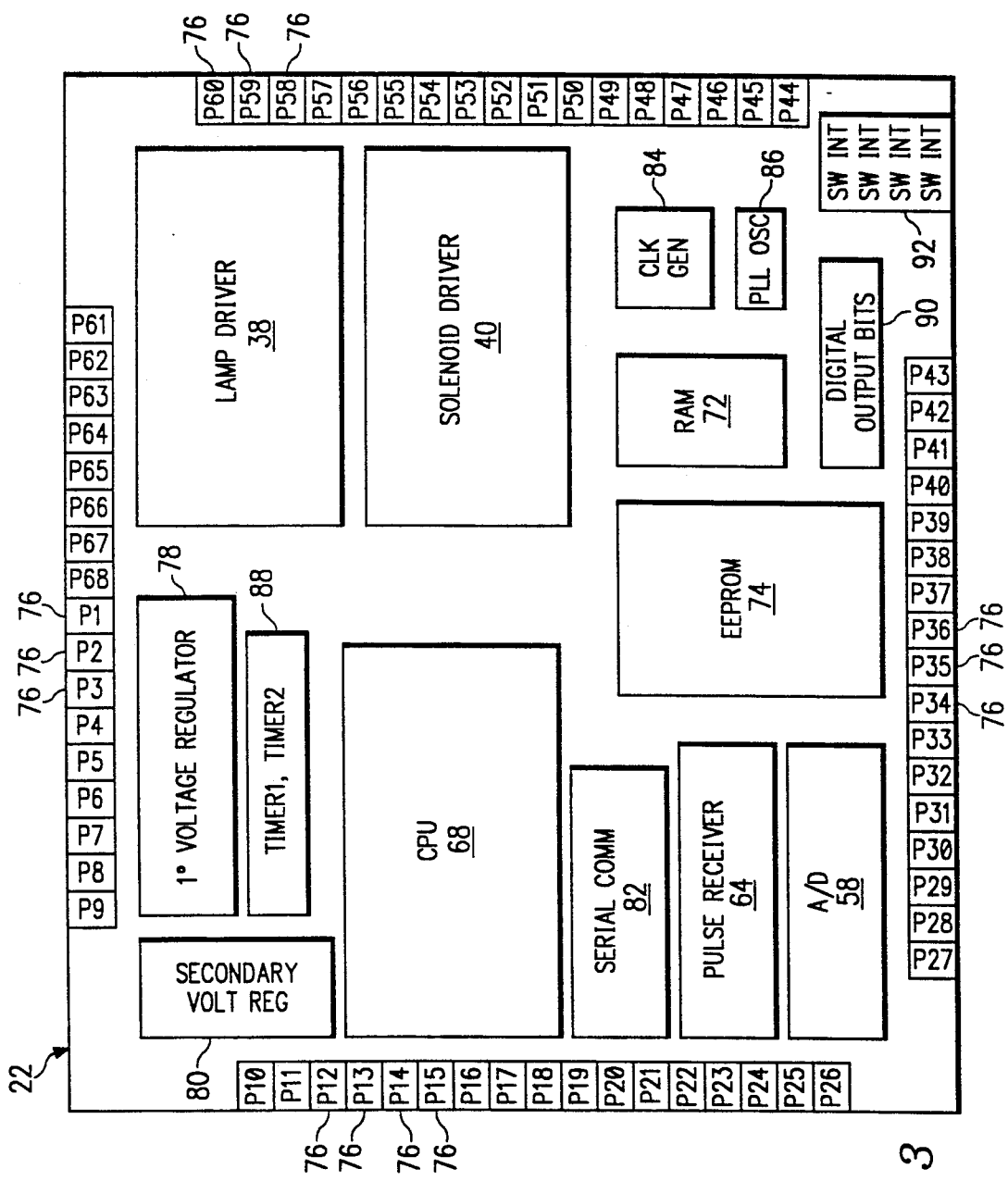
FIG. 3 is a physical chip layout of a microcontroller fabricated according to the process described herein.

FIG. 2 is a high level functional block diagram of the microcontroller chip 22. An actual physical layout of microcontroller chip 22 is illustrated in FIG. 3. FIG. 3 is an exemplary plan layout only. The microcontroller 22 has 60 pads 76 for external connection. The chip 22 is adapted to receive a standard automobile 12-volt power supply on two of the pads 76. The chip or die 22 is retained in a package (not shown) sized for mechanical ruggedness and thermal conduction to convey substantial heat away from the chip 22. Pins or other contact elements (not shown) are rigidly affixed and mounted to and emanate from the package.

The 12-volt power supply is connected to a primary voltage regulator 78 and a secondary voltage regulator 80. Primary and secondary voltage regulators 78 and 80 are represented by regulator block 60 in FIG. 2. Voltage regulators 78 and 80 generate all voltages required on chip 22, such as $V_{pp}$, $V_{dd}$ and $V_{ss}$. The CPU 68 shown in FIG. 3 also includes the program memory 70 as shown in FIG. 2. CPU 68 is interconnected by appropriate buses and communication lines (see FIG. 4) to the remainder of the microcontroller chip 22. A random access memory (RAM) array 72 and an electrically erasable and programmable read-only memory (EEPROM) array 74 occupy respective blocks in the lower portion of the chip. Space is also provided for a serial communications interface 82 for serial connection to external devices, for the analog/digital converter 58 and for the pulse receiver 64.

The upper right-hand portion of the chip 22 is occupied by a lamp-driver thyristor circuit 38 and a solenoid thyristor circuit 40. Thyristor circuits 38 and 40 are controlled by CPU 68 in response to the receipt of sensor signals from analog/digital interface circuit 58 and possibly pulse receiver 64 (see FIG. 2). The timer block 66 on FIG. 2 is, for FIG. 3, further broken down into a clock generator circuit 84, a PLL oscillator circuit 86 and a modular timer circuit 88 located above CPU 68. The modular timer 88 includes components for two timers.

Chip 22 also includes a digital output circuit block 90. Digital output block 90 allows the parallel output of digital signals to another device, such as another microcontroller chip 22 or (as a bus expansion device) to off-board memory chips or other external devices. While the illustrated embodiment has only one digital output port 90, other similar digital output ports 90 could easily be included. Finally, the chip 22 includes four switch interface circuits 92 to allow the customer to select various modes of operation.

In addition to various low-voltage transistors, capacitors and other logic devices, the chip 22 includes several circuit blocks which need high power transistors. These include the analog/digital converter 58, the pulse receiver 64, the primary and secondary voltage regulators 78 and 80, and the lamp and solenoid driver circuits 38 and 40. The integrated fabrication process described herein allows these power circuits to be incorporated on the same substrate as the rest of the logic devices present on chip 22.

Figure 4:
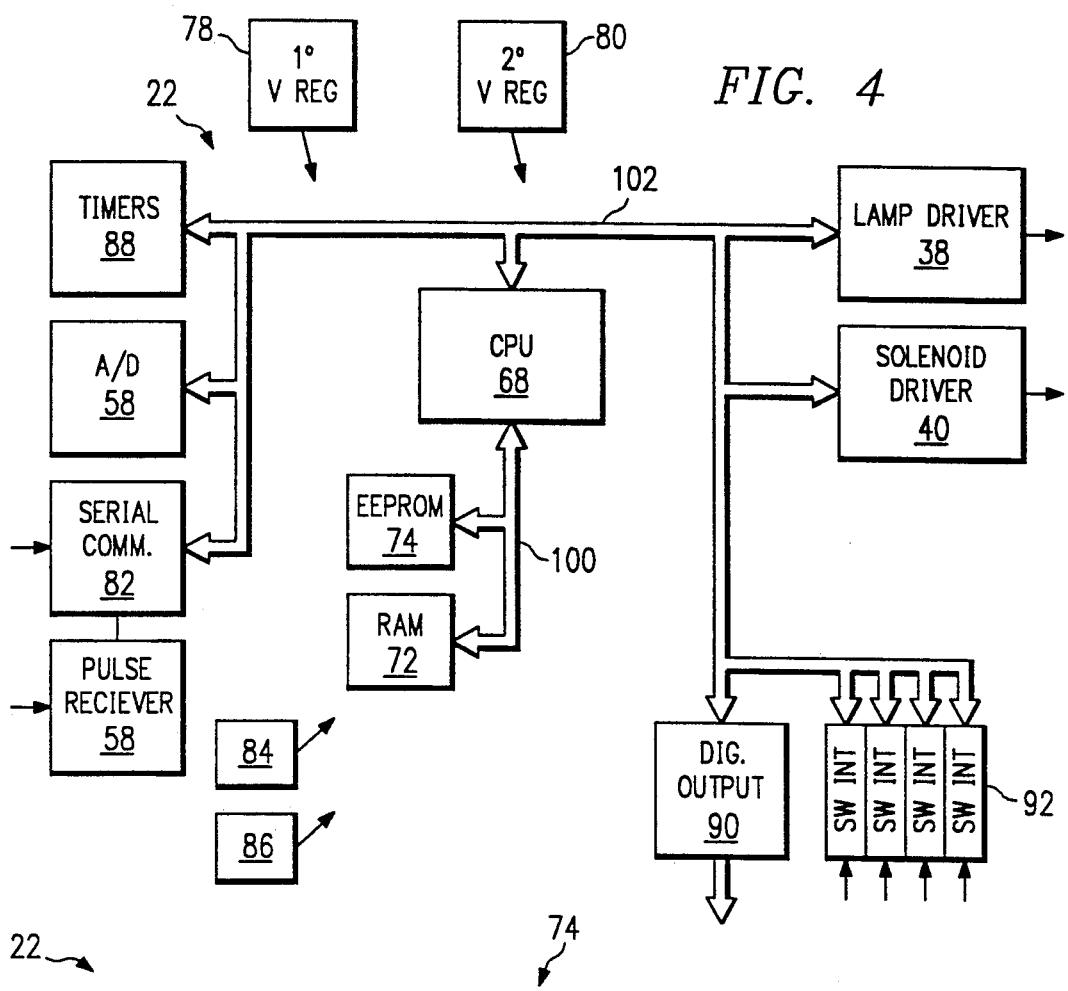
FIG. 4 is an electrical schematic block diagram of the chip shown in FIG. 3, showing system architecture.

Turning now to FIG. 4, a schematic architectural block diagram of the chip 22 is shown. An internal bus 100 provides data and address lines between the CPU 68, the EEPROM memory 74 and the RAM 72. A peripheral bus 102 connects the CPU 68, which includes a controller, to the first and second timers 88, the analog/digital converter 58, the serial communications interface 82, the lamp driver 38, the solenoid 40, the digital output interface 90 and the switch interfaces 92. The primary and secondary voltage regulators 78 and 80 supply power at various predetermined voltages to the other components of the chip through separate lines, represented by the output arrows of these blocks. Similarly, the clock generator 84 and the PLL oscillator 86 supply signals to the remainder of the chip 22 through their own independent lines as indicated.

Figure 5:
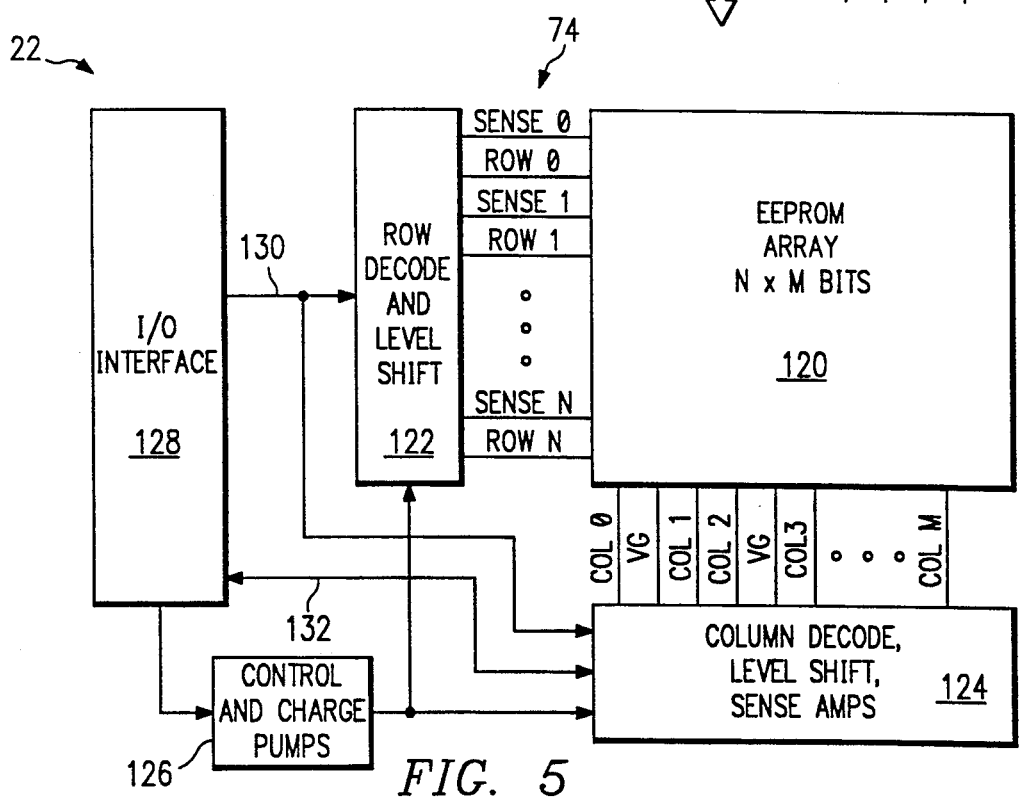
FIG. 5 is a schematic functional block diagram of a EEPROM memory matrix incorporated into the microcontroller shown in FIG. 3.

FIG. 5 is a schematic block diagram of the architecture of the EEPROM memory 74 as resident on chip 22. It is to be understood that the EEPROM array may stand alone as an independent integrated circuit and incorporate the novel cells described herein, as well as being a module on the integrated circuit microcontroller chip 22.

The array proper 120 has n rows and m columns, for an array of n×m bits. An array of suitable size for the microcontroller 22 described herein may have 256 words with 8 bits per word, for a total of 2048 bits. These may be organized in an array of, for example, 32 rows by 64 columns, or 64 rows by 32 columns.

In one embodiment, the array 120 needs to provide four lines to each cell: a sense line, a row line, a column line and a virtual ground line. A row decoder and level shifter 122 provides a plurality of sense lines, as paired with row lines as follows: sense 0, row 0, sense 1, row 1, etc. to sense n and row n. A column decoder, level shifter and sense amplifier section 124 provides a plurality of column lines col 0, col 1, col 2, col 3 . . . col m. Each pair of column lines share a virtual ground ($V_G$) line between them.

A block 126 includes circuitry for controlling the timing of the access to the EEPROM array 120 and charge pumps for providing control signals of appropriate voltages to the array 120 and the blocks 122 and 124.

Control and charge pump block 126 is connected to an input/output interface block 128, which provides an interface with either the rest of the chip or, if in an alternative embodiment the EEPROM memory 74 to be fabricated is not integrated with other functions, to other chips. The input/output interface chip 128 is connected through an address bus 130 to the row decoder 122 and the column decoder 124. A data bus 132 connects the input/output interface 128 with the column decoder block 124. It is through this path 132 that data are written or read from the array 120.

THYRISTOR CIRCUITRY

Returning momentarily to FIG. 2, in order to use a thyristor in an output stage, it is desirable that the current through the thyristor be effectively shut off. Control signals $S_1$ and $S_2$, from CPU 68 through bus 102 of FIG. 4, are independently controllable and provided to control inputs to the thyristor circuits 38 and 40. The circuits and physical structure of FIGS. 6-14 advantageously are used for either or both of the circuits 38 and 40.

Figure 6:
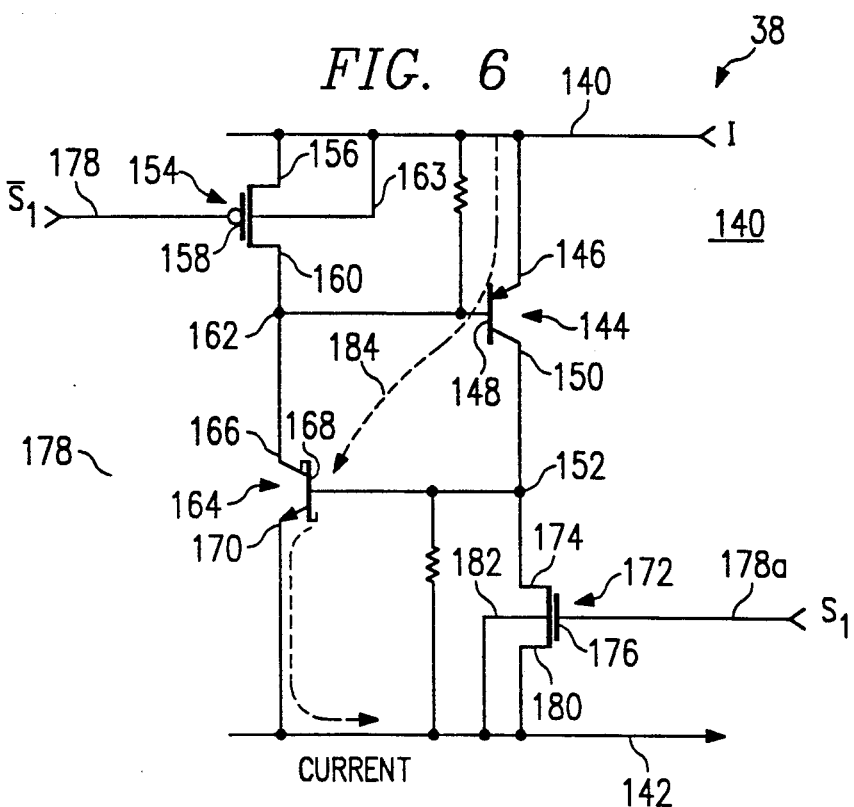
FIG. 6 is a schematic circuit diagram of a gated thyristor according to a first embodiment of the invention.

FIG. 6 is an electrical schematic circuit diagram of the lamp driver thyristor circuit 38, the electrical connections for the solenoid driver thyristor circuit 40 being similar. A top voltage rail 140 is connected to the contact element 32, while a bottom voltage rail 142 is connected to a ground contact element 92 (see FIG. 2). A PNP bipolar transistor 144 has an (p+) emitter 146 connected to the top rail 140, a base 148 and a (p+) collector 150. The collector 150 of PNP transistor 144 is electrically connected to a node 152.

A p-channel field effect transistor, indicated generally at 154, has a drain 156 connected to voltage rail 140, a gate 158 connected to the signal source $\overline{S}_1$, and a source 160 connected to a node 162. Base 148 of PNP bipolar transistor 144 is also connected to the node 162.

A second, NPN bipolar transistor indicated generally at 164 has a collector 166 connected to the node 162, a base 168 connected to node 152, and an (n+) emitter 170 connected to the bottom voltage rail 142. The field effector transistor 154 has a back gate connection 163 that is connected to the top rail 140.

A second, n-channel field effect transistor 172 has an (n+) drain 174 connected to the node 152, a gate 176 connected through a line 178a to the signal source $S_1$, and an (n+) source 180 connected to the bottom voltage rail 142. A back gate connection 182 connects the channel of the field effect transistor 172 to the bottom voltage rail 142.

The base 148 or 168 of each transistor 144 or 164 is pulled toward the emitter 146 or 170 of the respective transistor by a respective MOS transistor 154 or 172. The base needs to be pulled above or below a diode drop of nominally 0.6 volts relative to its emitter in order to cut off current flow through the transistor 144 or 164. Pulling the base down takes a relatively low current compared to the much higher current, on the order of amperes or more, in the collector-emitter path. With an amplification factor of between 10 and 100, a switching current at the base comes into a range of tens to hundreds of milliamperes which is advantageously switched by the MOS transistors 154 and 172.

The resistors shown in FIG. 6 model the voltage drop across the base-emitter junction of each transistor 144 and 164. Upon the application of signal $S_1$ to the gate 176 of transistor 172, and upon the application of its complement $\overline{S}_1$ to the gate 158 of transistor 154, the voltage drop across the resistive elements modeling the base-emitter junction resistances will become less than the required bias voltages for the bipolar transistors 164 and 144, respectively. This will turn the thyristor 38 off.

In operation, current I enters top rail 140 and is conducted through the thyristor 140 as indicated by dotted line with arrow 184. The current passes dividedly from emitter 146 of transistor 144 through base 148 to collector 166, and from collector 150 to base 168. The current comes together in emitter 170 and exits via bottom rail 142.

THYRISTOR DEVICE STRUCTURE

Figure 7G:
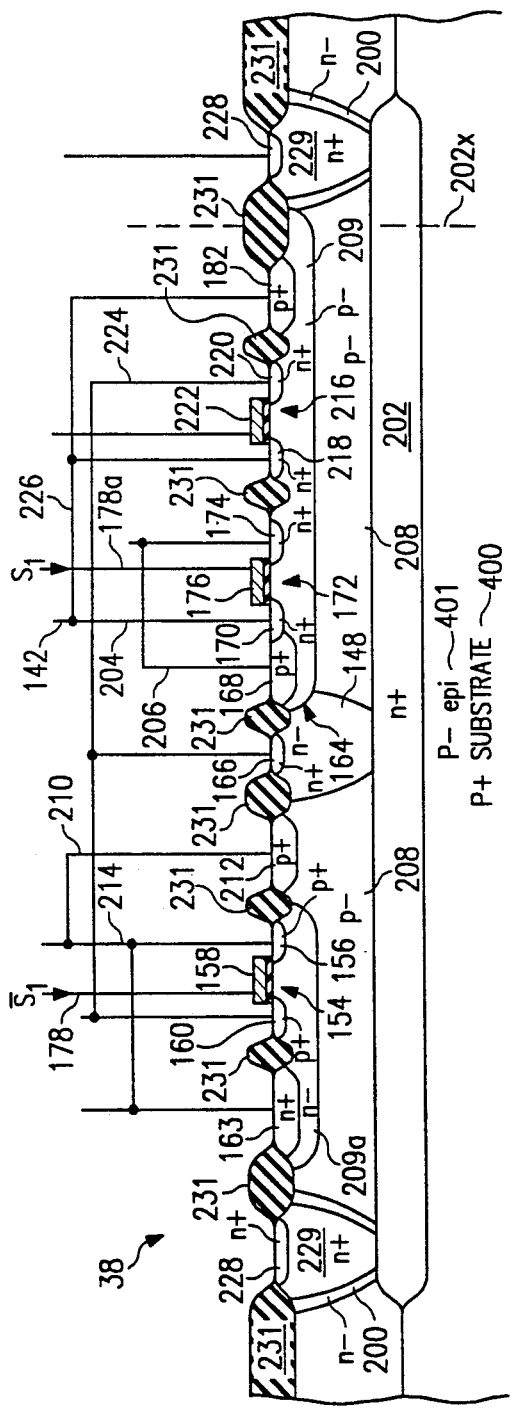
Figures 1, 7G:
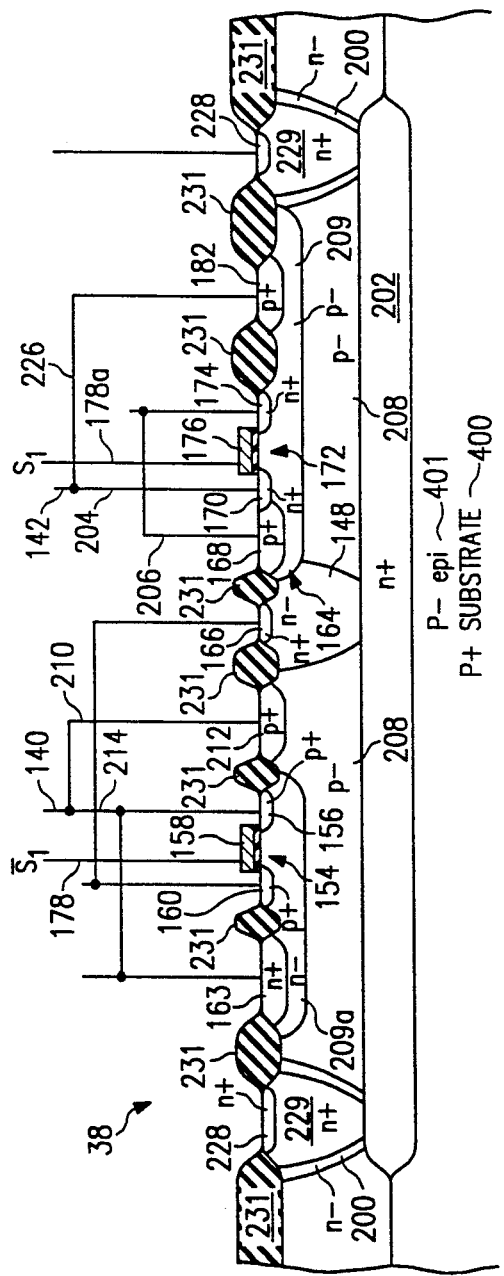

FIGS. 7a, 7b, 7f, and 7g are highly magnified schematic sectional views of a first embodiment of a thyristor according to the invention. FIGS. 7a-7f are successive views of a thyristor structure under fabrication according to an integrated high-voltage/low-voltage process described later herein. Reference is now particularly made to FIG. 7g, and the magnified schematic plan view of a thyristor structure shown in FIG. 8. FIG. 7g is taken substantially along lines 7g—7g of FIG. 8.

In FIG. 7g, an HV n tank region 200 doped (n−) preferably extends to contact a buried (n+) region 202. A shallow region 174 is doped with an (n+) diffusion and forms drain 174 of MOS transistor 172 of FIGS. 6, 6a and 7g. A region 170, doped (n+), acts both as the source 180 of NMOS transistor 172 (see FIG. 6) and the emitter 170 of the NPN bipolar transistor 164. Region 170 is connected to the bottom conductor rail 142 by a conductive contact and conductor 204. A region 168 is a (p+) diffusion that acts as the base 168 for NPN bipolar transistor 164 and the collector 150 (see FIG. 6) for PNP bipolar transistor 144. A metal or other conductive bridge 206 connects base 168 of bipolar transistor 164 with drain 174 of transistor 172. Another conductive bridge 178 connects gates 158 of MOS transistors 154 and 172 to a single input line for control by a control signal $\overline{S}_1$. A third conductive line 178a connects gate 206 of MOS transistor 172 to a source of the control signal $S_1$.

A (p−) doped substrate body or epitaxial layer 208 of the MOS transistor 172 in FIG. 7g is connected to the base 168 of bipolar transistor 164 by low voltage p tank 209, represented by the connection line 182 in FIG. 6. The dopant in (p−) epitaxial layer 208 is enhanced by the low-voltage (p−) tank 209. In FIG. 7g, this same connection is implemented by a conductive interface 182 of (p−) low-voltage (p) tank 208 with the (p+) doped base region 168.

P-channel MOS transistor 154 is connected to bipolar transistor 144 in FIGS. 6 and 7g in a generally analogous way. MOS transistor 154 has a source 160 doped (p+) and connected to base 148 (doped (n−)) in bipolar transistor 144 through (n+) contact regions 166. The region 148, doped (n−), comprises both the base 148 of PNP transistor 144 and the contact region or collector 166 of NPN transistor 164 as shown in FIG. 6. A top rail 140 is connected by a conductor and contact indicated schematically at 210 to an (n+) doped region 212 implanted within low-voltage (n−) tank 209a. Top rail 140 is also connected by a conductive contact 214 to a (p+) doped source region 156 of MOS transistor 154, which also acts as the emitter of bipolar transistor 144. The base-emitter junction of the bipolar transistor 144 is able to be shorted by the MOS transistor 154 upon application of control signal $\overline{S}_1$ to gate 158. Thus, the base-emitter voltage between 148 and 146 is pulled below a diode drop of about 0.6 volts, turning thyristor 38 off.

FIG. 7g shows the implementation of an additional field effect switching transistor indicated generally at 216. Switching transistor 216 has a source 218 and a drain 220, both formed by surface source/drain (n+) diffused regions located within the low-voltage (p) tank 209. The source region 218 and the drain region 220 may be self-aligned to a gate 222. The drain 220 of the field effect transistor 216 is connected to the base 166 of NPN transistor 164 by a contact and conductor 224. The source 218 of field effect transistor 216 is connected via a contact and conductor 226 to the bottom rail 142. When an appropriate signal is applied to the gate of transistor 222, current is sunk to ground rail 142 (see FIG. 6a discussed below).

Also present in the device shown in FIG. 7g are (p+) back gate connections 182 (for transistors 216 and 172) and 163 (n+) back gate connection (for transistor 154). (N+) back gate diffused region 163 is connected via a suitable contact and conductor to top rail 140, while (p+) diffused region 182 is connected through a suitable contact and conductor to the bottom rail 142.

The high-voltage (n) tank diffusion 200, which connects to the buried layer 202, is enhanced by deep (n+) diffusions 229. These diffusions are contacted to the outside world through (n+) guard ring contacts 228. Field oxide isolating structures 231 are formed at the face of the wafer in those areas where contacts are not required and where circuit operation would not be altered.

Figure 6A:
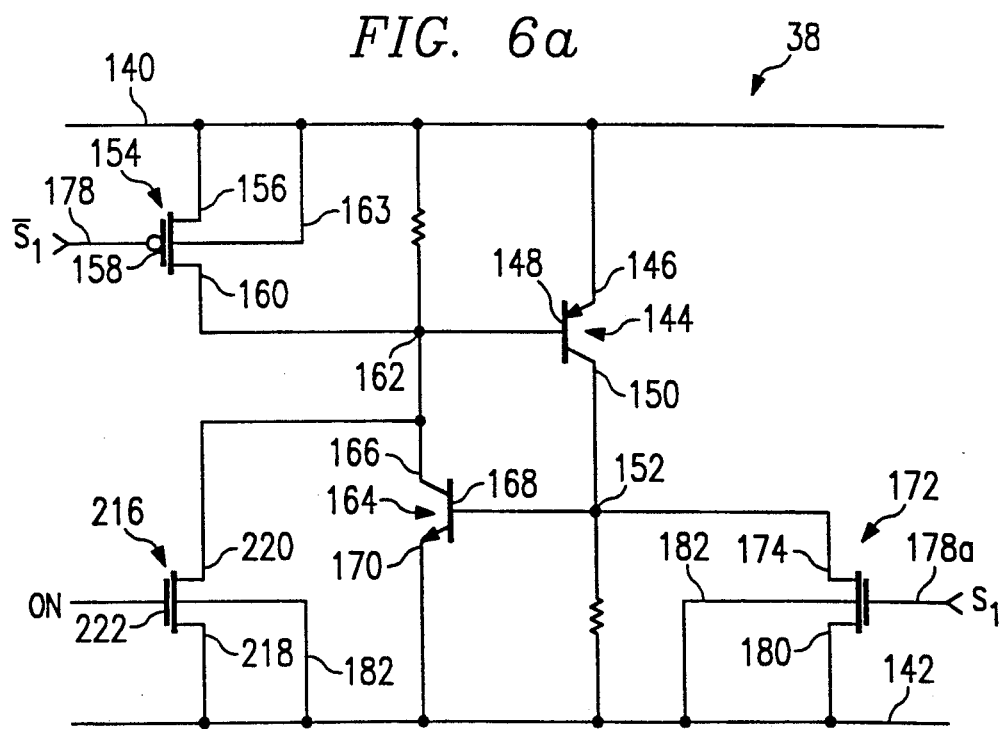
FIG. 6a is an electric circuit diagram of a gated thyristor according to a second embodiment of the invention.

FIG. 6a is a schematic circuit diagram showing the additional transistor 216 and its connections. All other components of the thyristor 140 remain the same as those shown in FIG. 6. The n-channel field effect transistor 216 is operable to latch the thyristor 38 on. When a suitable signal is impressed against the gate 222 of the transistor 216, herein labeled ON, a current path is formed from the node 162 through the current path of the transistor 216 to the bottom rail 142. This causes the voltage drop across the base emitter junction to exceed the forward turn-on bias of bipolar transistor 144, turning on this transistor. Current then proceeds through node 152 through the base emitter junction of the transistor 164, modelled as a resistor. The voltage drop across this resistance turns on the bipolar transistor 164, latching the entire thyristor 38 to an on condition. Only a pulse needs to be supplied to the gate 222 of the transistor 216 to latch the thyristor in this manner.

Figure 8:
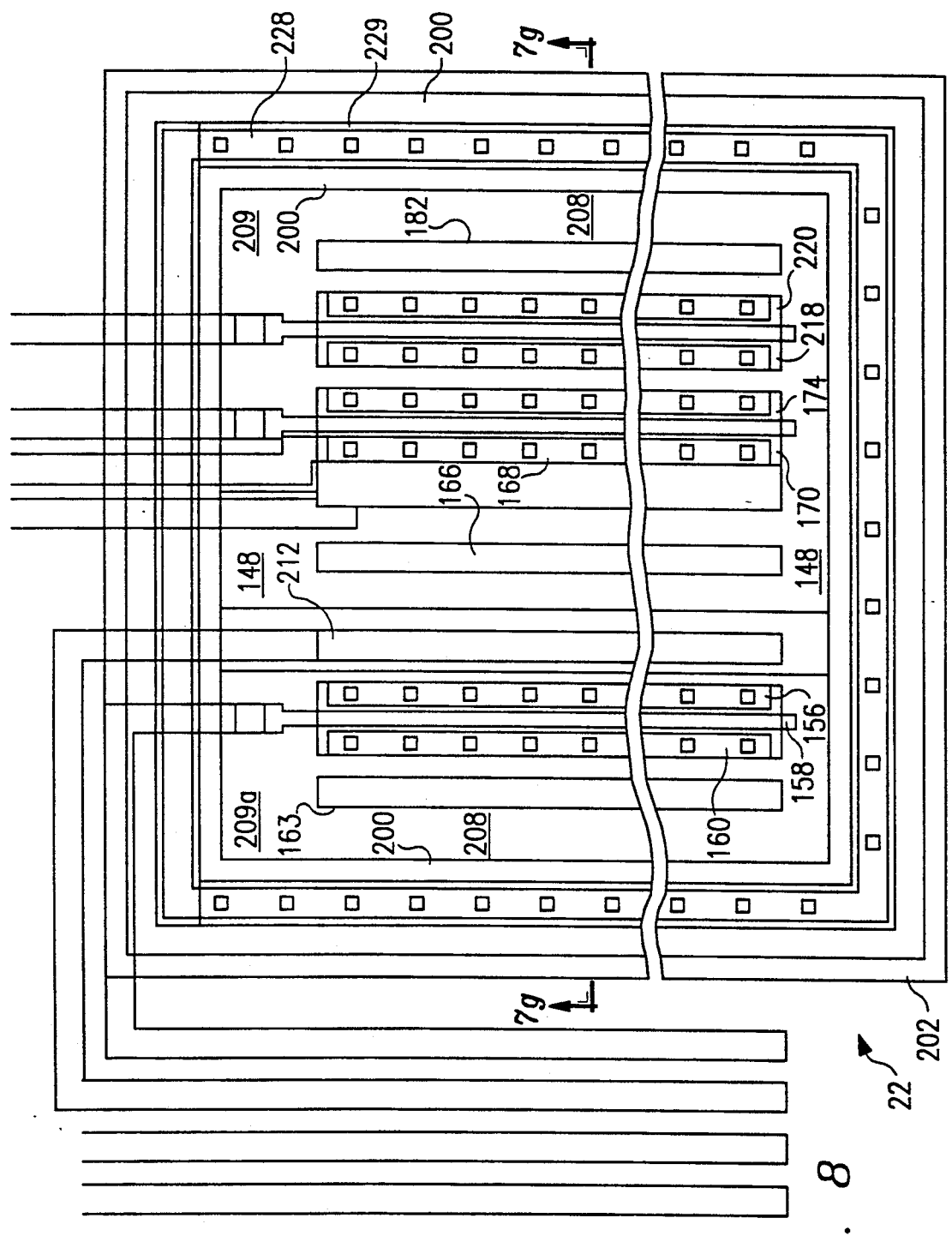
FIG. 8 is a schematic plan view of a first physical embodiment of a thyristor according to the invention, FIG. 7g being taken substantially along line 7g—7g of FIG. 8.

FIG. 8 is a plan view of the embodiment shown in FIG. 7g, FIG. 7g being taken substantially along line 7g—7g of FIG. 8. The buried (n+) layer 202 underlies the entire device structure. High-voltage (n) tank 200 isolates the periphery of the device from other structures on the chip 22. Deep (n+) diffusion regions 229 are implanted slightly within the limits of the guard ring diffusion 200 to better effect contact to the buried (n+) layer 202. On the surface is implanted an annular (n+) guard ring contact region 228, here shown with contacts and metallization. Preferably implanted at the same time as the guard ring diffusion 200 is the (n−) well 148 which is configured as an elongated stripe down the middle of the physical structure. The (n−) well 148 separates two (p−) bodies 208 one from another. Superimposed on the (p−) regions 208 are low-voltage (p−) tank region 209 and low voltage (n−) tank region 209a.

The remaining device components are configured as a series of parallel elongated stripes of diffusions and polysilicon gates. Proceeding from left to right are (p+) back gate or tank connection 163, source 160 of field effect transistor 154, poly gate 158, drain 156, and contact region 212. Diffused within the (n−) well 148 is the (n+) well contact region 166. The (p+) region 168 is implanted to bridge the boundary of the (n−) well 148 and the rightmost (p−) tank 209. Implanted wholly within the right (p−) tank 209 are the source/emitter region 170, the drain 174, source region 218 and drain region 220, and finally back gate or (p) tank connection 182. Polysilicon gates 176 and 222 may be used to self-align the (n+) diffusions 170, 174 and 218, 220 respectively. Selected metal conductors are also shown.

By laying the device out in the linear striped fashion shown, it is possible to extend the device in a direction parallel to the elongate stripes for as long as desired. This allows the designer to select a thyristor of a predetermined current capability. In FIG. 8, the field oxide regions 231 (FIG. 7g) and the first and second level metallizations for interconnecting the device components and to the exterior have been omitted for the purpose of clarity.

FIG. 7g-1 shows a highly magnified schematic cross-sectional view of a thyristor 140 corresponding to the electrical circuit diagram shown in FIG. 6. The components are identical to those shown in FIG. 7g, except that the third switching transistor 216, including source/drain regions 218 and 220 and gate 222, has been omitted.

Figure 9:
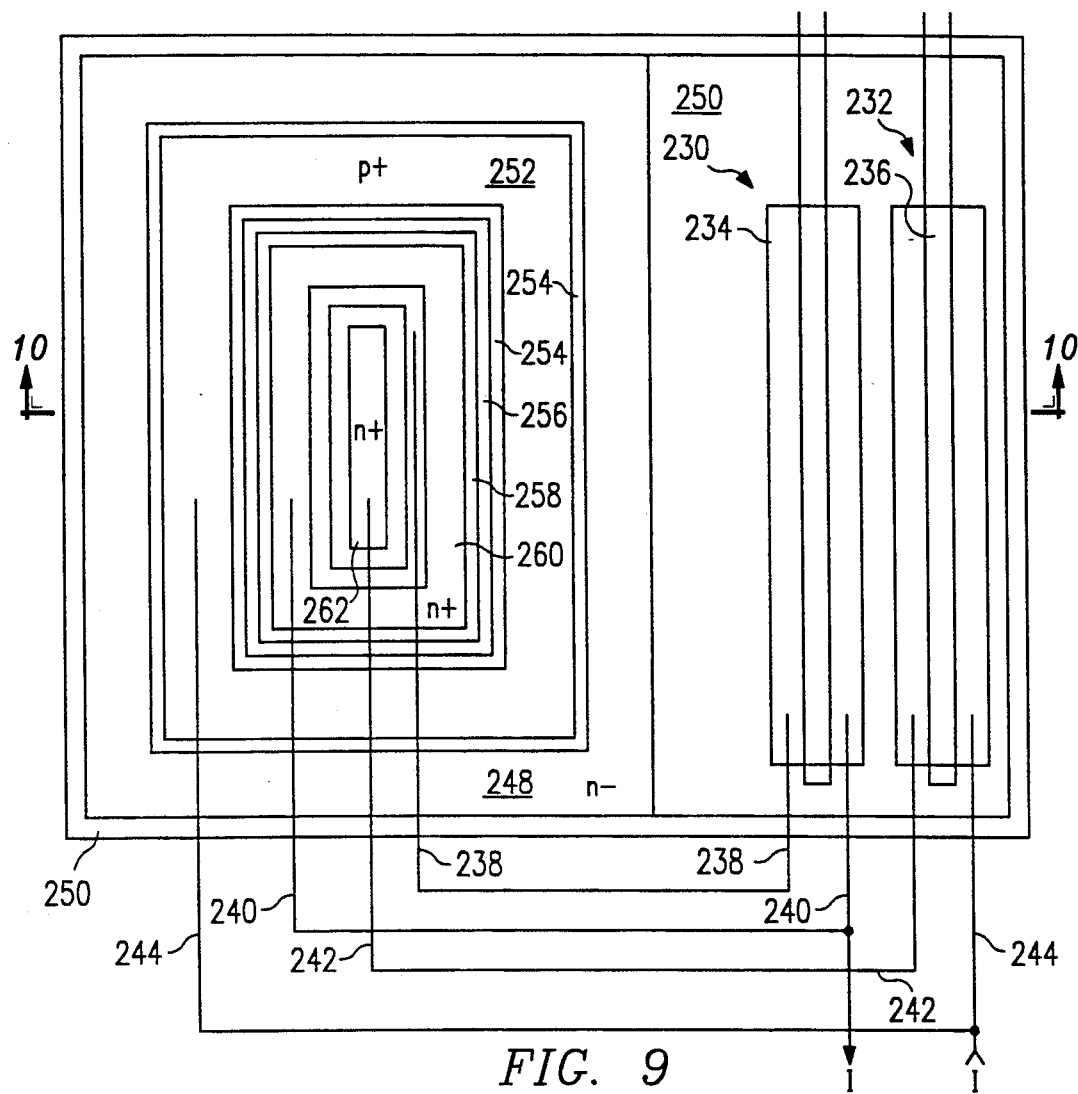
FIG. 9 is a schematic highly magnified plan view of a third physical embodiment of a thyristor according to the invention.

FIG. 9 shows a plan view of an alternative semiconductor structure. In FIG. 9, section lines 10—10 show the relationship of FIG. 10 as a cross-section of part of the structure of FIG. 9.

In FIG. 9, MOS transistors 230 and 232 are implemented in a separate part of the chip and have respective polysilicon gates 234 and 236. Four respective conductors 238, 240, 242, 244 connect to the thyristor indicated generally at 246 from the source and drain of transistor 230 and from the source and drain of transistor 232. Thyristor 246 is made of concentric rectangular rings which result in a bilateral symmetry on either side of a cutting plane 246X. Because of the concentric construction and the symmetry, the number of transistors on one side of the cutting plane 246X is the number of transistors in the thyristor, and not half, in this embodiment. In other words, like structures in FIG. 10 equidistant from cutting plane 246 are part of the same ring in FIG. 9.

Figure 10:
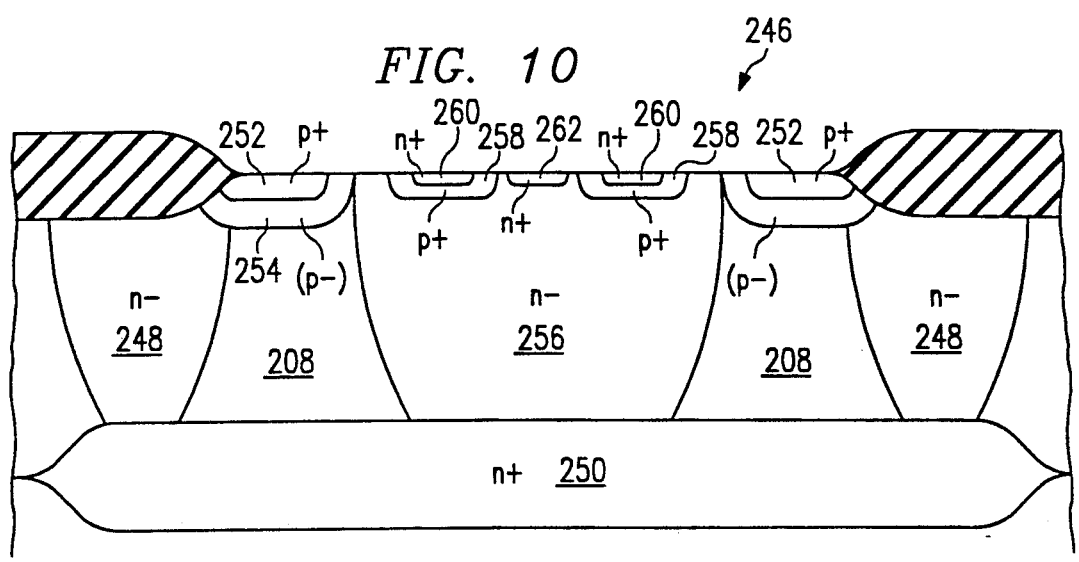
FIG. 10 is a highly magnified schematic sectional view of a third physical embodiment of a thyristor according to the invention, taken substantially along line 10—10 of FIG. 9.

In FIG. 10, a cross-section of the silicon thyristor 246 has various diffusions that have numerals that appear in some cases as more than one ring in top view in FIG. 10. A high-voltage (n−) tank isolation ring 248 underlain by buried (n+) base layer 250 surrounds thyristor 246. A next-inner ring 252 of (p+) emitter is embedded in low-voltage (p−) tank 254 and separated by portions including surface portions of (p−) body 254 inward, outward and beneath emitter ring 252. A well 256 of deep (n−) (HV N tank) material is implanted inwardly of the LV P tank 254 and further inward of emitter ring 252. In the (n−) well 256 is a somewhat shallower base ring 258 of (p+) diffusion which extends down close enough to an interface of region 256 with LV P tank 254 to establish a narrow (n−) base region in well 256 for PNP bipolar transistor action. Rregion 258 may, for example, be created by a deep (p+) diffusion as described herein in conjunction with FIGS. 16a–16g. An emitter ring 260 of (n+) diffusion is deposited in the (p+) base ring 258 itself so that in cross-section the (n+) emitter 260 is embedded and wholly surrounded within the circumferential width of the (p+) base ring region 258. The emitter 260 penetrates deeply enough into base region 258 to leave only a narrow (p+) base for NPN bipolar transistor action. A (n+) contact diffusion region 262 is provided centrally into the (n−) well 256 so that, at the surface, the well 256 entirely surrounds the contact 262.

The device of FIGS. 9 and 10 may be fabricated according to the integrated low-voltage device/high-voltage device process described hereinafter in conjunction with FIG. 15, or it may be fabricated singly according to the process shown in FIG. 11. A comparison of FIGS. 9 and 11 facilitates understanding of both process and structure. Thyristor 246 of FIGS. 9 and 10 has a buried or base layer (BL) 250 doped (n+) and provided with a (p−) epitaxial layer 208 in a step 270. Next, in a step 272 the (p−) layer 208 has ring-shaped (n−) isolation region 248 and a deep (n−) well 256. A concentric low-voltage (p−) tank 254 is implanted at step 274. Then, at a step 276, there is concurrently or sequentially diffused (p+) emitter ring 252 and a (p+) base ring 258, followed by a step 278 which concurrently or sequentially diffuses (n+) emitter 260 and (n+) base contacting region 262 over (n−) well 256. Comparing FIGS. 9 and 11, the (n+) sources and drains in transistors 230 and 232 are suitably implanted in step 278 or as a separate step. Polysilicon gates 234 and 236 are deposited in a step 280. Metallization 238, 240, 242, 244 is provided as another substep of step 813. The (n+) sources and drains for transistors 230 and 232 are suitably diffused after polysilicon deposition when self-aligned transistor fabrication is contemplated.

Figure 11:
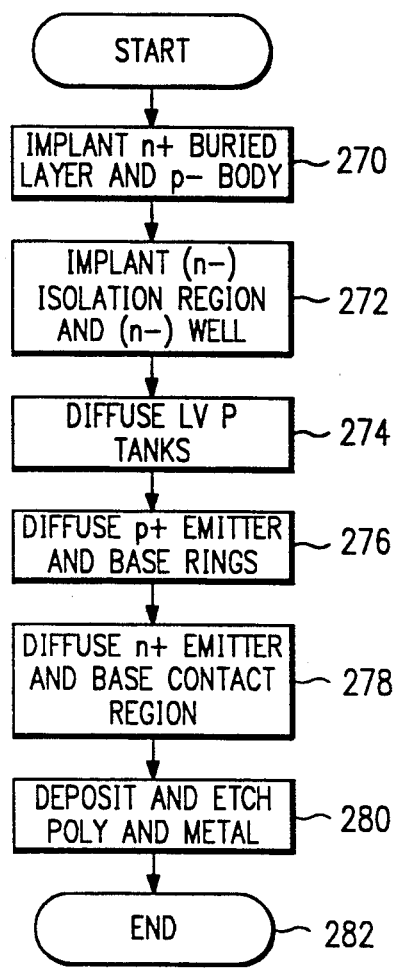
FIG. 11 is a process flow diagram for fabrication of a thyristor according to the invention.

The same uncomplicated process steps of FIG. 11 may also apply to the somewhat different geometry of the structure of FIGS. 7g and 8. It is emphasized that the entire buried layer 202 of FIG. 7g between the isolation ring 200 of (n−) diffusion is representative of actual physical deposition and equally representative of another embodiment wherein zone 202 is rotated around an axis 202 or made bilaterally or radially symmetric by analogy with the structures of FIGS. 9 and 10. Conversely, the embodiment of FIGS. 9 and 10 is equally representative of a further embodiment wherein one of the bilaterally symmetric halves on either side of axis 246X is absent in the manner of FIG. 7.

Figure 12:
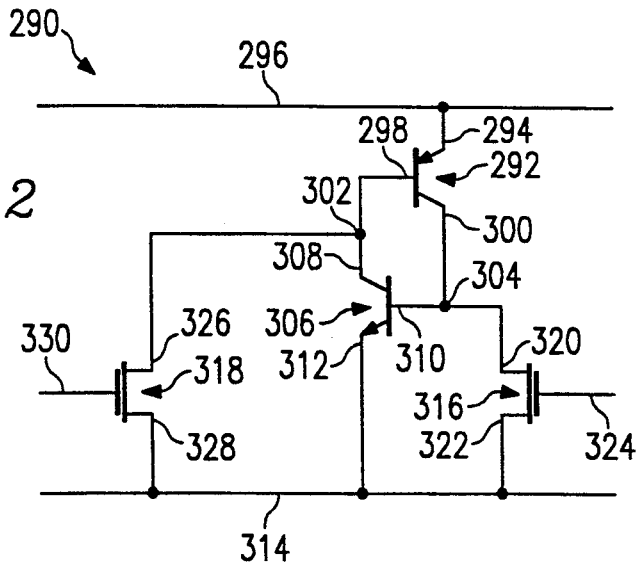
FIG. 12 is an electrical circuit diagram of a third embodiment of the thyristor according to the invention.

FIG. 12 is a schematic electrical diagram of yet another embodiment of thyristor according to the invention. The thyristor is indicated generally at 290. In this embodiment, a first, lateral PNP bipolar transistor indicated generally at 292 has an emitter 294 connected to a positive voltage supply rail 296, a base 298, and a collector 300. The base of transistor 292 is connected to a node 302, while the collector 300 of transistor 292 is connected to a node 304. A second, NPN bipolar transistor indicated generally at 306 has a collector 308 connected to the node 302, a base 310 connected to the node 304 and an emitter 312 connected to a ground rail 314.

Thyristor 290 has two field effect switching transistors indicated generally at 316 and 318, respectively. A drain 320 of transistor 316 is connected to the node 304, and base 310 of transistor 306 as well as collector 300 of transistor 292. A source 322 is connected to the ground rail 314. Transistor 316 is provided with a control gate 324. A drain 326 of transistor 318 is connected to the node 302, and thereby is connected to the base 298 of PNP lateral transistor 292, as well as the collector 308 of the NPN transistor 306. A source 328 of transistor 318 is connected to the ground rail 314. The second switching transistor 318 has a gate 330.

Figure 13:
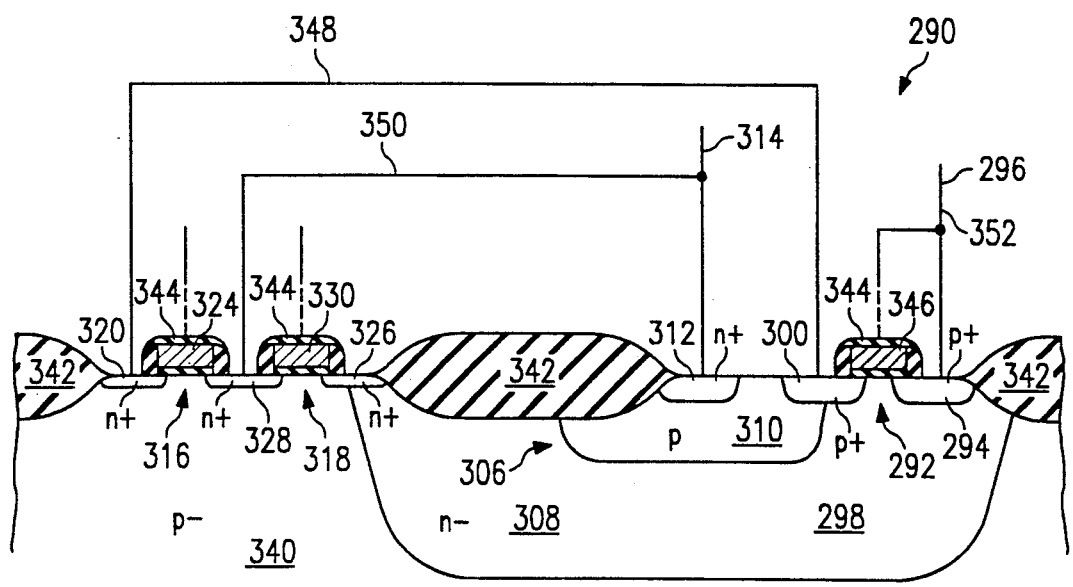
FIG. 13 is a highly magnified schematic sectional view of a fourth physical embodiment of a gated thyristor according to the invention.

A structure realization of this circuit is shown in FIG. 13, which is a highly magnified schematic sectional view of a (p−) semiconductor layer 340 on which the thyristor 290 is built. A high-voltage (n) tank implant 298 forms the base 298 of PNP lateral transistor 292. A (p) well 304 is implanted into the face of epitaxial layer 340 within the (n−) tank 298. Thereafter, field oxide region 342 may be grown in all locations except those areas of the surface of epitaxial layer 340 necessary for either contacts or proper device operation.

Next, a gate oxide 344 is grown on the surface of the epitaxial layer 340 where the same has not been oxidized with field oxide 342. Then, a layer of highly doped polycrystalline silicon is deposited on the surface of the workpiece, patterned and etched to form polysilicon gates 324, 330 and 346. Field oxide regions 342 and polysilicon gates 324, 330 and 346 may be used to partially self-align (1) a (p+) implantation to produce (p+) surface diffusions 300 and 294, and (2) an (n+) type diffusion to produce (n+) drain region 320, common source 328, drain region 326 and emitter 312.

Lateral PNP transistor 292 is formed by emitter 294, the body of the (n−) well 298, and a collector 300. An PNP bipolar transistor 306 is formed by emitter 312, base 304 and the (n−) well 298, which serves as the collector 308 of the NPN transistor 306 (see FIG. 12). Field effect transistors have channels defined in the (p−) epitaxial layer 340; the remaining components of these devices are formed by drain regions 320 and 326 and common source region 328, and gates 324 and 330. The drain 320 is connected to the collector 300 through suitable metal size silicon contacts and a conductor 348. Source 328 and emitter 312 are connected to ground rail 314 by a conductor 350. The top rail 296 is connected through a conductor 352 to the gate 346 as well as the emitter 294. In the shown configuration, the shorting of the gate 346 to the emitter 294 cancels any (p−) channel MOS transistor action; alternatively, gate 346 may be provided a second conductive lead, and the resultant (p−) MOS transistor formed between regions 300 and 294 can be used to turn the thyristor 290 on.

The base 298 of PNP transistor 292 and the collector 308 of the NPN transistor 306 are connected by the continuity of (n−) well 298. Collector 300 of PNP transistor 292 and base 304 of NPN transistor 306 are conductively connected at the interface between regions 300 and 304. The drain 326 of switching field effect transistor 318 is connected to the collector 308 of the NPN bipolar transistor at the interface between regions 326 and 298.

The simplified transistor 290 provides a technical advantage in that the field effect transistors 316 and 318 do not have to be in a separate, isolated tank.

Figure 14:
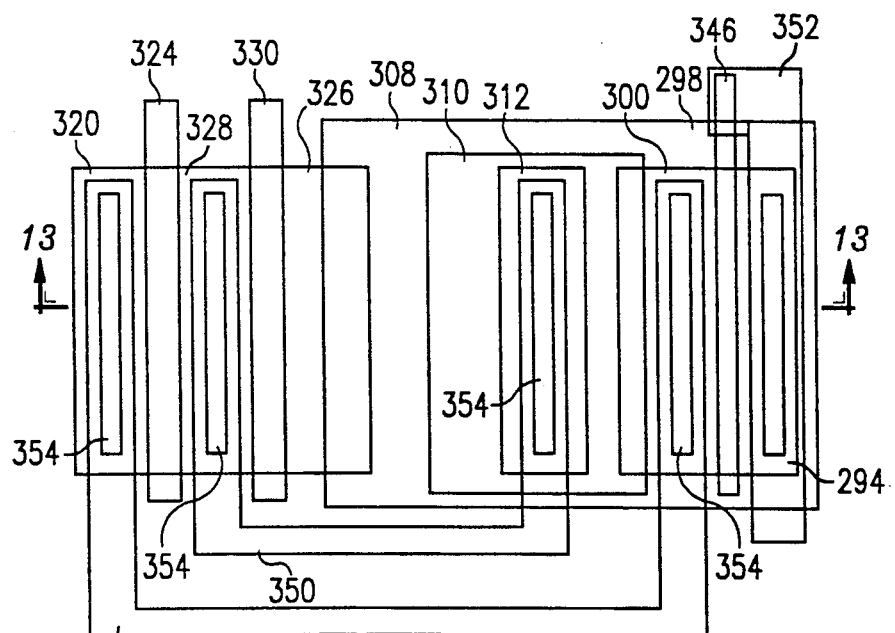
FIG. 14 is a plan view of a fourth physical embodiment of a thyristor according to the invention, FIG. 13 being taken substantially along line 13—13 of FIG. 14.

FIG. 14 is a schematic plan view of the thyristor 290 shown in FIG. 13, the section of FIG. 13 taken substantially along line 13—13 of FIG. 14. Metallization, i.e., conductors 352, 350 and 348 are shown in outline. The (n−) well 298 takes a rectangular formation and completely encloses the (p) well 310 as well as the (p+) regions 294 and 300. Bars 354 indicate contacts to the silicon. Gates 324 and 330 are used to self-align an (n+) implant which creates regions 320, 328 and 326; (p+) regions 294 and 300 are self-aligned to gate 346. The mask for the (p+) implantation is designed to overlap the (p) implantation area 310. There is likewise an overlap of the (n+) mask with the (n−) well 298. The (n+) emitter 312 is entirely enclosed by the (p) base 310.

INTEGRATED PROCESS

Chip 22 is fabricated according to a novel, integrated process, wherein both power and non-power devices may be fabricated on the same chip with a minimum of process steps and a minimum number of masks. The process flow is arranged to provide the least amount of heat cycling to each the completed devices. That is, high temperature process steps are moved to the beginning of the process as much as possible, so as not to damage other device structures created later.

Figure 15:
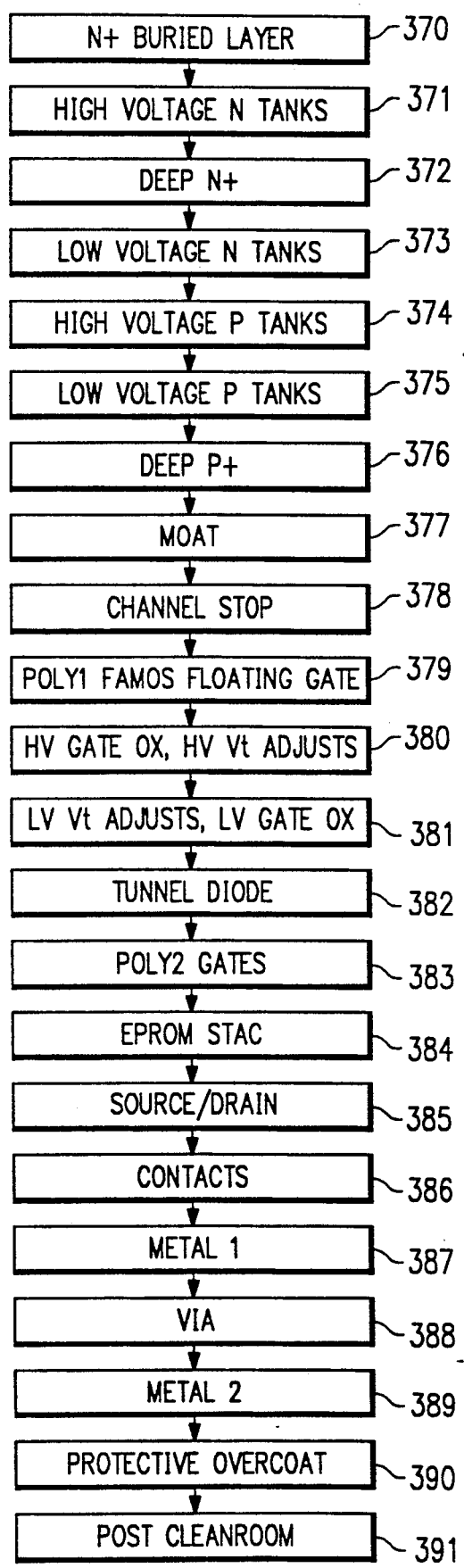
FIG. 15 is a high level process flow diagram associated with a microcontroller chip fabrication process more fully illustrated in FIGS. 16a through 16g.

FIG. 15 is a process flow chart that gives a broad overview of the process fabrication steps used in fabricating the microcontroller chip 22. After a broad, high level description of the process in conjunction with the flow chart shown in FIG. 15, a more detailed treatment of the process will be given in conjunction with FIGS. 16a to 16g below, which show the fabrication of on-chip devices other than the gated thyristors 38 and 40 (see FIG. 2). Steps in the fabrication of one physical embodiment of the gated thyristor will be given in conjunction with FIGS. 7a, 7b, 7f and 7g, after a description of the basic process in connection with FIGS. 16a–16g.

While the process is described in conjunction with the fabrication of devices in a (p) type silicon substrate and epitaxial layers, the process has application to (n) type semiconductor materials and to other semiconductors. The first major process step 370 is the selective creation, as by epitaxial growth, of an (n+) buried layer formed in a P-type silicon layer. The (n+) buried layer is positioned between two (p−) epitaxial layers, the lower of which preferably extends over a (p+) substrate. The (n+) buried layer is needed for vertical double diffused "metal" oxide semiconductor (VDMOS) n-channel power transistors used, for example, in the voltage regulator block 60, for several versions of the gated thyristor lamp and solenoid drivers 38 and 40, in the pulse receiver/driver 64 and the analog/digital converter block 58 (see FIG. 3). A buried (n+) layer is also used as the collector for a vertical NPN bipolar transistor, as will be later described. A laterally separate (n+) buried layer may be created for each VDMOS transistor or thyristor, or one such layer may be used for several such transistors if these are intended to be connected in parallel.

After creating the (n+) buried layer, step 371 fabricates (n−) transistor tanks for the high-voltage power transistors. These tanks are large diffused regions in which the power transistors themselves are fabricated. One technical advantage of the invention is that the same implantation used to create the high-voltage tanks for the power transistors is used to create tanks for other devices, such as n-channel 18-volt EEPROM gating transistors.

At step 372, at least one respective deep (n+) implant is used in order to connect each (n+) buried layer to surface contacts for the vertical transistors, and/or to vertically isolate these high-power devices from the rest of the chip. At step 373, low-voltage device (n−) tanks are created to enclose conventional low-voltage ($V_{dd} \leq 5$ volts) logic field effect transistors, as well as components of, for example, vertical and lateral DMOS n-channel power transistors, drain-extended n-channel power transistors, and drain-extended p-channel power transistors. Low-voltage n-tanks are also used to enclose Schottky diodes. The high- and low-voltage tanks described herein differ in the dopant concentrations that are used to create them, and are thus implanted into the chip at different times. The high-voltage tanks have less of a dopant concentration in them to preserve a high PN junction diode breakdown, but are deeper. The low-voltage tanks are shallower, but have a higher concentration of dopant.

At step 374, a plurality of high-voltage p-tanks are created in the epitaxial layer. The high-voltage p-tanks are used as tanks for 18 volt EEPROM gating transistors, Fowler-Nordheim tunneling EEPROM cells in the EEPROM array itself, as channel regions for drain extended p-channel transistors, and as tanks for floating gate avalanche injection electrically programmable read-only memory (FAMOS EPROM) cells. This step may also be used to fabricate the (p) region 310 of the thyristor shown in FIGS. 12–14. Step 375 involves the fabrication of low-voltage p-tanks as, for example, enclosures for low-voltage n-channel field effect logic transistors, as extended drains for extended drain p-channel field effect transistors, as channel regions for n-channel LDMOS and VDMOS transistors, and as base and collector bodies for the thyristors (see, e.g. regions 209 in FIGS. 7g and 7g-1).

At step 376, deep (p+) implantations are performed, for example, to form back gates for the lateral and vertical DMOS n-channel power transistors.

At step 377, the moat or isolating oxide regions surrounding the active device areas are defined with a mask. Channel stop implants that further isolate the devices from each other are carried out at step 378. In the same step 378, the previously defined isolating oxide regions are locally grown on the face of the semiconductor epitaxial layer.

Step 379 concerns the formation of a first-level polycrystalline silicon (poly 1) conductor for, for example, floating gate avalanche injection "metal" oxide semiconductor (FAMOS) EPROM cells, and/or double-level poly EEPROM cells.

Next, at step 380, the gate oxide for the control gates of the high-voltage and high power transistors is formed, and threshold voltage ($V_t$) adjust implants are performed for these transistors. At step 381, similar low-voltage $V_t$ adjust implants are performed through the high-voltage gate oxide layer. For the low-voltage transistors, the relatively thick high-voltage gate oxide is removed and a thin gate oxide is formed within step 381.

Step 382 concerns a portion of the EEPROM cell fabrication, and includes an (n+) Fowler-Nordheim tunnel diode implant and the formation of a thin tunnel oxide over the implant. At step 383, a second-level polysilicon (poly 2) layer is deposited, doped, patterned and etched to define gates for low- and high-voltage field effect transistors, single-level poly EEPROM cells, gates for the gating transistors of the thyristors shown in, e.g., FIGS. 6, 6a, 7f and g, 7g-1, 8, 9 and 12–14, and to partially or completely define the control gate for FAMOS n-channel EPROM cells and double-level poly EEPROM cells. At step 384, a patterning and etching of certain double-level poly gate stacks occurs to complete the definition of the FAMOS n-channel EPROM cell control gates and, in one embodiment, stack-etched EEPROM cells.

In step 385, several source/drain implants and diffusions occur. The poly transistor and memory cell gates have sidewall oxides formed adjacent their lateral edges and cap oxides on other exposed polysilicon surfaces. A low-density diffusion (LDD) n) type implant is made into the surface source/drain regions of the n-channel field effect transistors immediately before a main (n+) source/drain implantation. The LDD and (n+) implantations are annealed, followed by (p+) source/drain patterning and implantation. The n-type source drain implantation step is further used to form back gates for p-channel transistors, and the (p+) source/drain implantation step is further used to form back gates for n-channel transistors. A special (p+) implant may occur at this point, at a somewhat higher energy that the (p+) sources and drains, to form (p+) region 258 shown in FIGS. 9 and 10.

In step 386, the formation of the semiconductor portions of the fabricated devices is essentially complete and all that is left is the conductive interconnection of these devices with each other and to the outside world, with the exception of Schottky diode devices. A mid-level oxide is deposited in step 386 and is patterned and etched to produce contact orifices. At step 387, the first level of metal is deposited, patterned and etched, including platinum only for PtSi Schottky diodes, but generally comprising a sputtered titanium tungsten alloy and an aluminum copper alloy on top of these. At step 388, a second level of insulator is deposited over the first metal and vias are formed to the first metal. The second metal itself is deposited, patterned and etched at step 389. A protective overcoat is added at 390, and various post-clean room processes are performed on the chip at step 391.

An integrated process flow will now be described in detail with the aid of FIGS. 16a-16g, which are schematic sectional views of various areas of chip 22 (FIG. 3) at various successive stages in the process. While the various devices formed during this integrated process flow are shown in FIGS. 16a-16g to be adjacent each other, this would not necessarily be the case in the finished semiconductor chip 22. The devices are shown in close association with each other only for the reader's convenience. The reader should understand that certain of the devices can (and most likely will) be separated by wide areas on the actual semiconductor chip 22. However, viewing the various devices in close association gives an understanding of the simultaneous application of each process step to each of the devices fabricated according to the process.

The integrated process described is modular, that is, not all of the illustrated devices need to be built for any one particular integrated circuit chip. Where certain of these devices are not required, some of the process steps shown in FIG. 15 are left out. For example, if an integrated circuit does not require EEPROM cells, then the tunnel diode step 382 would be left out. If the particular chip to be fabricated does not require power transistors having buried drain regions or collectors, then the (n+) buried layer step 370 and the deep (n+) step 372 would be omitted. If the process does not require FAMOS EPROM cells, the FAMOS floating gate step 379 and the EPROM stack step 384 would be omitted. Certain additions to the integrated process can be made for modifications of the illustrated cells, as will be explained hereafter.

A principal technical advantage of the invention is the provision of a unified set of process parameters that can be applied to each of a plurality of distinctly different devices. The design rules for each of these devices can be stored in a library. The integrated circuit designer therefore is able to select different devices from this library with the assurance that an integrated process is available for building them, and that the devices so selected are compatible with this process. This considerably reduces design time for chips having new designs.

Figure 16A:
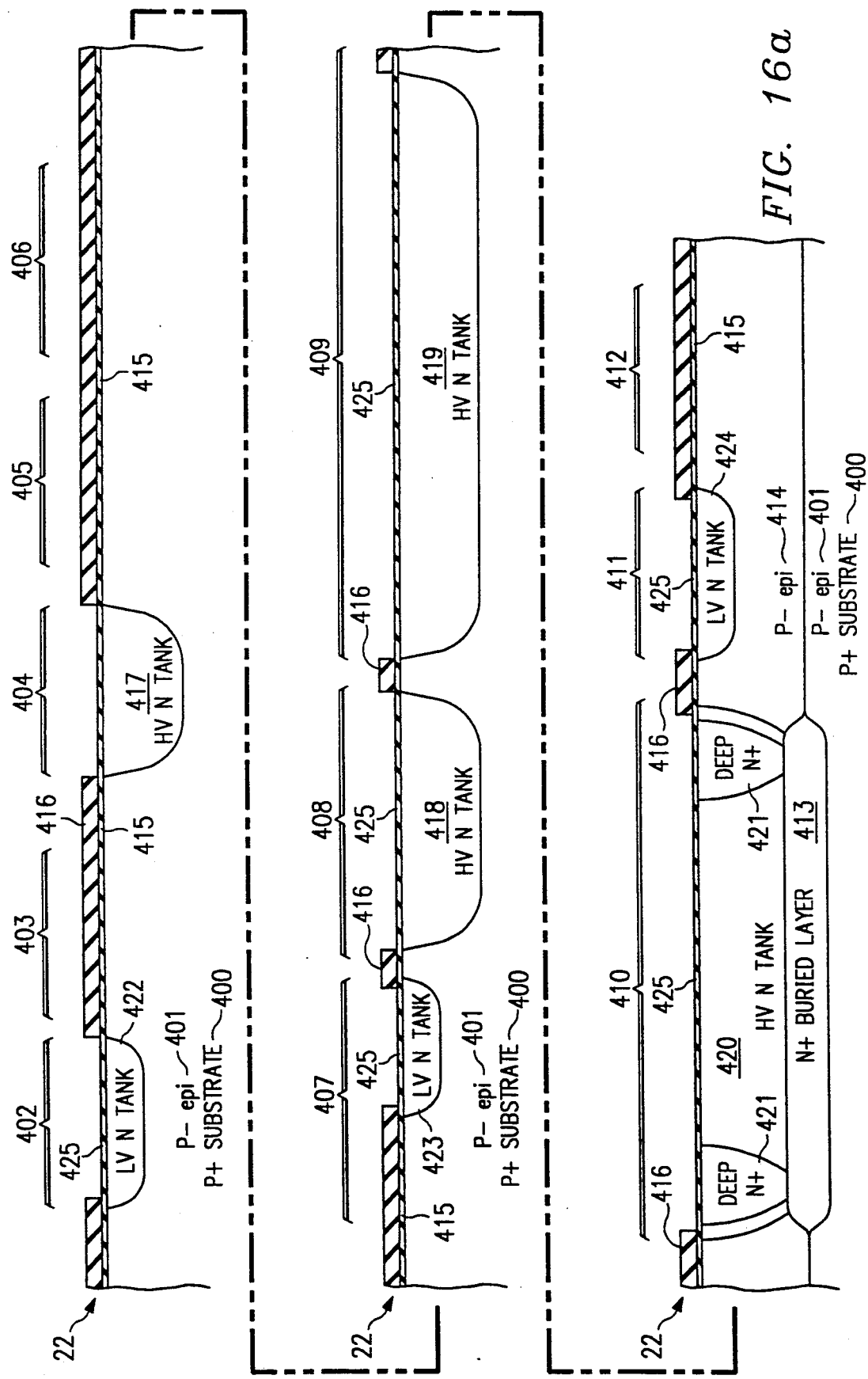

FIG. 16a is a schematic sectional view illustrating the beginning stages of the process. The beginning material is preferably a P-type silicon substrate 400 that, for example, may have a resistivity of about 0.015 and a [100] crystallography. A (p−) epitaxial layer 401 is grown on top of the silicon substrate 400.

The process of the invention is described in FIGS. 16a-16g in conjunction with the fabrication of eleven different devices, each formed within their respective device areas. The description below will detail the fabrication of a low-voltage p-channel field effect transistor 402, a low-voltage logic n-channel field effect transistor 403 (devices 402 and 403 being designed for voltages at or below about five volts), a p-channel isolation or gating field-effect transistor 404 for an EEPROM array, an n-channel isolation or gating field-effect transistor 405 for an EEPROM array, electrically programmable, read-only memory Fowler-Nordheim tunneling cell 406, a drain-extended n-channel field effect transistor 407, a drain-extended p-channel field effect transistor 408, a lateral diffused-source/drain "metal" oxide semiconductor (LDMOS) n-channel field effect transistor 409, a vertical diffused-source/drain "metal" oxide semiconductor (VDMOS) n-channel field effect transistor 410, a Schottky diode 411 and a floating gate avalanche metal oxide semiconductor (FAMOS) electrically programmable, read-only memory (EPROM) cell 412. The respective device areas in which these devices are to be made, and the devices themselves, are denoted by the same numbers throughout these drawings. Devices 404-410 and 412 are designed to be subjected to voltages and/or current densities much greater than the low-voltage logic transistors 402 and 403.

The first major device structure to be fabricated on the chip 22 is an (n+) buried layer 413. This process step corresponds to (n+) buried layer fabrication step 370 in FIG. 15. An oxide layer (not shown) is deposited on the surface of the (p−) epitaxial layer 401, and is patterned and etched to define an area in which the (n+) buried layer implant is to occur. The implant may be done, for example, with an n-type dopant such as antimony, at a dose of about $4 \times 10^{15}$ ions/cm$^2$ and at an energy of approximately 40 KeV. The implanted dopant is diffused in a subsequent high temperature step under an inert atmosphere. After the buried layer 413 has been formed, a further (p−) epitaxial portion 414 of the semiconductor substrate is grown on top of the buried layer 413 and the rest of the surface of the chip. This last epitaxial deposition may be done to a depth of approximately 11 microns.

Once the (n+) buried layer 413 has been formed and buried, the next step in the preferred process is to form high-voltage n-tanks for various of the devices. The term "high-voltage" denotes the voltages to which devices formed in these tanks will be subjected; these higher voltages, such as twelve and eighteen volts and transients of up to sixty volts, require larger and deeper tanks in which the devices are respectively formed, but with smaller dopant concentrations. The creation of the high-voltage (n−) tanks corresponds to high-level step 371 in FIG. 15.

An oxide layer 415 and a nitride layer 416 are grown. The nitride layer 416 is then patterned and etched to define the areas in which the high-voltage n-tank implant is to occur. The (n-) tank implant is then conducted, preferably with phosphorus at a dose of about $2.5 \times 10^{12}$ ions/cm$^2$ and at an energy of about 80 KeV. This creates high-voltage (n−) tank regions 417, 418, 419 and 420. Portions of tanks 417 and 418 will form the channel regions for the p-channel transistors 404 and 408, respectively. Tanks 419 and 420 will form portions of the drains for PMOS transistors 409 and 410, respectively.

The (n+) buried layer 413 serves as the drain or source of the vertical DMOS field effect transistor 410. Conductive connection will have to be made to buried layer 413 to connect it to other devices on chip 22. The illustrated way to do this is through deep (n+) implants 421, the creation of which corresponds to step 372 in FIG. 15. An alternative way to perform this connection is through conductive trench connections, described later in this application. In the embodiment illustrated in FIGS. 16a–16g, a deep (n+) pattern is defined on the chip surface by photoresist, and any remaining portion of nitride layer 416 is etched by plasma (not shown). A deep (n+) implant is then performed using phosphorus at about $1.0 \times 10^{16}$ ions/cm$^2$ and about 80 KeV. The high-voltage n-tank regions 417–420 and the deep (n+) regions 421 are then driven in with a thermal step at about 1200° C. under an inert atmosphere for several hours.

N-type tank implantations are next performed for low-voltage devices. This corresponds to high level step 373 in FIG. 15. The nitride layer 416 is patterned and etched, and it and a photoresist layer (not shown) used to define the nitride etch are used as a mask for the implantation of low-voltage (n−) tanks 422, 423 and 424. N-tank 422 will be used as the enclosing tank for the low-voltage p-channel field effect logic transistor 402. N-tank 423 will be used as a portion of the drain of a drain-extended n-channel power transistor 407. N-tank 424 will be used as the enclosing tank of a Schottky diode 411. One of the technical advantages of the process described herein is that the drain 423 of the drain-extended n-channel field effect transistor 407 is created at the same time as the n-tanks 422 and 424. This simplifies the process by reducing the number of required masks and mitigates damage to the chip 22 by unnecessary implantation, etching, thermal and cleanup steps.

It should be noted that the approximate implantation boundaries given in the shown sectional views are the boundaries obtained after all thermal steps have been completed. At this early stage in the processing, the boundaries are not so deep or wide, but they approach the illustrated boundaries as further thermal steps are performed on the semiconductor chip 22.

After the low-voltage n-type implantation step 373 (FIG. 15), a pad oxide 425 is grown within the previously etched areas. The nitride mask 416 is then stripped in a hot phosphoric acid etch in preparation for the next process step.

Figure 16B:
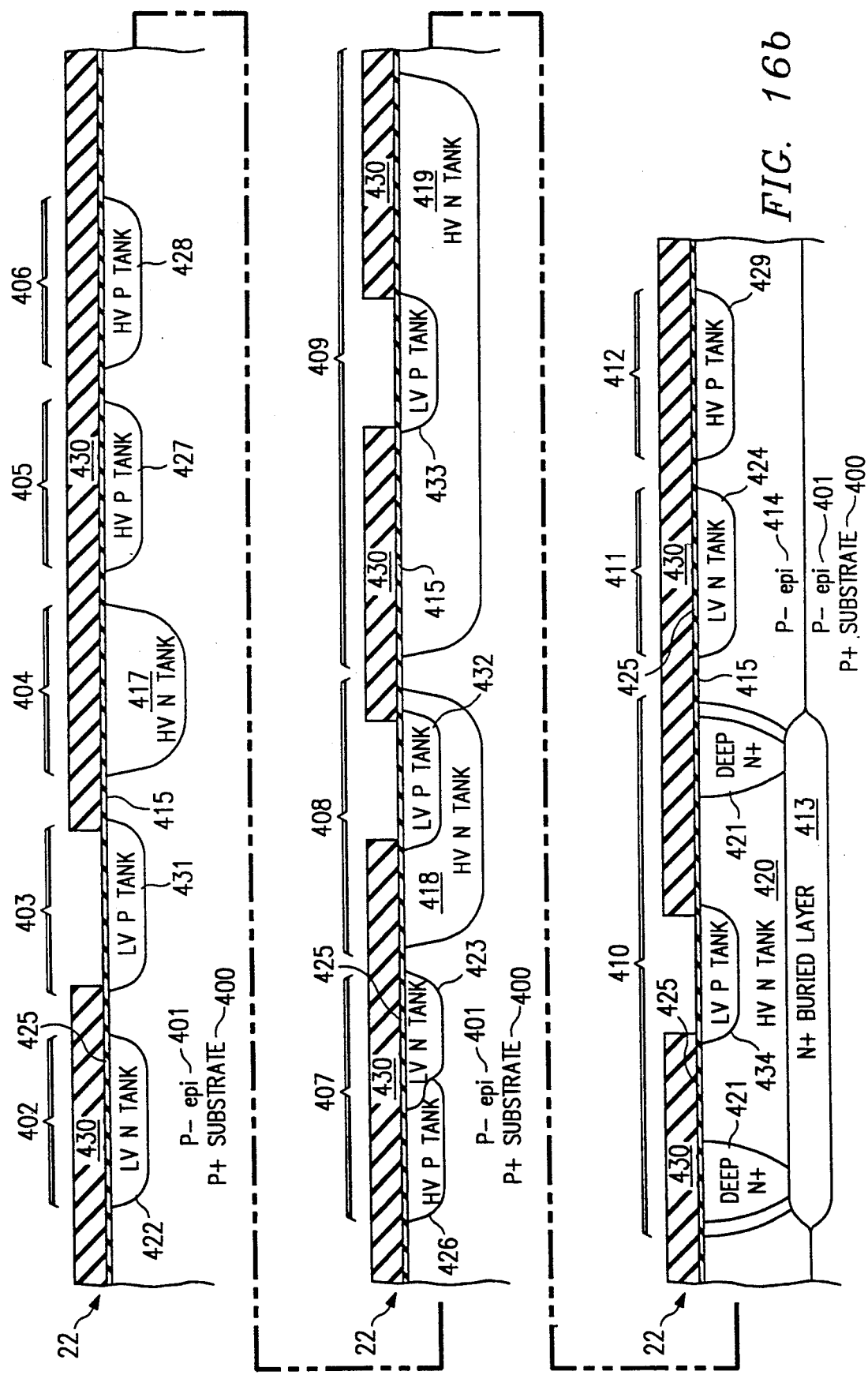

Referring now to FIG. 16b, further steps in the preferred process are shown. Steps occurring immediately next in the process correspond to high-voltage p-tank formation step 374 in FIG. 15. High-voltage p-tanks, which are respectively used as an isolating tank for the EEPROM cell 406, as a channel region for the drain-extended n-channel power field effect transistor 407, and as a tank for the FAMOS EPROM cell 412, are patterned using a layer of photoresist (not shown). A (p−) implant is next performed with boron at a dose of about $1.4 \times 10^{12}$ ions/cm$^2$ and at an energy of approximately 40 KeV. This creates high-voltage p-tank regions 426, 427, 428 and 429. The implantation of high-voltage p-tank 426 changes the p/n diode boundary between it and the low-voltage n-tank 423 as shown.

Proceeding to step 375 of FIG. 15, low-voltage p-tanks are next patterned with a photoresist layer 430 and a P-type implant is performed, preferably with boron at a dose of about $2.5 \times 10^{12}$ ions/cm$^2$ and an energy of approximately 40 KeV. This implantation causes the creation of low-voltage p-tank 431 for the low-voltage n-channel field effect transistor 403, region 432 as a drain of the extended-drain p-channel transistor 408, region 433 as a channel region of the lateral DMOS n-channel transistor 409, and region 434 as a channel region of the vertical DMOS n-channel power transistor 147. The photoresist layer 430 is then stripped.

Figure 16C:
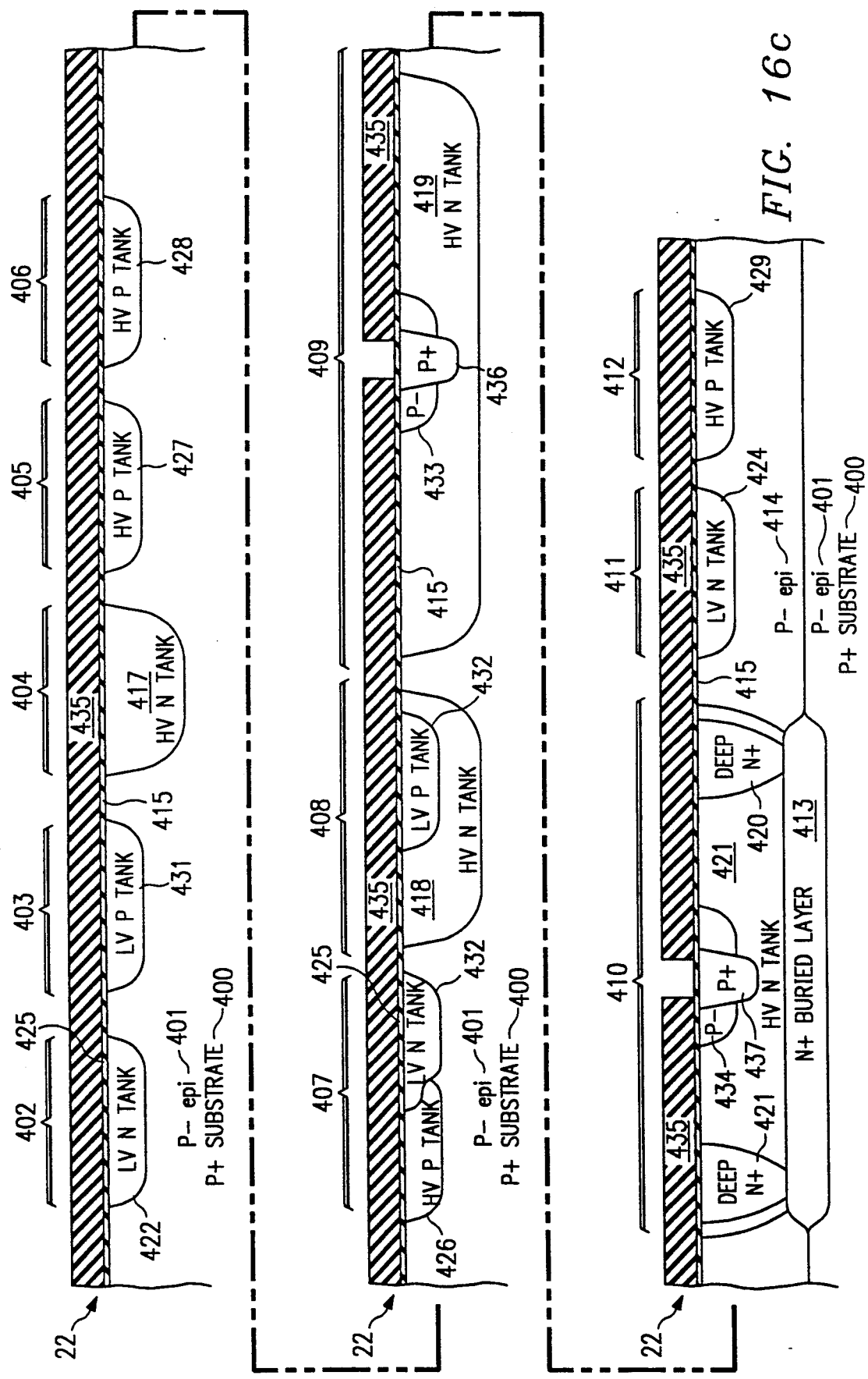

Referring now to FIG. 16c, further process steps will be illustrated, which correspond to the deep (p+) fabrication step 376 in FIG. 15. A layer 435 of photoresist is patterned as a mask for the implantation of deep (p+) implants used in the fabrication of back gates for the lateral DMOS n-channel transistor 409 and the vertical DMOS n-channel transistor 410. The implant is done preferably with boron at a dose of about $1 \times 10^{12}$ ions/cm$^2$ and an energy of about 40 KeV. After the high-voltage p-tank, low-voltage p-tank and deep (p+) implants, a thermal tank drive step is performed at about 1100° C. under an inert atmosphere for about 500 minutes. The deep (p+) implant step yields a deep (p+) back gate region 436 in the lateral DMOS n-channel transistor 409, and a deep (p+) back gate region 437 in the center of the vertical DMOS n-channel transistor 410. Layer 435 of photoresist is then stripped. The (p−) tanks 433 and 434 are positioned to be spaced by a substantial margin away from the lateral margins of the high-voltage n-tank 419 and the high-voltage n-tank 421, respectively. The (p−) tank 434 is also significantly spaced from the deep (n+) diffusion 421, which in a preferred embodiment takes an annular or endless form. The deep (p+) implantations 436 and 437 are preferably centered within, and interiorly spaced from the lateral margins of, the respective (p−) tanks 433 and 434.

The process now enters the moat step 377 as shown in the process diagram of FIG. 15. This portion of the process is illustrated in part by FIG. 16d. A moat pad oxide layer (not shown) is formed across the surface of chip 22 to a depth of about 400 Angstroms using hydrogen peroxide as a reactant. Thereafter, a layer 438 of nitride (layer 438 may be taken in FIG. 16d to represent the nitride and pad oxide together) is formed to a depth of about 1400 Angstroms in a thermal step at 800° C. using a silicon nitride depositing system, such as a combination of ammonia and dichlorosilane. The resultant nitride/oxide moat layer 438 is then patterned and plasma-etched to leave the moat mask 438 as shown. The moat nitride/oxide layer 438 is left over the central regions of the n and p tanks as a protection from subsequent implant and localized oxidation (LOCOS) steps.

The channel stop step 378 of FIG. 15 is next performed. For those devices to be fabricated on chip 22 formed in (n−) tanks, it is desirable that the channel stop dopant not be implanted in areas left exposed by the moat layer 438. Therefore, a photoresist layer 439 is patterned to define many of the lateral edges of the channel stop regions. The channel stop implant may be performed, for example, with a (p) type dopant such as boron at a dose of about $3 \times 10^{13}$ ions/cm$^2$ and at an energy of about 30 KeV. It will produce the channel stop regions represented by the pluses 440 in FIG. 16d. The channel stop regions 440 have been omitted from the subsequent sectional views shown in FIGS. 16e–16g for the purpose of clarity. The channel stop implant acts to augment the conductivity type of the (p−) epitaxial layer 401 to (p) type in the implanted channel stop regions 440. It prevents the formation of parasitic transistors between the devices. The photoresist layer 439 is subsequently ashered and cleaned from the surface of chip 22.

Turning now to FIG. 16e, further steps under the high-level channel stop step 378 as shown in FIG. 15 will be described. Localized oxidation (LOCOS) next occurs to about 7600 Angstroms in thickness (the thicknesses of the sections shown in FIGS. 16a–16g not being to scale) under an oxidizing atmosphere such as hydrogen peroxide for about nine to ten hours at about 900° C. The oxidation occurs in those areas left open by the nitride/oxide mask 438 shown in FIG. 16d. This produces the isolating oxide regions 441 shown in FIG. 16e. The oxide portion of masking layer 438 is removed in a hydrofluoric acid dip for two minutes, and the nitride portion of layer 438 is removed in a hot phosphoric acid solution at about 185° C. for about 185 minutes.

After a cleanup step, a dummy oxide layer (not shown) is grown on the exposed silicon surface to remove damaged material. This dummy oxide layer is subsequently stripped with a hydrofluoric acid wet etch.

Continuing to refer to FIG. 16e, further steps in the process are shown. These steps correspond to the "FAMOS floating gate" step 379 as shown in FIG. 15. An EPROM floating gate oxide layer 442 is grown for the floating gate avalanche metal oxide semiconductor (FAMOS) EPROM cell 149. This oxide layer 442 is grown to a depth of approximately 350 Angstroms under an oxygen atmosphere at about 900° C. Then, a first layer 443 of polycrystalline silicon (poly 1) is deposited on the chip surface to a depth of about 2000 Angstroms using, for example, silane as a gaseous silicon carrier at about 625° C. Poly 1 layer 443 is doped to render it conductive with phosphorus by subjecting the chip 22 to a nitrogen-oxygen-POCl$_3$ atmosphere at about 900° C. for about 20 minutes. The poly 1 layer 443 is then deglazed, patterned and etched to produce the FAMOS floating gate 443 and gate oxide 442 as shown in FIG. 16e.

During the step of forming the gate oxide layer 442 and depositing the poly 1 layer 443, the poly 1 layer was deposited on other, non-array portions of the chip 22 (not shown). Following the deposition, patterning and etching of the poly 1 layer 443, an interlevel oxide layer is grown on the exposed surfaces of the poly 1 layer 443 to a depth of approximately 110 Angstroms under an oxygen atmosphere at about 950° C. This is followed by an interlevel nitride layer grown to approximately 250 Angstroms in depth at about 800° C. under an atmosphere of ammonia and dichlorosilane. The combined nitride/oxide sandwich is illustrated as a single layer 444 for cell 412 in FIG. 16e.

After the step of forming the nitride/oxide insulator layer 444, a layer of photoresist (not shown) is used to cover the layer 444 for all of the FAMOS n-channel EEPROM cells 412. Non-array portions of the nitride layer 444, however, are left exposed. The non-array portions of the nitride layer 444 are then etched and removed.

Returning momentarily to FIG. 15, the next high level process step is the high-voltage device $V_t$ adjust step 380. Under this step, a layer of photoresist (not shown) is deposited on the chip and patterned to expose the high-voltage n-tanks 417, 418, 419 and 421. These tanks are implanted with boron at a concentration and energy sufficient to alter the threshold voltage of the p-channels by approximately one volt. The layer of photoresist (not shown) is then stripped. A second threshold voltage adjust implant is performed for those devices using the high-voltage p-tank structures 427, 428, 426 and 429. A layer of photoresist (not shown) is deposited on the chip 22 and patterned to selectively expose these areas while covering up all others. An n-channel $V_t$ adjust implant is then performed using boron to alter the threshold voltage by about 0.85 volts.

After the high-voltage $V_t$ adjust implants, a high-voltage gate oxide layer 445 is grown on exposed portions of the silicon to a depth of from 325 to 500 Angstroms at about 900° C. under an oxygen atmosphere.

Incorporated in the next high-order process step 381 (FIG. 15) is a low-voltage $V_t$ adjusting implant. Continuing to refer to FIG. 16e, a layer of photoresist (not shown) is deposited on the surface of the chip 22 and patterned to expose the low-voltage tanks 422, 431, 427, 423, 432, 433, and 434. An implant of boron is then made through the high-voltage gate oxide layer 445 then existing on the low-voltage tank areas. After this implantation step occurs, and using the same patterned layer of photoresist, the gate oxide layer 445 is etched from the surfaces of the low-voltage n and p-tanks immediately above described. Gate oxide layer 445 is left on the high-voltage tanks 417, 427, 428, 426, 418, 419, 421 and 429 after this etch step.

Next, the old layer of photoresist is stripped and a low-voltage gate oxide layer 446 is grown on the low-voltage tanks of field-effect transistors 402 and 403 in the place of the etched-away high-voltage gate oxide layer 445. The low-voltage gate oxide layer 446 is grown to a depth of approximately 436 Angstroms under a thermal step with an oxygen atmosphere.

The next high level process step, as shown in FIG. 15, is step 382 comprising the fabrication of a tunnel diode for EEPROM cell 406 fabricated on the chip 22. Referring again to FIG. 16e, a layer 447 of photoresist is deposited on the surface of chip 22 and patterned to define an implantation area for a tunnel diode. A phosphorus implant is then made through the oxide layer 445 then existing above the area to be implanted to create an (n−) tunnel region 448. The portion of the oxide layer 445 existing over the tunnel region 448 is then etched back to the semiconductor surface. Photoresist layer 447 is then stripped. Next, a tunnel oxide layer 449 is grown back on the exposed surface to a depth of approximately 90 Angstroms under an oxygen atmosphere at approximately 850° C. This completes the high level tunnel diode step 382 as shown in FIG. 15.

FIG. 15's next high-level process step 383 concerns the deposition, doping and definition of a plurality of conductive level 2 poly gates. Referring to FIG. 16f, these next steps in the fabrication process are illustrated. A second layer of polycrystalline silicon (poly 2) is deposited to a depth of approximately 4500 Angstroms. This may be accomplished, for example, using silane as the depositing agent at about 625° C. The poly 2 layer is then doped with phosphorus to render it conductive with, for example, POCl$_3$ in a thermal step at about 900° C. with nitrogen and oxygen present. The poly 2 layer is then deglazed. A layer of photoresist (not shown) is deposited across the surface and patterned. The second poly layer is then etched to define the following poly 2 gates: a low-voltage p-channel transistor gate 450, a low-voltage n-channel transistor gate 451, a p-channel EEPROM transistor gate 452, an n-channel EEPROM transistor gate 453, an n-channel EEPROM control gate 454, an EEPROM floating gate 455, a drain-extended n-channel transistor gate 240, a drain-extended p-channel transistor gate 457, an annular or endless lateral DMOS n-channel transistor gate 458, an annular or endless vertical DMOS n-channel transistor gate 459, and a FAMOS n-channel control gate 460 (this last gate is only partially defined at this point).

Figure 16D:
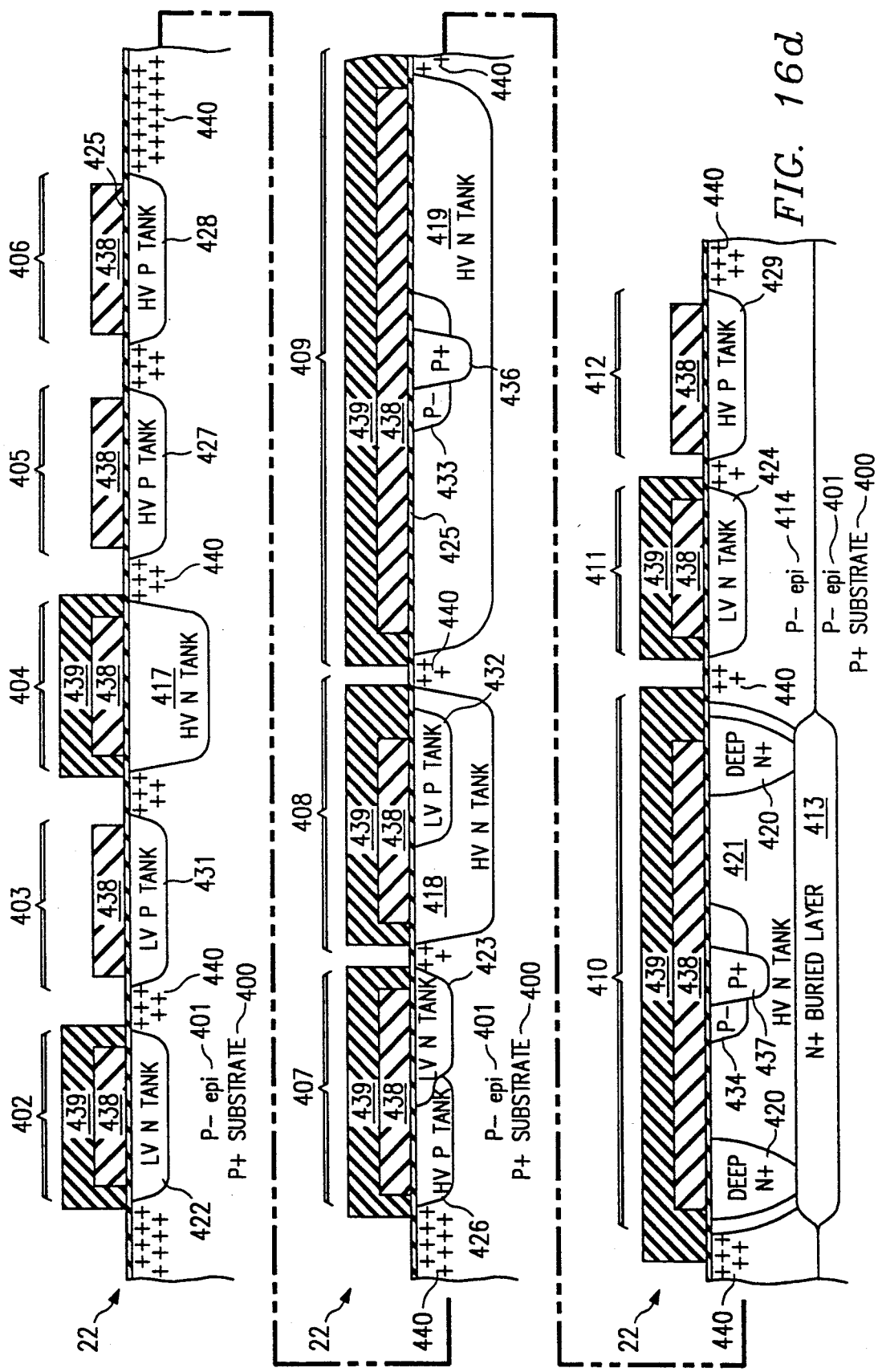
Figure 16G:
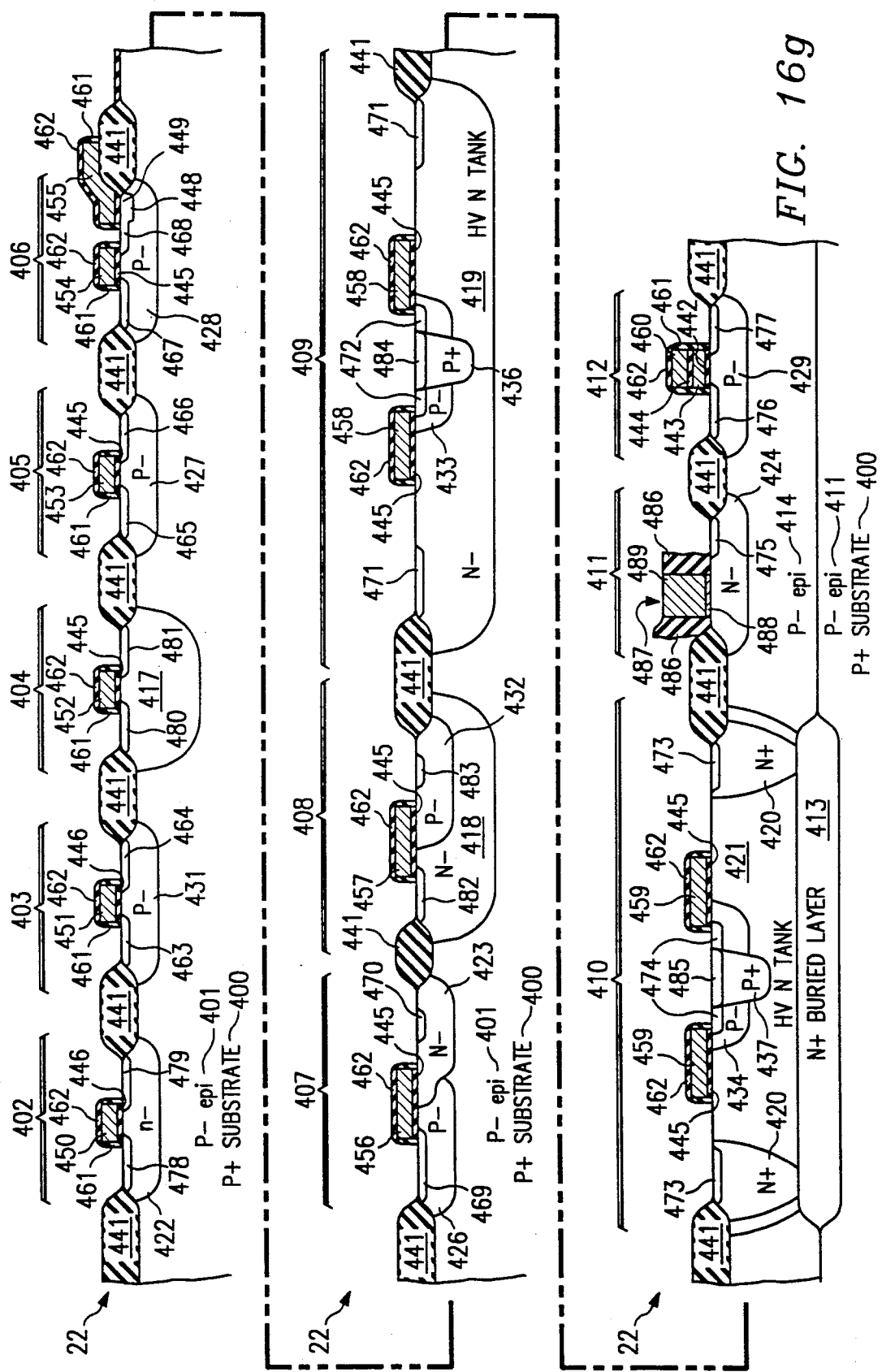
Figures 1, 16G:
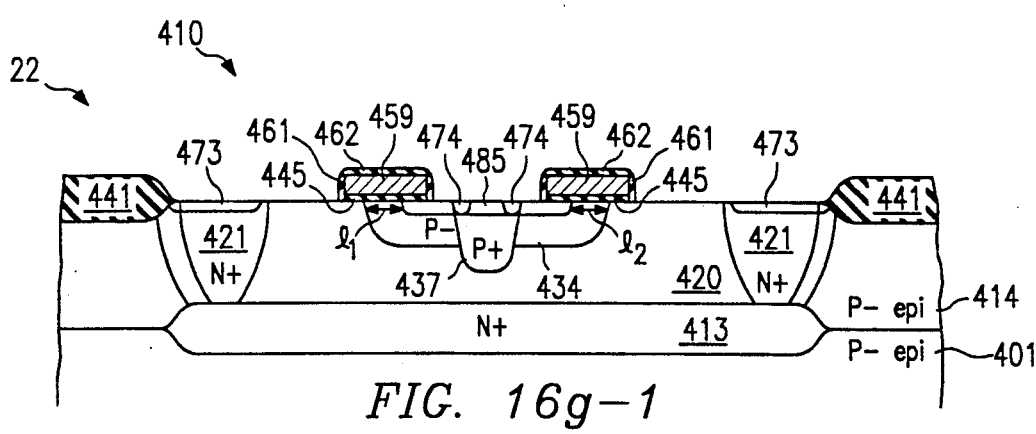

Turning now to FIG. 16g, the remaining principal steps of the integrated fabrication process are illustrated. Returning momentarily to FIG. 15, the next steps illustrated in FIG. 16g are the EPROM stack etch step 384, the source/drain fabrication step 385, and the contact step 386. A layer of photoresist (not shown) is deposited over the surface of the chip 22 and patterned to expose unwanted portions of second poly layer 460 in EPROM area 412. The patterned photoresist defines a stack including the EPROM floating gate oxide 442, the EPROM floating gate 443, the nitride/oxide sandwich layer 444 and the second poly control gate 460. Using the same photoresist mask, all of these layers are successively etched until the "stack" 442, 443, 444 and 460, as illustrated in FIG. 16g, is produced. The patterned photoresist layer is then removed.

Following the stack etch, a 2000 Angstrom-thick layer of oxide (not shown) is deposited over the chip 22 and anisotropically etched back to produce sidewall oxide regions 461. Because the original thickness of the oxide at features of the face having vertical relief are deeper than the thickness of the oxide layer generally, regions 461 are left over from the etchback. After the etchback, a 300 Angstrom layer 462 of cap oxide is grown in a thermal step under an oxygen atmosphere to insulate the exposed surfaces of gates 450, 451, 452, 453, 454, 455, 456, 457, 458, 459 and 460.

A layer of photoresist (not shown) is next deposited over the surface of chip 22 and patterned to expose device areas 403, 405 and 406. Selected portions of device areas 407, 408, 409 and 410 are also left open. EPROM device area 412 is also left open. A low density diffusion (LDD) implantation is then performed with a mobile n-type dopant such as phosphorus at a dose of about $4.0 \times 10^{14}$ ions/cm$^2$ and at an energy of approximately 80 KeV. This creates source/drain regions 463, 464, 465, 466, 467 and 468, source region 469 for the drain-extended n-channel transistor 407, contact region 470 for the drain of transistor 407, drain contact region 471 and annular source/drain region 472 for the lateral DMOS n-channel transistor 409, deep (n+) contact region 473 and an annular source/drain region 474 for the vertical DMOS transistor 410, contact region 475 for the Schottky diode 411, and source/drain regions 476 and 477 for the FAMOS EPROM cell 412.

A second (n+) source/drain implant follows the LDD implant into the same areas, making them (n+), and is performed with arsenic at a dose of approximately $5 \times 10^{15}$ ions/cm$^2$ and at an implantation energy of approximately 120 KeV. Thereafter, these two implantations are annealed at about 900° C. under a nitrogen atmosphere to obtain the implantation boundaries shown. In particular, a portion of the phosphorus dopant in (n+) regions 472 and 474 diffuses partially under the respective gate oxides 445 for the LDMOS transistor 409 and the VDMOS transistor 410.

The (n+) source/drain patterned photoresist layer (not shown) is stripped and replaced with a layer of photoresist (not shown) which is patterned to define a plurality of (p+) source/drain regions. A (p+) source/drain implant is performed with boron at a dose of about $2 \times 10^{15}$ ions/cm$^2$ and an energy of about 25 KeV. This implant step creates (p+) source/drain regions 478, 479, 480 and 481 for the low-voltage and EEPROM gating p-channel field effect transistors 402 and 404, respectively; a source 482 and a drain contact region 483 for the drain extended p-channel transistor 408; and central back gate contact regions 484 and 485 for the lateral DMOS transistor 409 and the vertical DMOS transistor 410, respectively.

The steps described immediately above correspond to the source/drain fabrication step 385 in FIG. 15. The process next proceeds to "contacts" step 386. After a cleanup step, borophosphate silicon glass (BPSG) is deposited and densified. A layer (not shown) of photoresist is patterned and etched for the contacts (not shown) for each of the devices 402–412. The BPSG is only shown with respect to the Schottky diode device area 411, where it is indicated by 486. The patterned photoresist is used as a mask for successive wet and plasma etches of the contact orifices, including orifice 487 of the Schottky diode 411.

After another cleanup step, platinum is deposited in the Schottky diode orifice(s) 487 only and sintered to create a platinum silicide layer 488. Nonreacted platinum is removed. Then, in orifice 487 and in the other contact orifices (not shown) a refractory metal such as titanium-tungsten alloy is sputtered on a depth of approximately 3300 Angstroms. This is followed with another approximately 6000 Angstroms of an aluminum copper alloy to complete the first level metallization. This first layer of metal (metal 1) is then patterned, etched and sintered. A metal 1 contact is represented by 489 in FIG. 15g; like metal contacts are made to each of the various device terminals of devices 402–412. Some of these contacts are not made within the sectional planes shown in FIG. 16g, and others have been omitted for the purpose of clarity.

The remaining process steps are not represented by any structure in FIG. 16g, as they are straightforward to persons having ordinary skill in the art. A middle level insulator layer is deposited over the first level metallization, and vias are patterned and etched into it. A second metal layer, formed successively by sputtering a titanium tungsten alloy and an aluminum copper alloy, is then patterned and etched. A nitride/oxide layer is deposited over the surface of chip 22. This nitride/oxide layer forms a protective overcoat, which is patterned and etched to expose the lead pads 76 of chip 22 (see FIG. 3). Post cleanroom steps follow at step 391 in FIG. 15.

INTEGRATED PROCESS AS APPLIED TO THYRISTOR STRUCTURE

The integrated process will now be described in conjunction with the thyristor physical embodiment as shown in FIGS. 7a–7g. A (p+) substrate 400 is provided as before, and a (p−) epitaxial layer 401 is grown on it. Then, at step 370 of FIG. 15, an (n+) buried layer 202 is added by epitaxial growth. High voltage n-tank implantation step 371 (FIG. 15) produces implantation regions 200 and 148 as shown in FIG. 7a. The deep (n+) diffusion regions 229 are produced at step 372. A pad oxide layer 415 and a nitride layer 416 are used to define these implantations. Turning now to FIG. 7b, a low voltage (n−) tank implant is used to create region 209a. Then, a layer 430 of photoresist is patterned and etched, and used to define the implantation of low voltage p-tank 209 at step 375 in FIG. 15. In FIG. 7a, the (p−) epitaxial layer 208 is created at the same time as epitaxial layer 414 shown in FIG. 16a.

FIGS. 7c–7e intentionally have been omitted, as the cross-sectional views corresponding to FIGS. 16c–e do not change in any appreciable manner from FIG. 7b. The next cross-sectional view of interest corresponds to FIG. 16f, and therefore has been labeled FIG. 7f. At approximately step 378 as shown in FIG. 15, the moat or localized oxide regions 231 are grown at the same time as oxide regions 441 as shown in FIG. 16f. At step 381 in FIG. 15, a low voltage threshold adjust implant (not shown) is implanted into the surface of the low voltage p-tank regions 209. A low voltage threshold adjust implant is also performed for LV (n−) tank region 209a. This is followed by the growth of a low voltage gate oxide 500 in that same high-order step. Gates 158, 176 and 222 are deposited, patterned and etched at step 383 in FIG. 15.

Turning finally to FIG. 7g, (p+) regions 160, 156, 168 and 182 are implanted prior to the implantation of sources and drains in step 385 as given in FIG. 15. This implantation step is partially self-aligned to oxide islands 231 with remaining lateral margins thereof aligned to edges of photoresist (not shown). Then, the surface source/drain and (n+) contact implants 163, 212, 166, 170, 174, 218, 220 and 228 are implanted at the time of source/drain step 385. Further steps to complete the device are as listed in FIG. 15, and have been omitted for the purpose of brevity.

VERTICAL DMOS TRANSISTOR

FIG. 16g-1 is a more detailed sectional view of the vertical DMOS transistor 410. As described above, the source/drain region 474 is the recipient of an LDD (low density diffusion) implant of phosphorus as well as an (n+) implant of a heavier (n) type dopant such as arsenic. The low-voltage p-tank 434 is created with a dopant such as boron.

According to the prior art, the structure equivalent to the p-tank 434 and the source/drain region 474 were implanted as self-aligned to the interior lateral margins of the poly gate 459, as augmented by the sidewall oxide regions 461. Since phosphorus is a very mobile dopant, the source/drain region 474 had a tendency to diffuse laterally under the gate 473 at a faster rate than the boron defining (p−) channel region 434, diminishing or eliminating the metallurgical channel lengths $l_1$ and $l_2$. To prevent this problem, the dopant concentration of the source/drain region 474 was made to be considerably less than optimum, or about $10^{18}$ ions/cm$^3$.

Because the integrated process forms the low-voltage p-tank 434 before the application of the poly gates 459, the dopant concentration within the source/drain regions 474 can be increased to at least on the order of $10^{20}$ ions/cm$^3$. Since the (n+) regions 474 are self-aligned to the poly gate 459, the channel length $l_1$, $l_2$ is determined by the alignment of the poly to the low-voltage p-tank 434. The structure and advantages of the LDMOS transistor 409 are similar.

Figures 1, 16H:
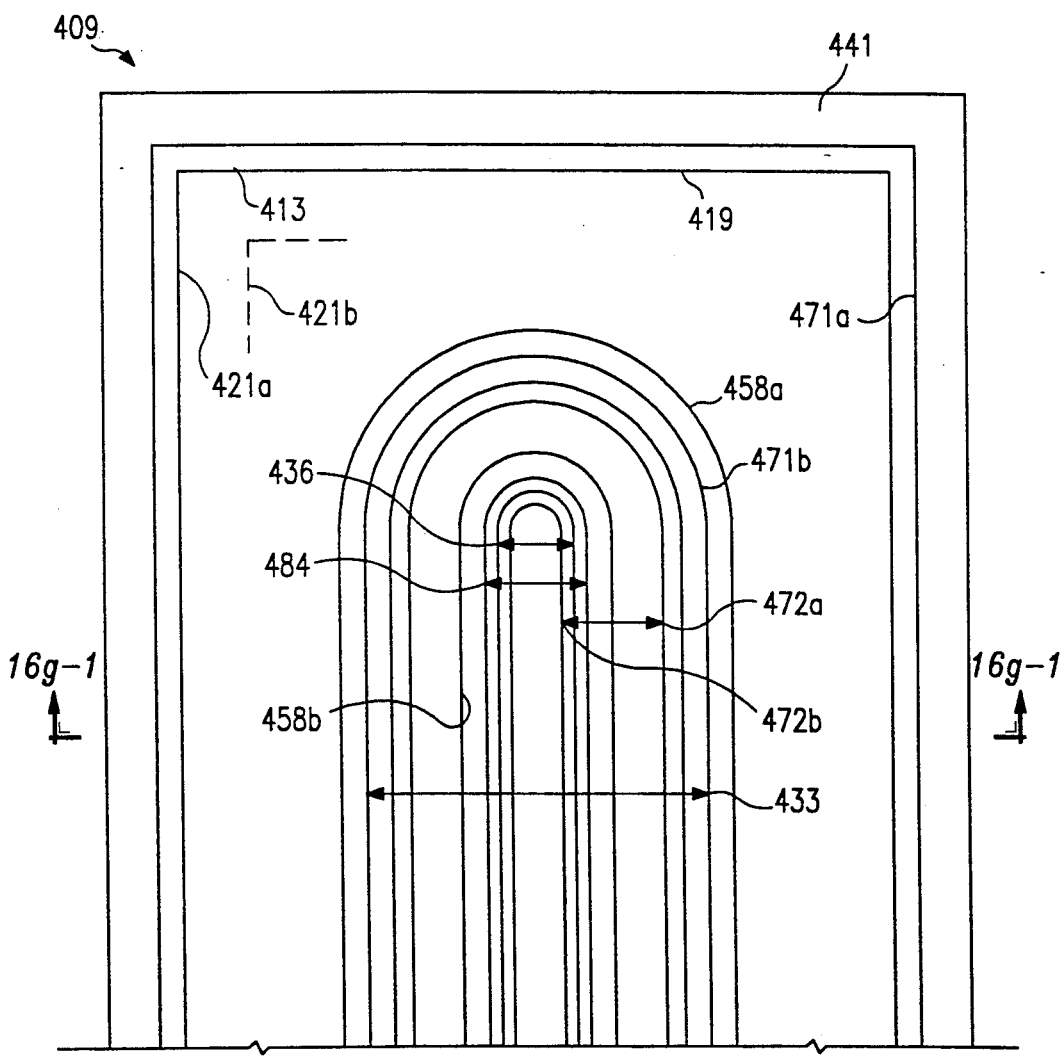

FIG. 16h-1 is a plan view of LDMOS transistor 409. A moat oxide boundary 441 forms a rectangular (picture frame) border around the active device area. The boundary of the high-voltage n-tank is shown by a rectangular border line 419 set to the interior of the moat oxide 441. For the vertical DMOS structure 410, a deep diffusion region is required, and the interior limit of this is shown in phantom at 421b. This is also the approximate boundary of the deep diffusion contact region 473. FIG. 16h-1 shows a single "stripe" of an LDMOS or VDMOS structure disposed within (n−) tank 419. The exterior oval line 458a marks the exterior limit of the poly gate 458. In the LDMOS case, the next interior line represents the interior boundary of a laterally exterior (n+) source/drain region 471, which extends from the internal boundary of the moat oxide 441 (shown at 471a) to a point underneath the poly gate 458 at 471b. In the VDMOS case, the internal boundary of this exterior source/drain region is kept at the interior boundary of the deep diffusion region shown at 421b.

The next limit encountered as one proceeds inwardly is a metal 1 conductor margin. The exterior boundary of the internal annular (n+) source/drain region is next encountered at 472a. The external boundary of the low-voltage p-tank 433 may be the same as the internal boundary of the exterior source/drain region 471b. The next boundary inward is the interior lateral margin 458b of the annular poly gate 458. The exterior lateral margin of the deep (p+) diffusion surface contact region 484 appears next. Radially inwardly of this is the exterior limit of the deep (p+) back gate 436. The last limit encountered as one proceeds inwardly is the interior boundary 472b of the (n+) source/drain region 472.

Only a portion of the plan view of the LDMOS transistor 409 is shown. While, in a typical case, as delimited by the exterior margin 458a of the poly gate, the transistor 409 may be approximately 32 microns in diameter, the transistor 409 may be 500 to 1000 microns long. Further, several such "stripes" can be placed within the same n-tank 419 and connected in parallel. Similarly, these same parallel "stripes" can share the same endless annular deep (n+) diffusion region 383, in the case of the vertical DMOS transistor structure, and the same (n+) buried layer 413 (see FIG. 16g-1).

While devices 402–412 have been used by way of example to show an integrated process for the fabrication of each, further devices may also be built using the same process flow. The following series of FIGS. 17–24 are all arranged in a similar manner. For example, FIGS. 17a–17h all illustrate a low-voltage p-channel field effect transistor 501 similar to the transistor 402 shown in FIGS. 16a–16g, with the addition of a back gate connection. Of these, FIGS. 17a–17g are schematic sectional views corresponding, respectively, to FIGS. 16a–16g. FIG. 17h is a schematic plan view of the transistor 501. This pattern is repeated throughout the rest of the FIGS. 18–24 for other devices. Throughout FIGS. 17–24, like characters identify structures corresponding to those found in FIGS. 16a–16g wherever possible.

BACK GATED FIELD EFFECT TRANSISTORS

Figure 17A:
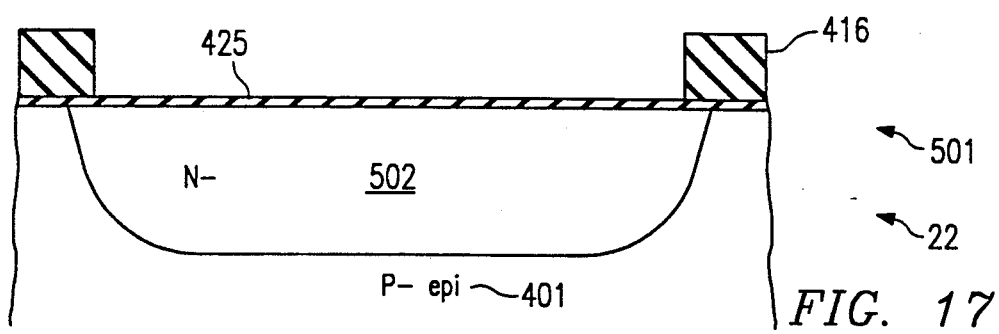
FIGS. 17a-17b and 17d-17g are highly magnified schematic sectional views of steps in the fabrication of a p-channel, low-voltage, back-gated field effect transistor using the integrated process described herein.

Referring particularly to FIG. 17a, a low-voltage p-channel transistor indicated generally at 501 with a back gate connection may be fabricated during the same process flow as the devices shown in FIGS. 16a–16g.

Figure 17B:
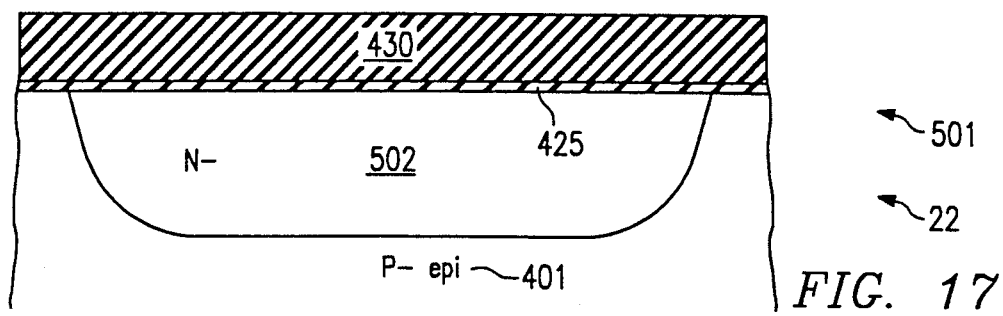
Figure 17D:
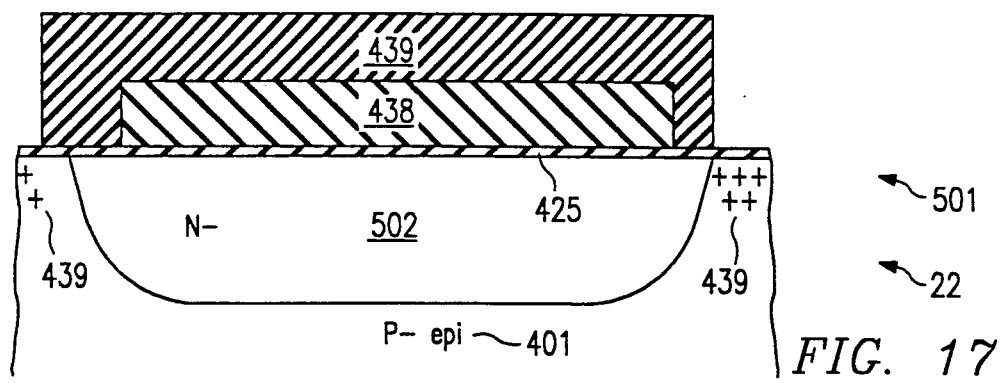

The low-voltage n-tank 488 is implanted at the same time as tank 422 (FIG. 16a). A photoresist layer 416 has been patterned and used as a mask for a low-voltage n-tank 488. In FIG. 17b, the n-tank 488 and the covering oxide layer 425 are left undisturbed. Nothing remarkable happens to device area 501 at the stage shown in FIG. 16c, so FIG. 17c has been omitted. In FIG. 17d, the (n−) tank 488 and the oxide layer 425 are masked off by a combination of the nitride/oxide layer 438 and the patterned channel stop-defining photoresist layer 439. P-type channel stop regions 440 are then implanted, as shown by the pluses in this FIGURE.

Figure 17E:
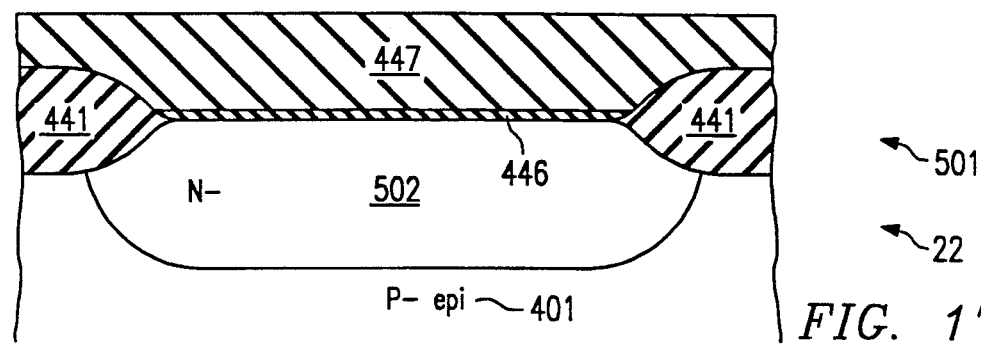

In FIG. 17e, after stripping photoresist layer 439, a localized oxidation (LOCOS) process is used to create the isolating oxide regions 441 in those areas left uncovered by nitride/oxide layer 438 (FIG. 17d). After the high-voltage gate oxide (not shown) is etched off and the low-voltage $V_t$ adjust implant is performed, a gate oxide layer 446 is grown on the face of tank 488. FIG. 17e shows the status of the device 501 at the time that the tunnel diode 448 (FIG. 16e) is implanted; the entirety of the device 501 is shown masked off by photoresist layer 447.

Figure 17F:
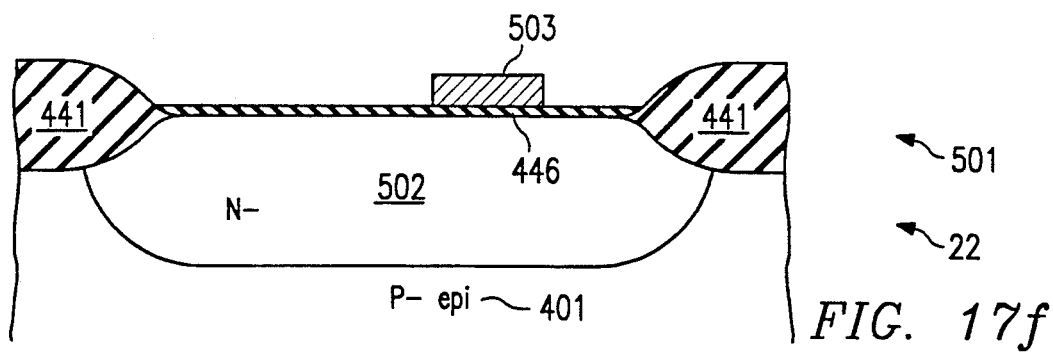
Figure 17G:
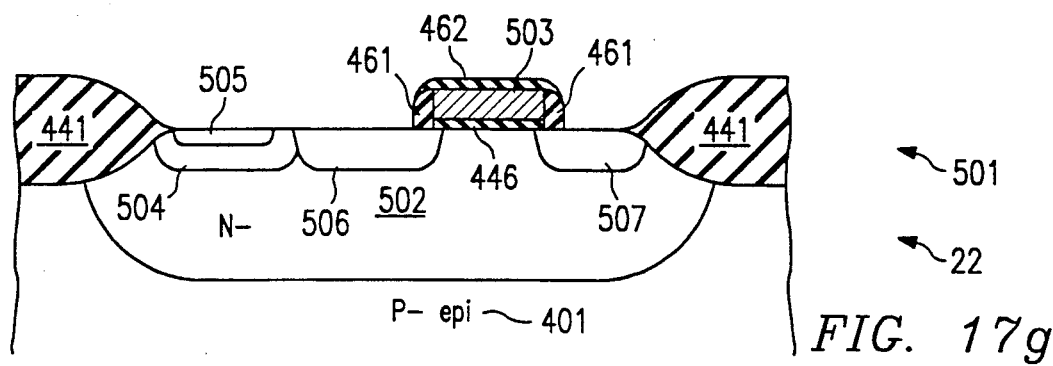
Figure 17H:
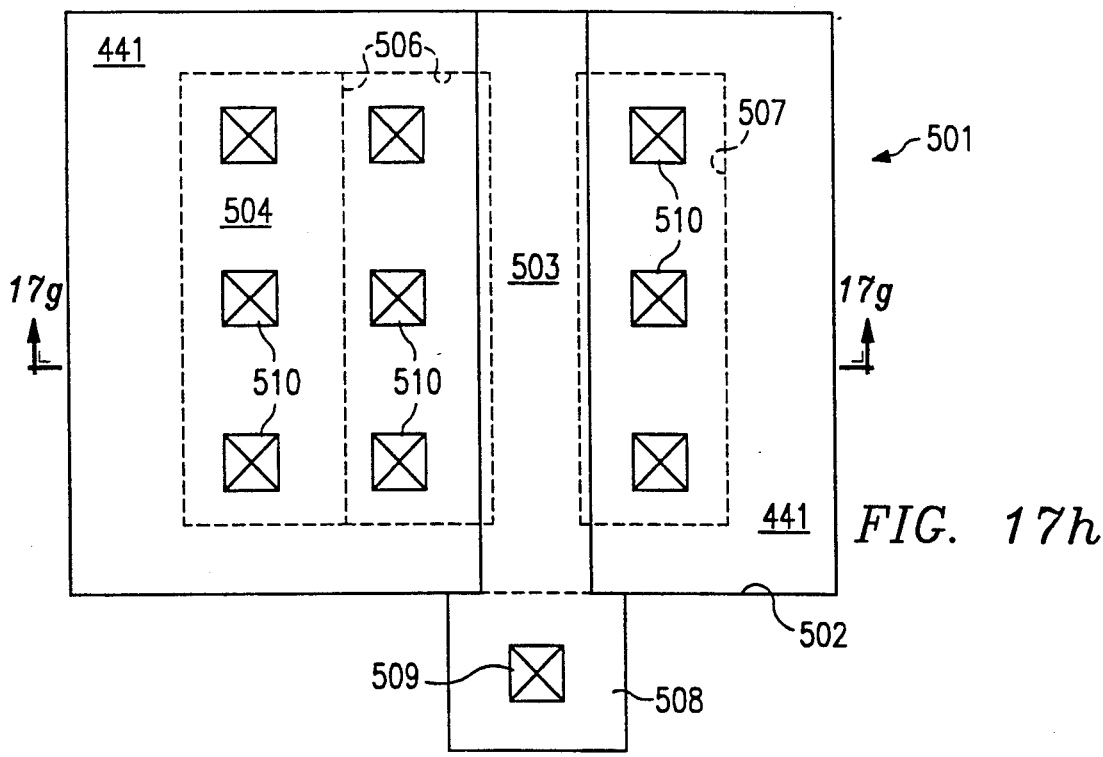
FIG. 17h is a schematic plan view of the transistor shown in FIG. 17g, FIG. 17g being taken substantially along line 17g—17g of FIG. 17h.

A poly 2 gate 489 is deposited, doped, patterned and etched as shown in FIG. 17f. In FIG. 17g, the gate 489 is insulated with sidewall oxide regions 461 and a cap oxide 462. The LDD implant described for FIG. 16g creates an (n−) implanted region 504. The remainder of the transistor area 501 is masked with photoresist for this implantation step. This is immediately followed with an (n+) implantation that occurs at the same time as the (n+) source/drain arsenic implantation occurring during step 385 (FIG. 15). This creates an (n+) region 505. Regions 504 and 505 act as a back gate connection to the n-tank 488. During the (p+) source/drain implantation described in connection with FIG. 16g, source/drain regions 506 and 507 are created in a manner similar to regions 478 and 479 of transistor 402 (FIG. 16g).

Referring now to FIG. 17h, a plan view of a completed device 501 is schematically shown. The low-voltage n-tank 488 is indicated by a solid rectangular line enclosing the active device area. The source/drain implantations are shown by the dotted line enclosures indicated at 506 and 507. The back gate connection region 504 is shown enclosed with a dotted border. The top, bottom and left borders of region 504, the top and bottom borders of region 506, and top, bottom and right borders of region 507 are defined by the lateral edges of the moat oxide layer 441. Implantations 506 and 507 are self-aligned to the edges of the LOCOS oxide 441 and the margins of the second-level poly gate 489 as augmented by the sidewall oxide 461 (see FIG. 17g). Second-level poly gate 489 is extended to a pad 508 to which a contact 509 is made from the first level metal. The first level metal is also used to make contacts 510 to the back gate region 504, the source/drain region 506 and the source/drain region 507 of the transistor 501.

Figure 18B:
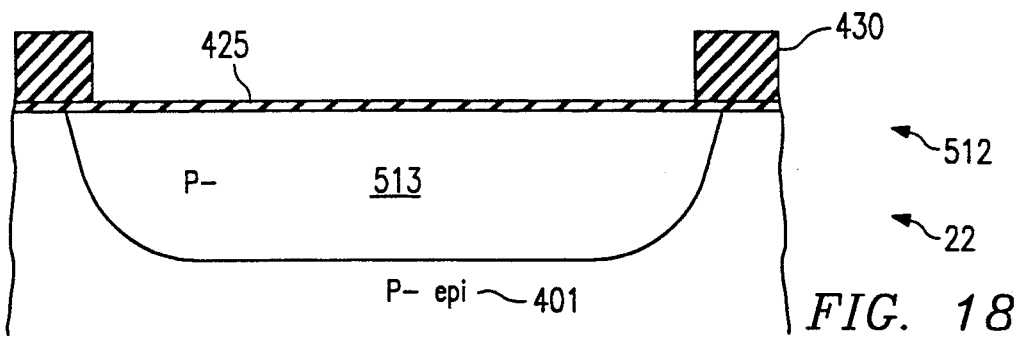
FIGS. 18b-18g are highly magnified schematic sectional views of successive stages in the fabrication of a low-voltage, back-gated n-channel field effect transistor according to the integrated process described herein.
Figure 18C:
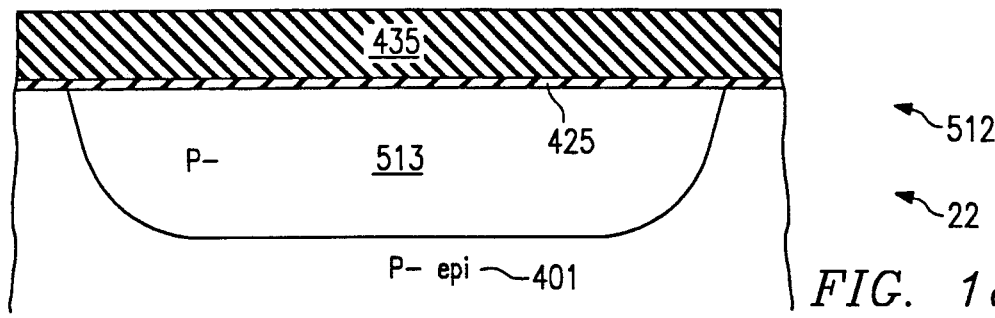
Figure 18D:
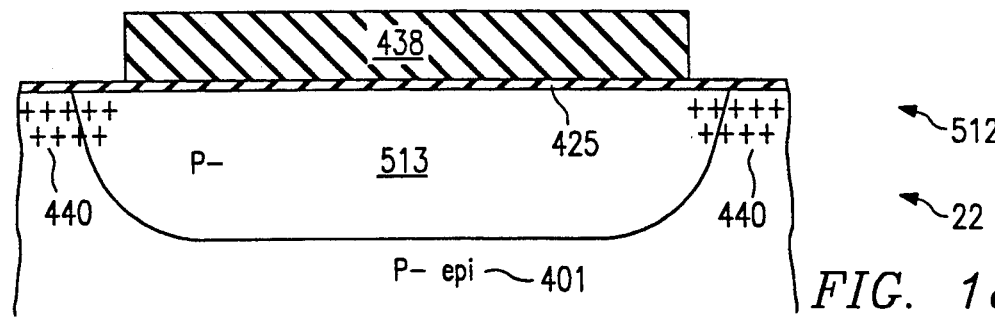
Figure 18E:
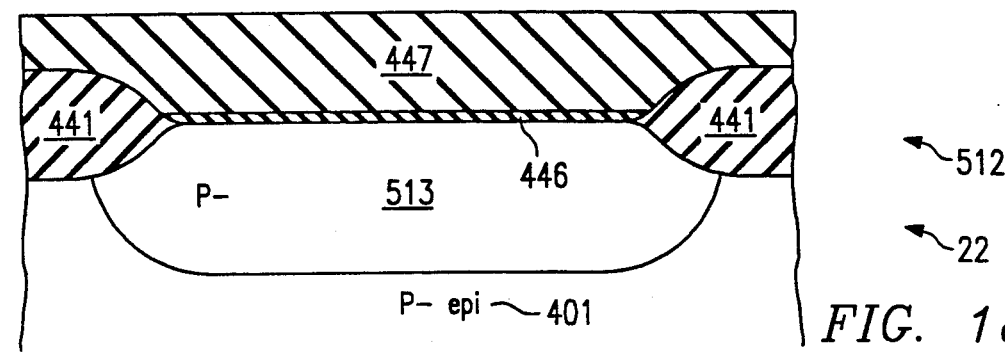

FIGS. 18b–18h illustrate successive stages in the fabrication of a low-voltage n-channel field effect transistor 512 with a back gate connection. There is no FIG. 18a, as nothing of note occurs in the device area which will become the back-gated transistor 512 at the process stage shown in FIG. 16a. FIG. 18b shows the implantation of a low-voltage p-tank 513 at the same time that p-tank 431 is formed in FIG. 16b. The p-tank 513 is defined by a layer 430 of patterned photoresist. In FIG. 18c, the device area 512 is masked off with a layer 435 of photoresist. In FIG. 18d, the nitride/oxide layer 438 is used by itself as a mask for the implantation of channel stops 440, which are not shown in the remaining FIGURES in the sequence. Isolating oxide regions 441 are grown in FIG. 18e in those regions left unmasked by nitride/oxide layer 438 (FIG. 18d). A high-voltage gate oxide 445 (not shown in FIG. 18a) is grown on the surface of the tank 513. The tank 513 is masked off from the high-voltage $V_t$ adjust implant, but is patterned to receive the low-voltage $V_t$ adjust implant. Then, after a cleanup step, a gate oxide layer 446 is grown. As shown, the device area 512 is masked off with a photoresist layer 447 during the EEPROM tunnel diode implantation step.

Figure 18F:
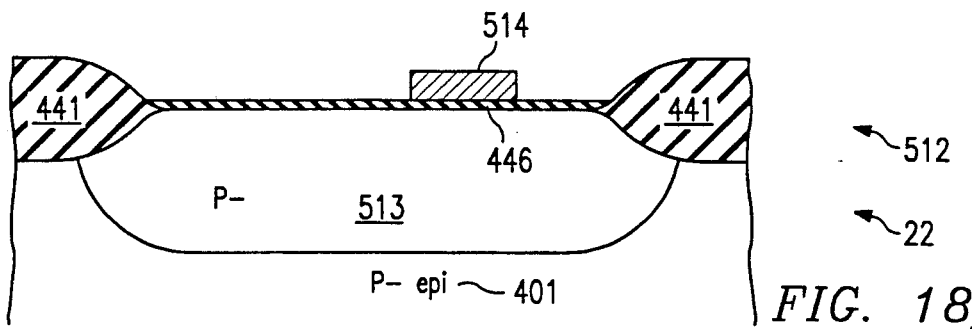
Figure 18G:
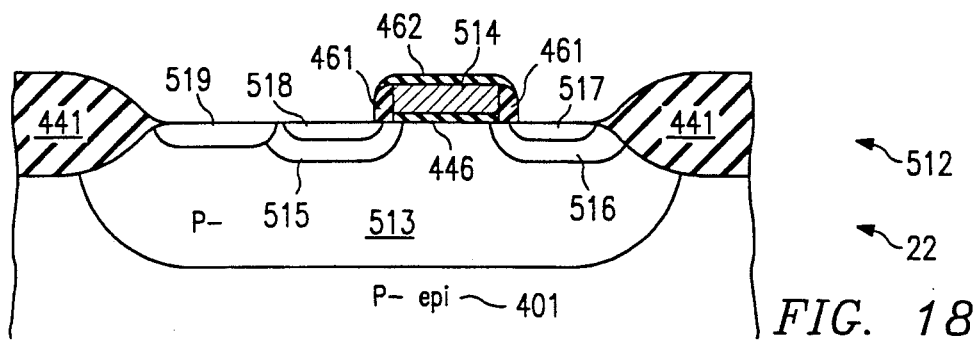

In FIG. 18f, a polycrystalline silicon gate 514 is deposited, doped, patterned and etched. This gate 514 has sidewall oxide regions 461 added to it in FIG. 18g, as well as a cap oxide 462. The gate/sidewall oxide structure 514, 461 is used to partially self-align a pair of (n) implantations: a low density (n−) implant forming source/drain region 515 and source/drain region 516, performed with phosphorus, and a high density implant forming regions 330 and 331, performed with arsenic. At the end of the fabrication process, regions 515 and 516 are diffused to extend underneath the gate 514, while the arsenic defining areas 330 and 331 stays more in place. Finally, a region 332 is patterned and implanted during the (p+) source/drain implanting step with boron to create a back gate connection to the (p−) tank 513.

Figure 18H:
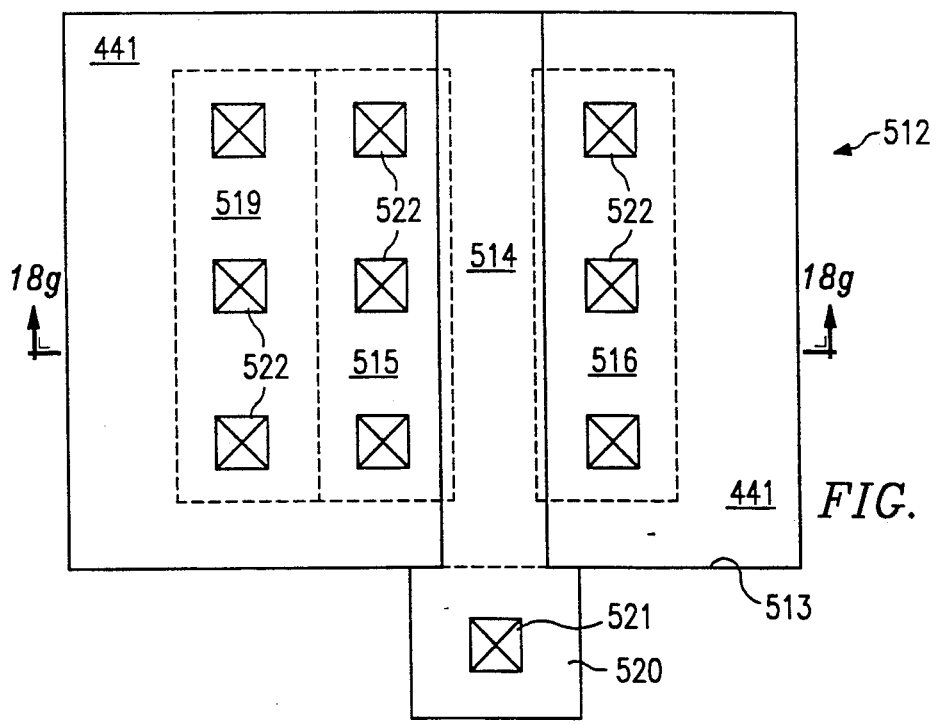
FIG. 18h is a schematic plan view of the transistor shown in FIG. 18g, FIG. 18g being taken substantially along line 18g—18g of FIG. 18h.

FIG. 18h is a schematic plan view of the low-voltage n-channel transistor 512. The p-tank boundary is indicated at 513. Source/drain areas 515 and 516 are defined on two sides (for region 515) or three sides (region 516) by the isolating LOCOS oxide 441. The implantations 515, 516, 517 and 518 (see FIG. 18g for the last two regions, which have been omitted in FIG. 18h for clarity) are self-aligned to the gate 514 and accompanying sidewall oxide regions 461 (not shown in FIG. 18h). The back gate diffusion 519 is self-aligned on its left side to LOCOS oxide 441. The right side thereof is defined using photoresist. The poly 2 gate 514 is extended to a pad 520, and a contact 521 is made to it from the first metal layer (not shown). Conductors of the first metal layer also make connection to the back gate connection 519 and the source/drain regions 515 and 516 through corresponding contacts 522.

Figure 19A:
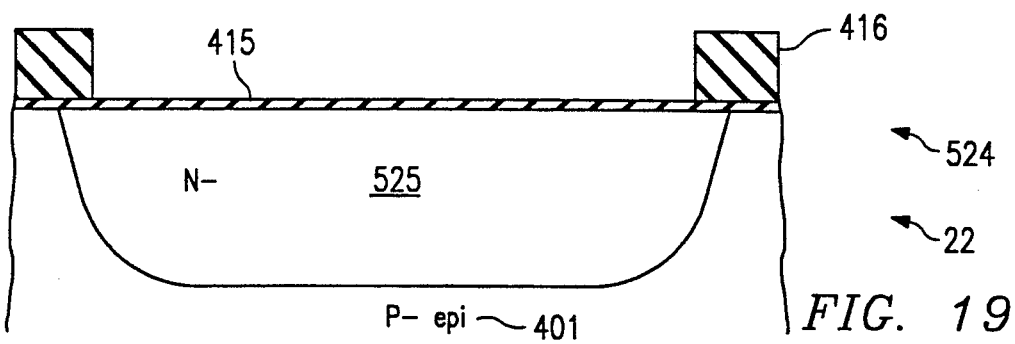
FIGS. 19a-19b and 19d-19g are highly magnified schematic sectional views of successive stages in the fabrication of a high-voltage, back-gated p-channel field effect transistor according to the integrated process described herein.
Figure 19B:
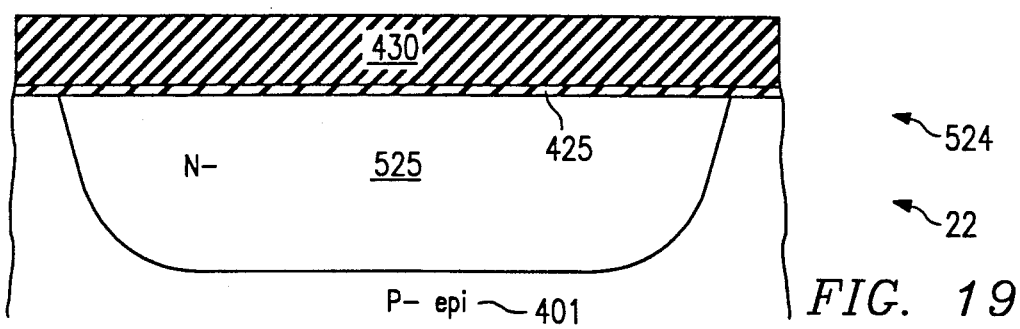

Turning now to FIGS. 19a–19h, the fabrication process of the invention as applied to an 18-volt back-gated NMOS field effect transistor 524 will be described. The transistor 524 is similar to the high-voltage NMOS transistor 404, and both may be used in conjunction with the gating of erase voltages or programming voltages to an EEPROM array. FIG. 19a, corresponding to FIG. 16a in the main sequence, illustrates the formation of a high-voltage n-tank 525 that is formed at the same time that high-voltage n-tanks 417, 418, 419 and 421 are formed. Peripheral portions of the device area 524 are masked over by a nitride layer 416 during the formation of the low-voltage n-tanks in FIG. 16a, and tank 525 is masked by a layer of photoresist (not shown). As shown in part by FIG. 19b, no process steps are performed on the device area 524 during the steps illustrated by FIGS. 16b and 16c. FIG. 19c has therefore been omitted.

Figure 19D:
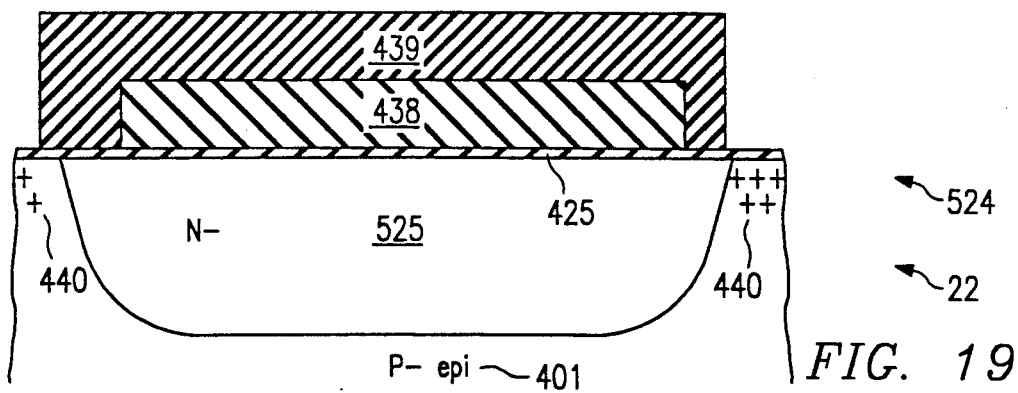
Figure 19E:
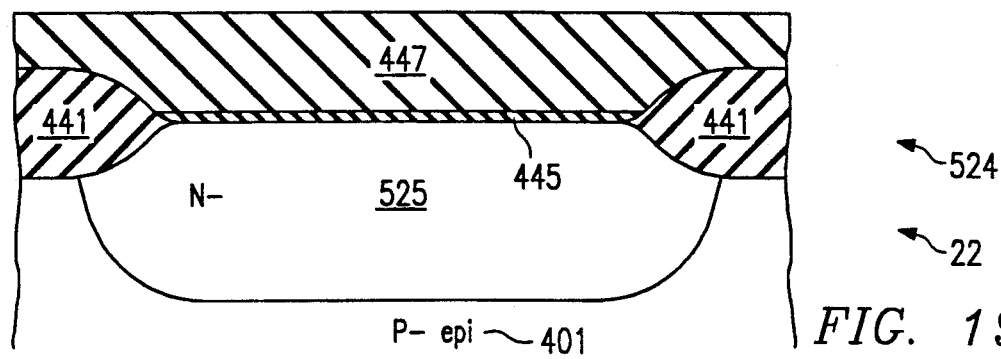

Turning to FIG. 19d, the tank 525 is partially masked by the nitride/oxide layer 438 and the mask is completed by a patterned photoresist layer 439. This photoresist layer 439 is used for the implantation of channel stop regions, indicated at 440 by "+" signs. For the purpose of clarity, the channel stop regions 440 are omitted from the other FIGURES in this sequence. In FIG. 19e, isolating or moat oxide regions 441 are selectively grown at those portions of the surface of the semiconductor layer left exposed by nitride/oxide layer 438 (see FIG. 19d). The tank 525 is left exposed to receive a high-voltage $V_t$ adjust implant. Thereafter, a high-voltage gate oxide layer 445 is grown to a depth of approximately 500 Angstroms.

Figure 19F:
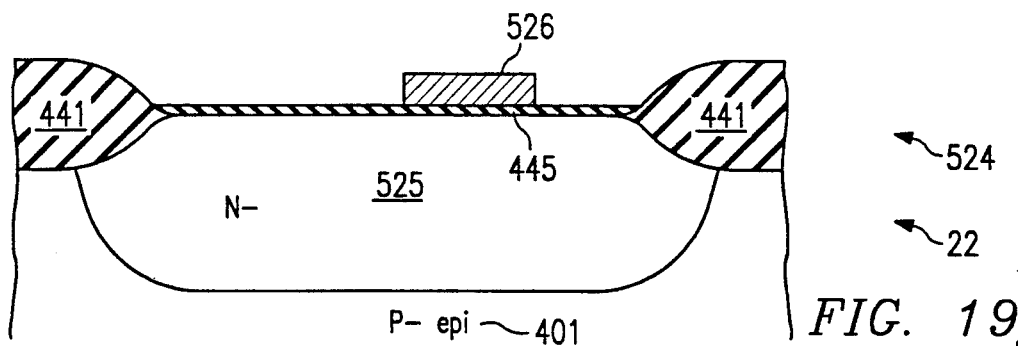
Figure 19G:
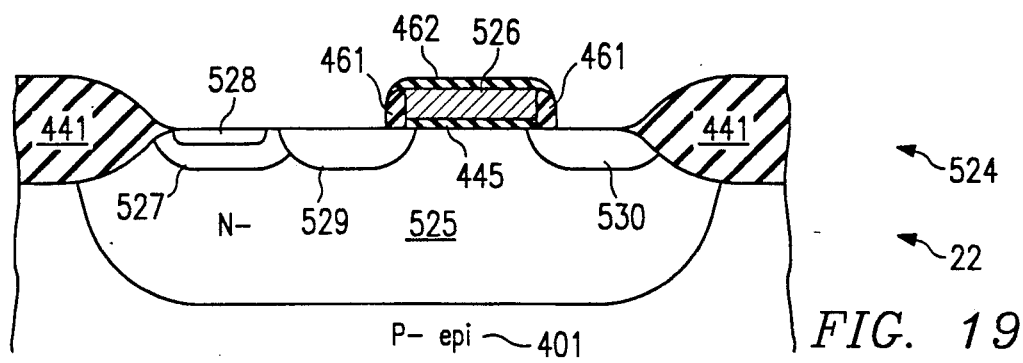

In FIG. 19f, the second polycrystalline silicon layer is deposited, doped, patterned and etched to produce a conductive gate 526. In FIG. 19g, sidewall oxide regions 461 are added, as is cap oxide layer 462. After the formation of the cap oxide 462, a tank connection region 527 is formed by the implantation of phosphorus during the (n−) low density diffusion implantation step. The same mask is used for an arsenic implant that forms (n+) region 528. Source/drain regions 529 and 530 are formed during the (p+) source/drain implantation step and are self-aligned to gate 526.

Figure 19H:
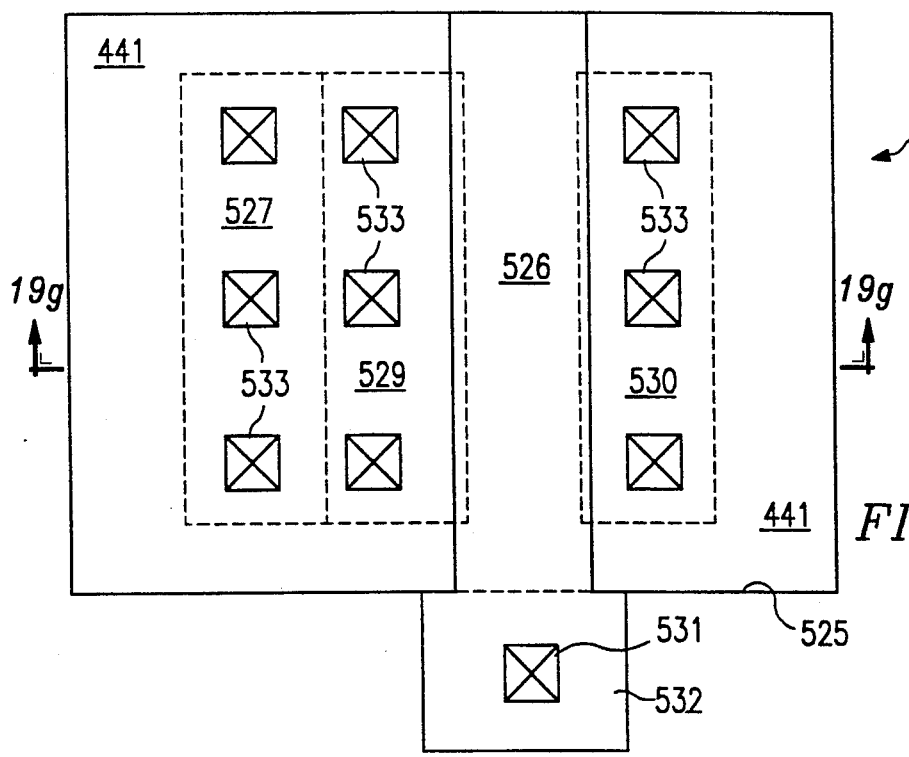
FIG. 19h is a schematic plan view of the transistor shown in FIG. 19g, FIG. 19g being taken substantially along line 19g—19g of FIG. 19h.

In FIG. 19h, a schematic plan view of the device 524 is shown. While the schematic representation of device 524 looks similar to the representations showing in FIGS. 17h and 18h, there are dimensional differences due to the fact that this transistor 524 is meant to handle a $V_{dd}$ of 18 volts across its channel. The n-tank boundary 525 encloses an area larger than the tank boundary shown in FIGS. 17h and 18h, and is deeper. The overhang of moat oxide 441 is wider and the gate 526 is also wider. The gate 526 extends to a pad 531, which is connected to a first metal conductor by an appropriate contact 532. As before, the source/drain region 529 is defined by the isolating LOCOS oxide layer 441 on its top and bottom sides, by photoresist on its left side, and by the floating gate 526 and its accompanying sidewall oxide 461 (see FIG. 19g) on its right side. The source/drain region 530 is self-aligned by the edge of the isolating oxide 441 on three of its sides and by the sidewall-oxide gate 526 on its left side. Back gate connection region 527 is defined on three sides by the oxide 441 and by patterned photoresist on its right side. Appropriate contacts 533 are made between respective metal one conductors (not shown) and the regions 527, 529 and 530.

Turning next to FIGS. 20b-20h, successive stages in the fabrication of a back-gated 18 volt NMOS field effect transistor 534 are shown. Field effect transistor 534 is similar to the n-channel FET 405 illustrated in FIGS. 16a-16g. This 18 volt transistor is useful for the gating of high voltages to the array of EEPROM cells such as may be composed of cells 406 (see FIG. 16g).

Figure 20B:
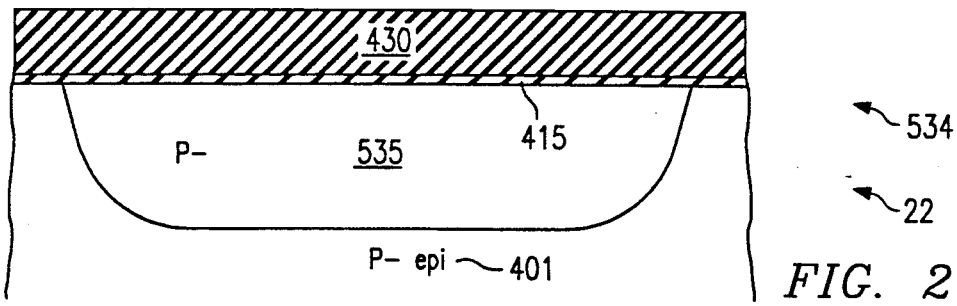
FIGS. 20b-20g are highly magnified schematic sectional views of successive stages in the fabrication of a high-voltage, back-gated n-channel field effect transistor according to the integrated process described herein.
Figure 20C:
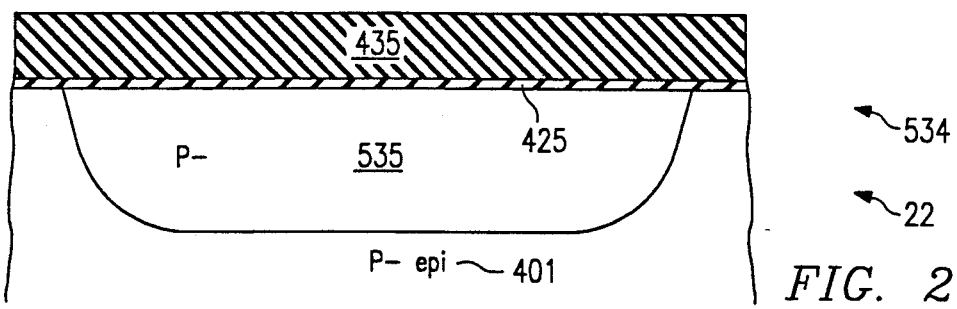
Figure 20D:
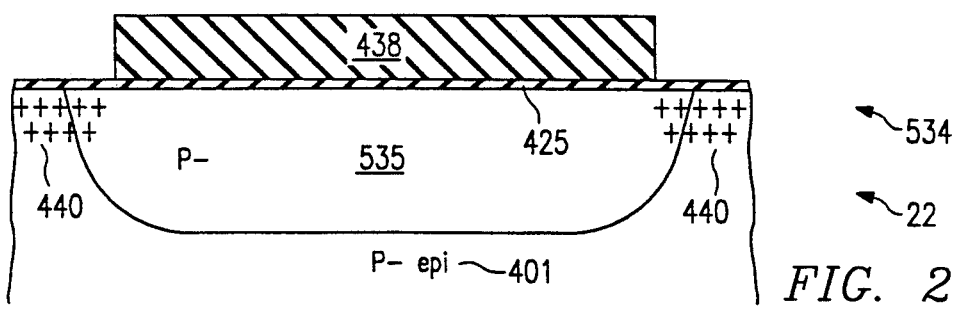
Figure 20E:
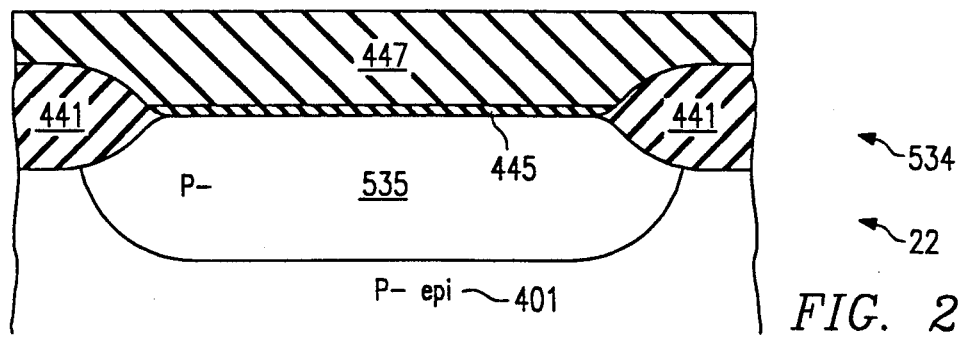

There is no FIG. 20a in this sequence, because no tank has yet been formed in the device area 534 at the time that FIG. 16a represents. In FIG. 20b, a high-voltage p-tank 535 has been formed. An oxide layer 415 and a photoresist layer 430 mask off the tank 535 at this time in order to perform the implantation of low-voltage p-tanks elsewhere on the chip 22. In FIG. 20c, the high-voltage p-tank 535 remains masked off by the oxide layer 425 and another photoresist layer 435 so that a deep (p+) back gate region 437 can be implanted for the vertical DMOS transistor 410 (see FIG. 16c). In FIG. 20d, the patterned and etched nitride/oxide layer 438 is used by itself to define the limits of (p+) channel stop regions 440, represented in FIG. 20d by pluses, but not represented elsewhere in this drawing sequence. Isolating oxide regions 441 are grown in FIG. 20e on those areas of the epitaxial layer surface that are left uncovered by the nitride/oxide layer 438 (see FIG. 20d). After the stripping of the nitride/oxide layer 438, a high-voltage $V_t$ adjust implant is performed on the tank 535, followed by the growth of a 500 Angstrom high-voltage gate oxide layer 445. The photoresist layer 447 thereafter applied masks off the entire chip surface with the exception of a tunnel diode implantation region 448 (see FIG. 16e).

Figure 20F:
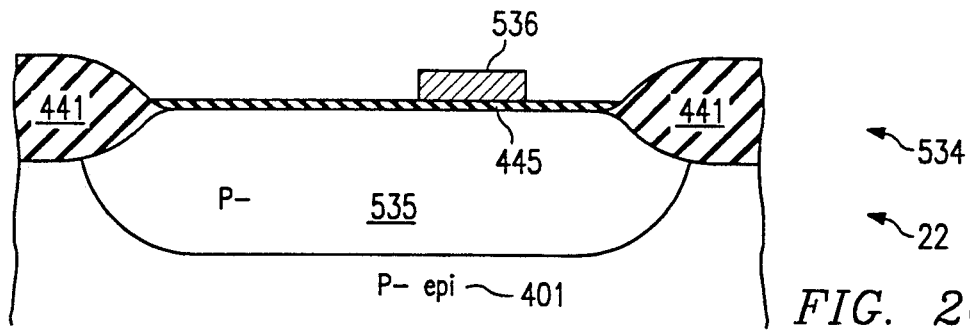
Figure 20G:
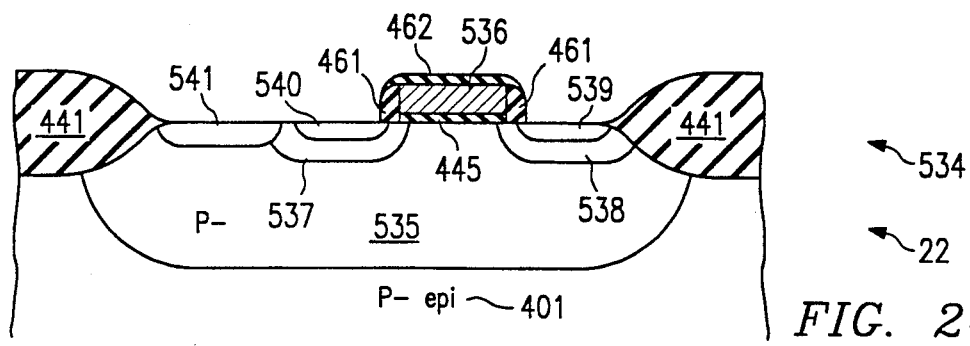

The second-level poly layer is deposited, doped, patterned and etched to create a conductive gate 536 in FIG. 20f. In FIG. 20g, sidewall oxide regions 46 and a cap oxide layer 462 are added to the gate 536. Then, a relatively light concentration of phosphorus is implanted to form (n−) regions 537 and 538 which laterally diffuse underneath the gate oxide 536 upon the subsequent application of an anneal. An arsenic implant is used to create (n+) regions 539 and 540, using the same mask as was used for (n−) implants 537 and 538. Finally, during the implantation of the (p+) sources and drains, a p-tank contact region 541 is implanted, as partially defined using photoresist and as partially self-aligned to the edge of the isolating oxide 441.

Figure 20H:
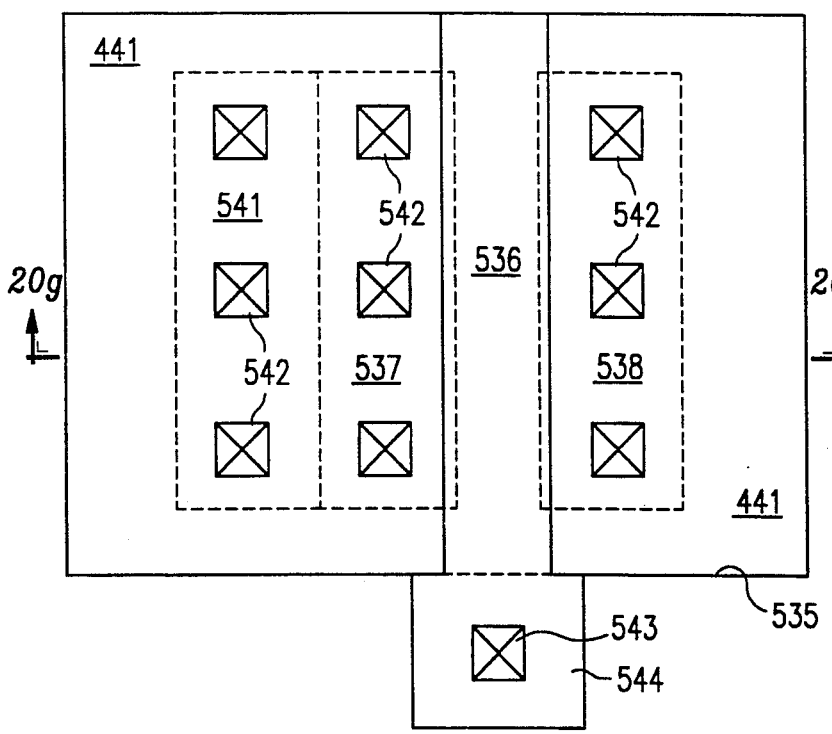
FIG. 20h is a schematic plan view of the transistor shown in FIG. 20g, FIG. 20g being taken substantially along line 20g—20g of FIG. 20h.

In the plan view schematically shown in FIG. 20h, the lateral limits of the p-tank 535 are indicated by a solid rectangle. The field oxide 441 provides a border that is relatively wider than the lower voltage devices. Likewise, the poly gate 536 is wider in order to define a channel wide enough to handle a large voltage and to prevent punch-through between the source/drain regions 537 and 538. The source/drain region 538 is defined on three sides by the moat oxide 441 and on a remaining side by gate 536. The source/drain region 537 is defined on its top and bottom sides by the moat oxide 441, on its right side by the gate 536 and its left side by patterned photoresist. The back gate connection region 541 is defined on three sides by the isolating oxide 441 and on its right side by patterned photoresist. Suitable contacts 542 are made to corresponding metal 1 lines (not shown) from the back gate connection region 541, the source/drain regions 537 and the source/drain region 538. The gate 536 is extended to a pad 543, to which a metal contact 544 is made.

LATERAL DMOS FIELD EFFECT TRANSISTOR

Figure 21A:
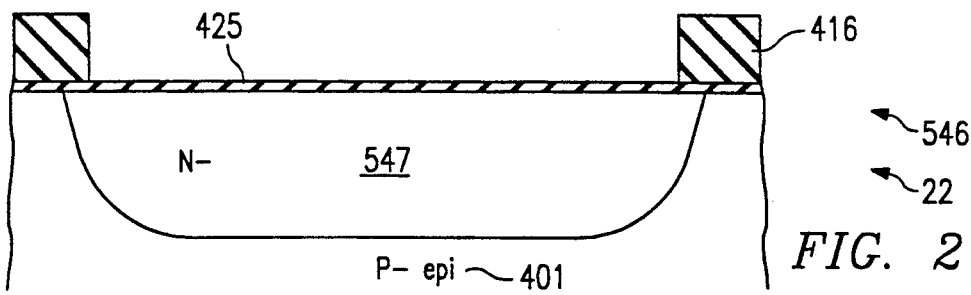
FIGS. 21a-21g are highly magnified schematic sectional views of successive stages in the fabrication of a lateral diffused MOS (LDMOS) n-channel transistor fabricated according to the integrated process described herein.
Figure 21B:
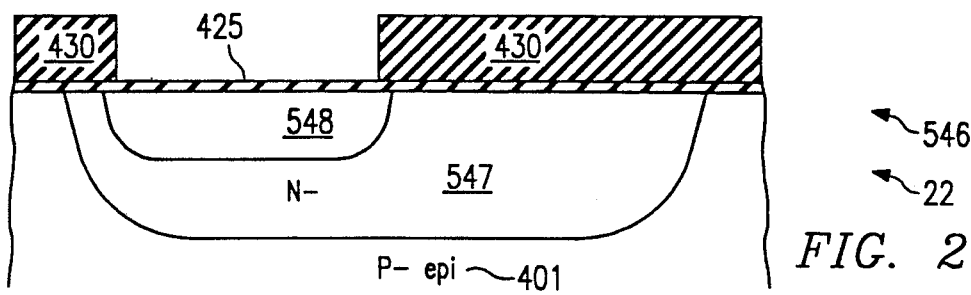
Figure 21C:
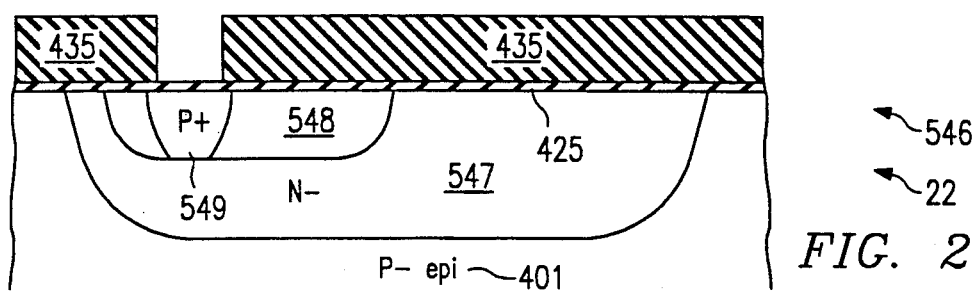
Figure 21D:
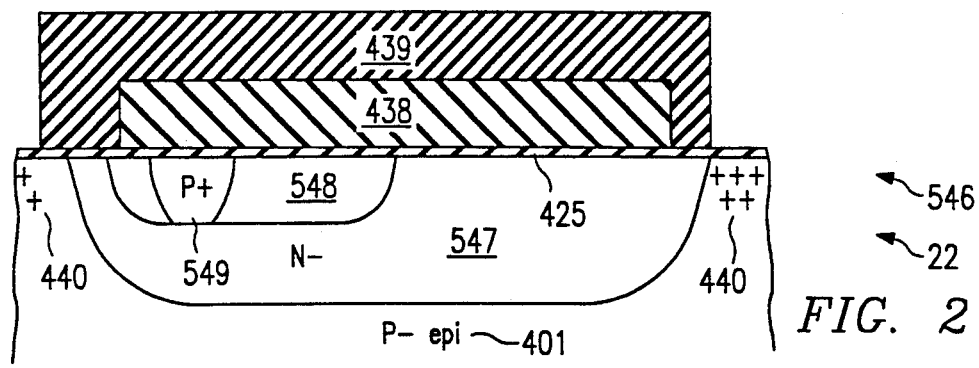
Figure 21E:
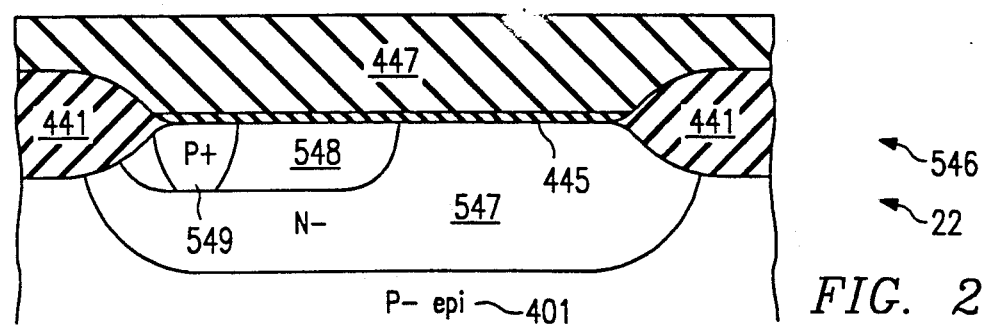

Turning next to FIGS. 21a-21g, successive steps in the fabrication of a lateral diffused source/drain n-channel "metal" oxide semiconductor (LDMOS) field effect transistor 546 are illustrated, as these stages are integrated into the process illustrated herein. The lateral DMOS transistor 546 is first provided a high-voltage n-tank 547 which is formed at the same time as the high-voltage n-tank 419 in FIG. 16a. The n-tank 547 is masked by an oxide layer 425, and the peripheral portions of device area 546 are covered by a nitride layer 416, during the time that the low-voltage n-tanks are implanted (see FIG. 16a). Photoresist (not shown) covers the central tank area 547 at this time. Proceeding to FIG. 21b, a layer 430 of photoresist is patterned and a low-voltage p-tank 548 is implanted at the time that the other low-voltage p-tanks 431-434 (see FIG. 16b) are implanted. Then, the layer 430 of photoresist is stripped and a deep (p+) diffusion 549 is defined by a patterned layer of photoresist 435 and implanted as shown in FIG. 21c. In FIG. 21d, a layer 438 of nitride and oxide in conjunction with a layer 439 of photoresist is used to provide the mask for the channel stops 440. The photoresist layer 439 is then stripped and localized oxide 441 is grown in those areas of the device area 546 not covered by patterned and etched nitride/oxide mask 438 (see FIGS. 21d and 21e). The nitride/oxide layer 438 and the oxide layer 415 are next removed. A high-voltage $V_t$ adjust implant is next implanted into the tank 547. Then, a high-voltage gate oxide layer 445 is grown to a depth of approximately 500 Angstroms. A photoresist layer (not shown) is used to mask off the device 546 at the time that the low-voltage $V_t$ adjusts are implanted, and when the low-voltage gate oxide 446 (see FIG. 16e) is grown. A photoresist layer 447 is patterned to define the tunnel diode 448 and is left undisturbed over the device area 546 at the time this occurs.

Figure 21F:
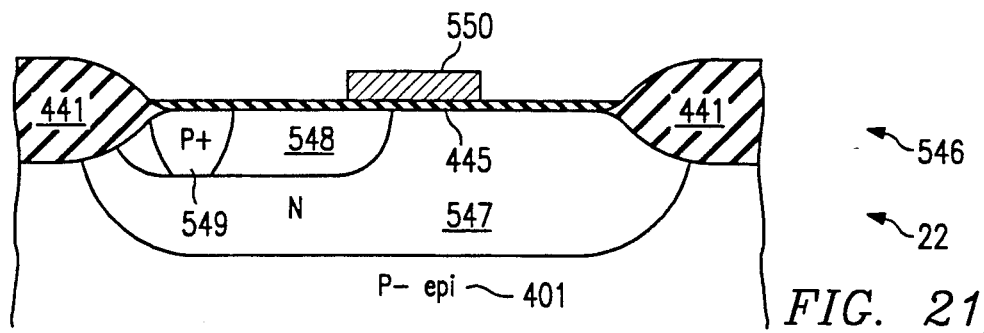
Figure 21G:
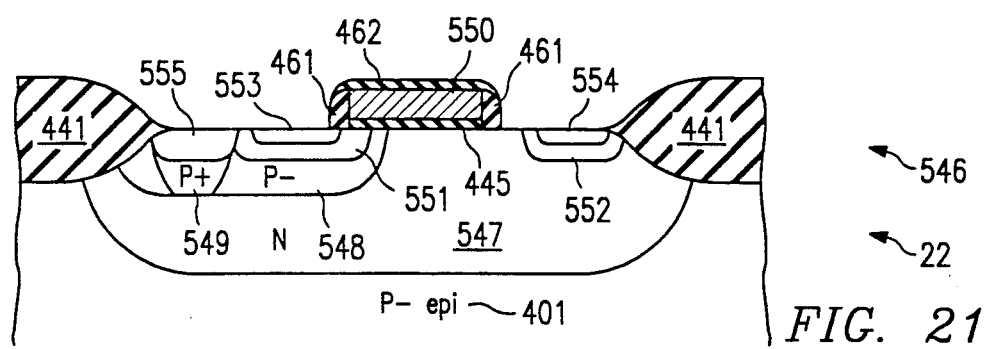

After the tunnel diode implant step, the stage of the process represented by FIG. 21f is reached. FIG. 21f shows how the poly 2 layer is deposited, doped, patterned and etched to produce a gate 550 on the surface of gate oxide layer 445. In FIG. 21g, sidewall oxide regions 461 are formed on the lateral margins of, and a cap oxide 462 is grown on the exposed top of polysilicon gate 550. A layer of photoresist (not shown) is used to define those edges of source/drain implantation regions 551 and 552 that are not defined by the gate 550 or the edges of LOCOS oxide region 441. A lightly doped diffusion using phosphorus is then implanted to produce the (n−) regions 551 and 552. These diffuse laterally and downwardly as shown from the original implant limits during a subsequent anneal. A subsequent arsenic implant is used to create regions 553 and 554 using the same source/drain implant mask.

During the P-type source/drain implant stage, a layer of photoresist (not shown) is patterned to define one edge of the implanted (p+) back gate connection region 555.

Figure 21H:
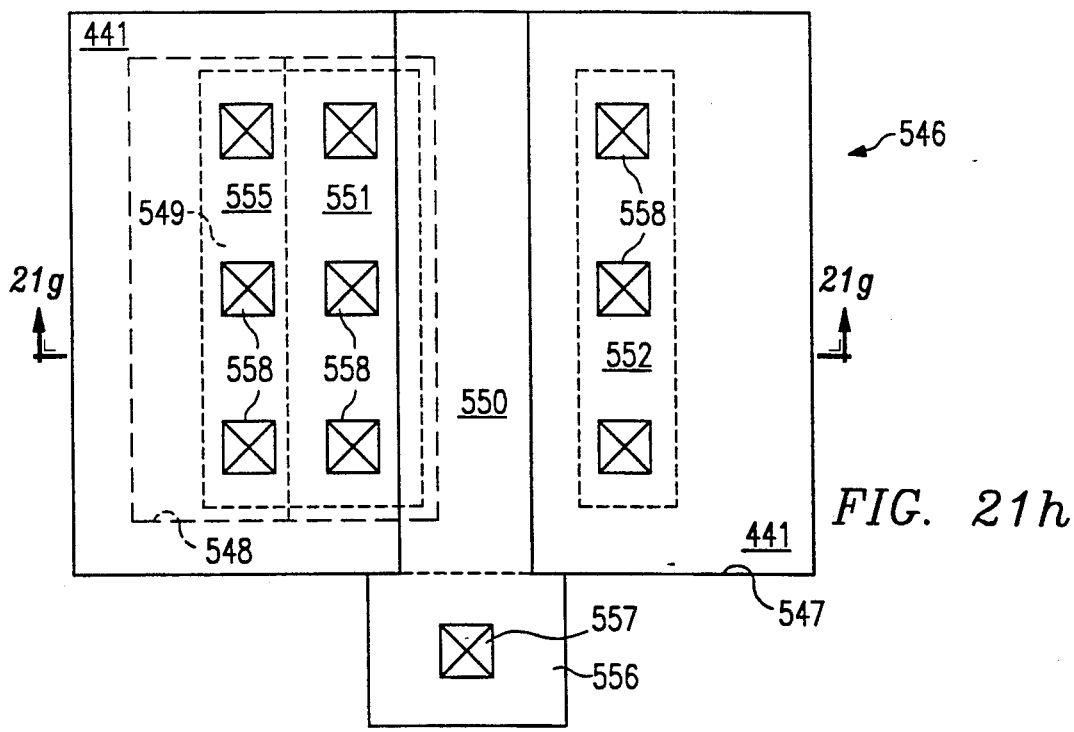
FIG. 21h is a schematic plan view of the LDMOS transistor shown in FIG. 21g, FIG. 21g being taken substantially along line 21g—21g of FIG. 21h.

A schematic plan view of the LDMOS transistor 546 is shown in FIG. 21h. The implantation limits of the n-tank 547 are shown by the solid line rectangle. The p-tank 548 implantation mask limit is shown by a dotted line. This implantation mask 548 extends under the edge of the LOCOS oxide 441 that provides a moat for the active device area. The deep (p+) diffusion region 549 occupies a left portion of the implantation area for the p-tank 548. The source/drain region 551 is defined on its left side by a patterned layer of photoresist (not shown), on its top and bottom sides by the moat oxide 441 and on its right side by the poly 2 gate 550, as accompanied by the sidewall oxide regions 461 (not shown in FIG. 21h). The source/drain region 552 is defined by the moat oxide 441 on three sides, and on its left side by a patterned layer of photoresist. The poly gate 550 is extended to a pad 556, and a contact 557 is made to the pad 556 from a first metal level (not shown). Appropriate contacts 558 are made from regions 555, 551 and 552 to respective first level metal lines (not shown).

VERTICAL NPN BIPOLAR TRANSISTOR

Figure 22A:
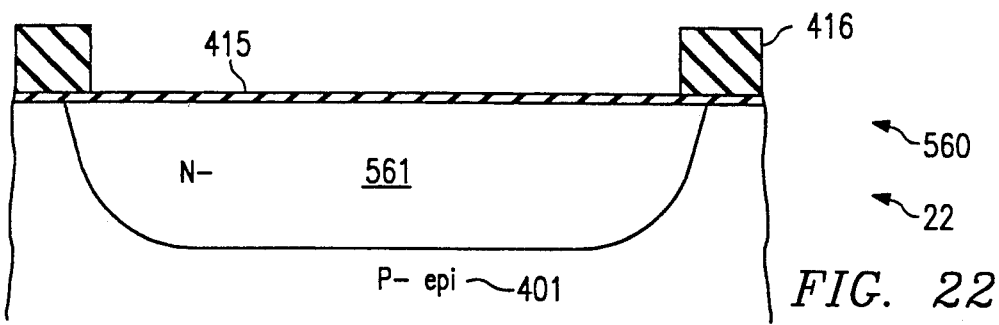
FIGS. 22a-22b, 22d and 22f-22g are highly magnified schematic sectional views of successive stages in the fabrication of a vertical NPN bipolar transistor according to the integrated process described herein.
Figure 22B:
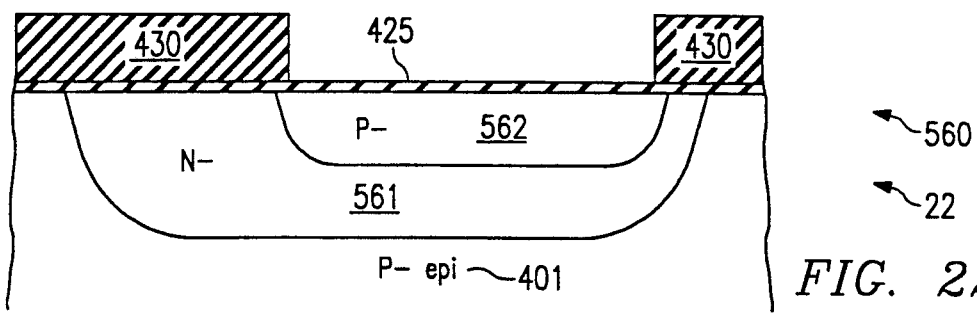

Turning next to FIGS. 22a–22g, successive highly magnified sectional views are shown of fabrication stages of a vertical NPN bipolar transistor 560 that is fabricated during the integrated process described herein. In FIG. 22a, an (n−) tank 561 is shown that is formed at the time of the other high-voltage n-tanks (see FIG. 16a). At the beginning of the time represented by FIG. 22a, an oxide layer 421 and a photoresist layer (not shown) mask the n-tank region 561. Nitride layer 416 has been patterned and etched to allow the implant of tank 561. The nitride layer 416 is at this point patterned and etched for a low-voltage n-tank implantation step (see FIG. 16a); a photoresist layer (not shown) masks off device area 560 at this time. Turning to FIG. 22b, a photoresist layer 430 is deposited and patterned for the implantation of a (p−) tank 562 which is performed simultaneously with the implantation of the low-voltage p-tanks 431, 432, 433 and 434. The high-voltage n-tank 561 forms the collector of the NPN transistor 560, while p-tank 562 forms its base.

Figure 22D:
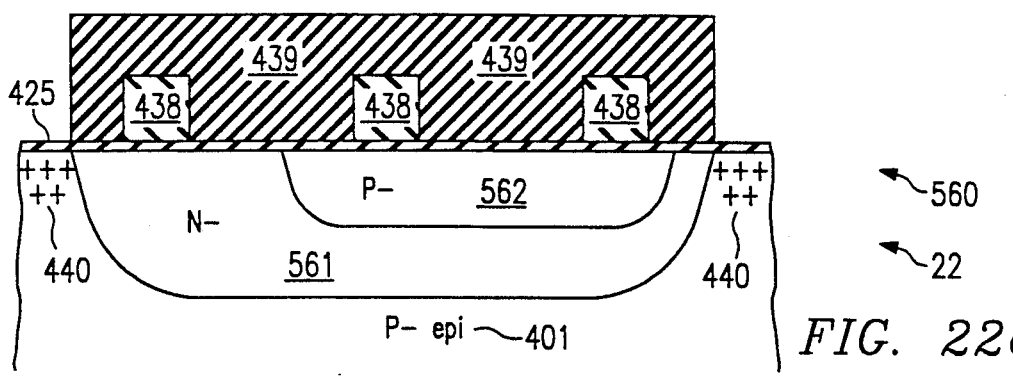
Figure 22F:
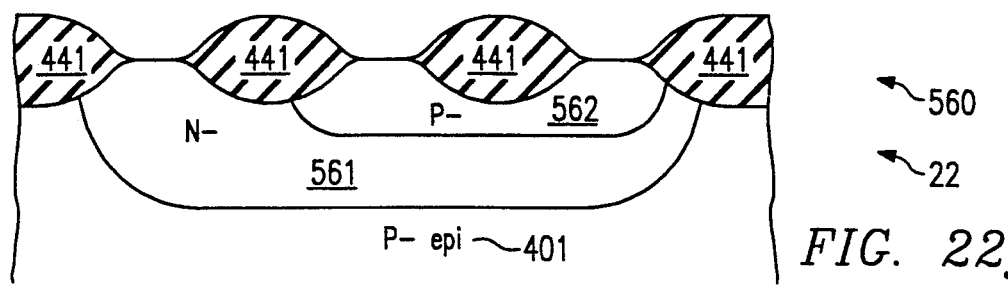

Next in this sequence is FIG. 22d, there being no FIG. 22c because nothing of interest happens to this device 560 during the time of the integrated fabrication process that FIG. 16c represents. A nitride/oxide layer 438 and a photoresist layer 439 are used to mask off the n-tank 561 so that a channel stop implantation can be implanted, forming channel stops 440 as indicated by the pluses in FIG. 22d but not elsewhere in this sequence of FIGURES. The next fabrication step affecting transistor 560 is done at the time represented by FIG. 16f, and is shown in FIG. 22f. At this time, localized oxidation is used to form LOCOS oxide regions 441 on those surfaces of tanks 561 and 562 left exposed by the nitride/oxide mask 438.

Figure 22G:
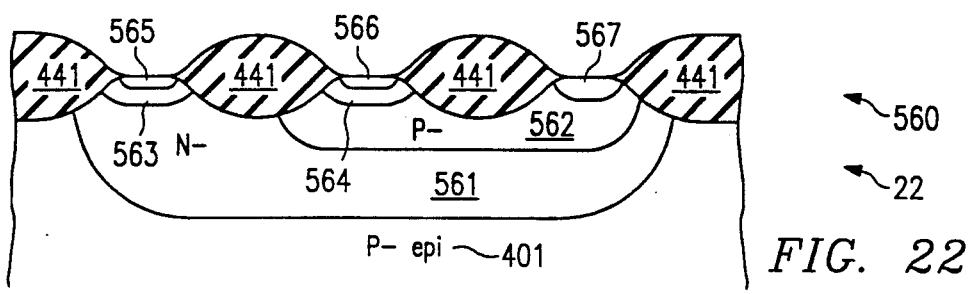

Oxide regions 441 are shown used in FIG. 22g for the self-alignment of base, emitter and collector contact regions. During the LDD (n−) source/drain implantation occurring elsewhere on chip 22, collector contact region 563 and emitter 564 are implanted using phosphorus. This is immediately followed by an implant of arsenic to create (n+) regions 565 and 566. Next, during the P-type source/drain implantation stage occurring elsewhere in chip 22, (p+) region 567 is implanted using boron.

Figure 22H:
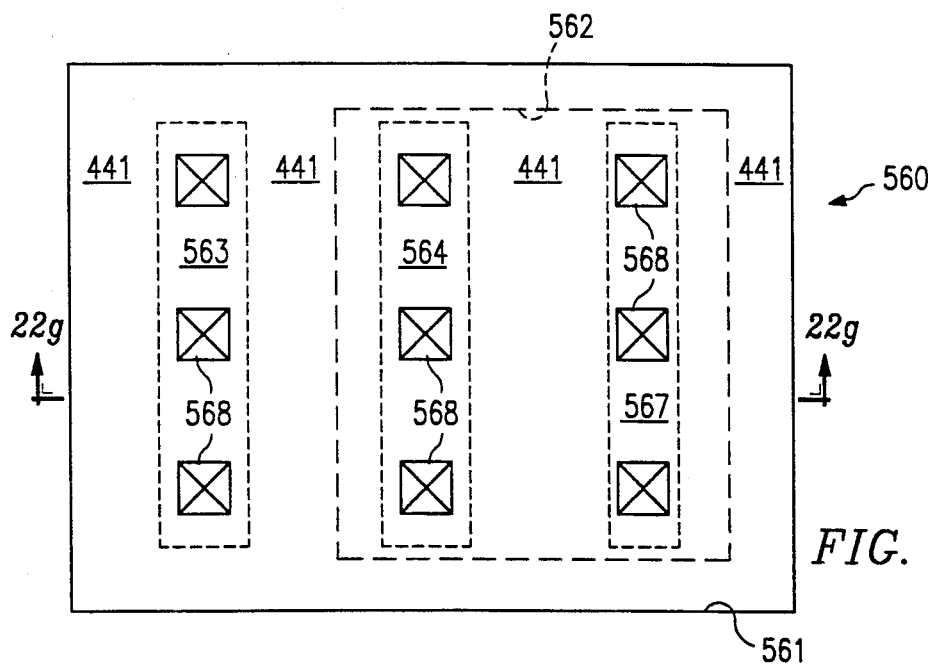
FIG. 22h is a schematic plan view of the vertical NPN bipolar transistor shown in FIG. 22g, FIG. 22g being taken substantially along line 22g—22g of FIG. 22h.

A schematic plan view of the vertical NPN bipolar transistor 560 is shown in FIG. 22h. The high-voltage n-tank mask limit is shown by a dark rectangular line 561, and the corresponding limit of the p-tank 562 is shown by a dashed line. Collector contact region 563, emitter 564 and base contact region 567 are defined by the lateral edges of LOCOS oxide 441. Appropriate contacts 568 are made respectively to the collector contact region 563, the emitter 564 and the base 567 to connect to respective metal one conductors (not shown).

HIGH-VOLTAGE FET WITH REDUCED GATE OXIDE STRESS

FIGS. 23a and 23c–23g are highly magnified schematic sectional views of a high-voltage p-channel field effect transistor fabricated according to the integrated process of the invention. This transistor, indicated generally at 570, has reduced gate oxide stress, as will be described in more detail below. There is no FIG. 23b, as nothing of interest happens in this area of the chip 22 during the corresponding stage of the fabrication process as shown by FIG. 16b.

Figure 23A:
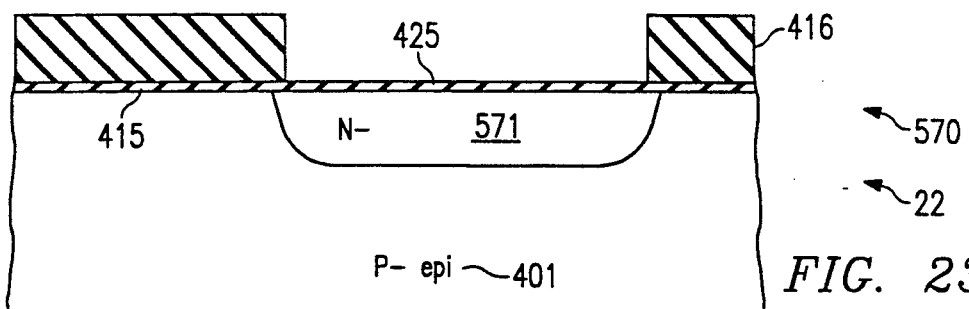
FIGS. 23a and 23c-g are highly magnified schematic sectional views of successive stages in the fabrication of a back-gated extended-drain n-channel field effect transistor with reduced gate oxide stress.
Figure 23C:
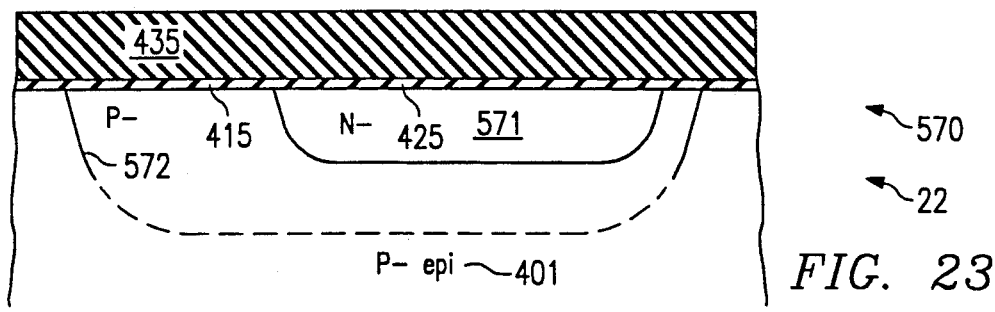

As shown in FIG. 23a, a low-voltage n-tank 571 is made within device area 570 at the same time as, and with the same dopant, as low-voltage n-tanks 422, 423 and 424 as shown in FIG. 16a. By the time the stage represented by FIG. 23c is reached, a high-voltage p-tank 572 has been implanted into device area 570 to surround the n-tank. Since the p-tank 572 is of the same conductivity type as the (p−) epitaxial layer 462 in which it is formed, the boundary of the p-tank 572 deep within the layer 401 is somewhat indeterminate, and is shown by a dotted line. This is also the case because, as in all of the tanks fabricated in the integrated process, the dopant concentration decreases as one moves away from the surface of the epitaxial layer. The depth of the p-tank 572 is somewhat greater than the depth of the n-tank 571.

FIG. 23c shows n-tank 571 and p-tank 572 covered with respective oxide layers 415 and 425, and a layer 435 of photoresist. The layer 435 of photoresist is patterned to define deep (p+) diffusions elsewhere on the chip 22.

Figure 23D:
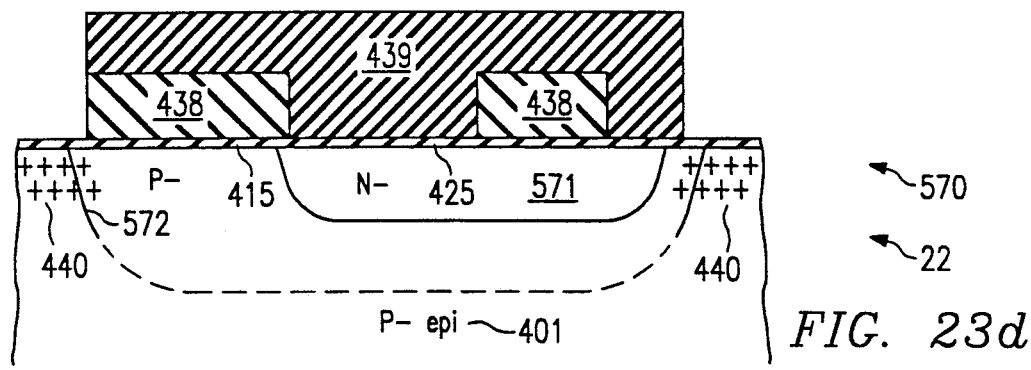
Figure 23E:
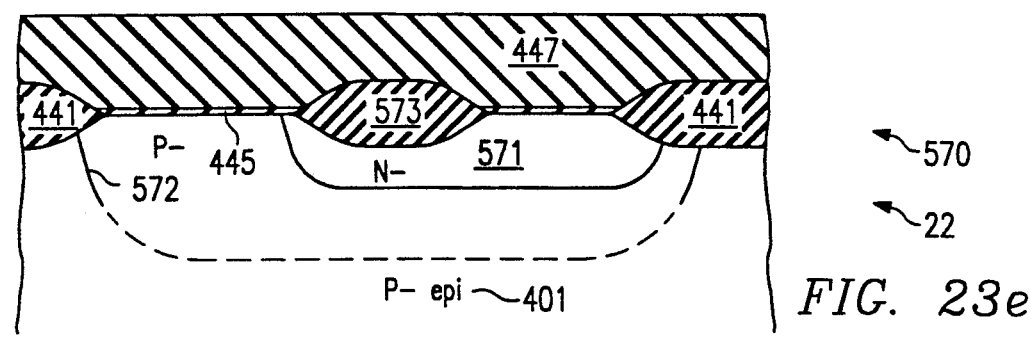

Referring next to FIG. 23d, a patterned and etched nitride/oxide layer 438 in conjunction with a patterned layer 439 of photoresist is used to define the implantation of (p) channel stop areas 440, represented by pluses within FIG. 23d, but not elsewhere in this sequence of FIGURES. The photoresist layer 439 is then stripped and LOCOS oxide regions 441 and 573 (FIG. 23e) are grown on those areas of the device area 570 which are left exposed by the nitride/oxide layer 438. Region 573 is preferably positioned toward the left end of, but within, nitride/oxide layer 438 and oxide layers 415 and 425 are next removed. A high-voltage gate oxide layer 445 is grown to a depth of approximately 500 Angstroms on those areas of the tanks 571 and 572 not covered by the localized oxide regions 441 and 573. A high-voltage n tank $V_t$ adjust implant is performed following the deposition of the high-voltage gate oxide layer 445.

Figure 23F:
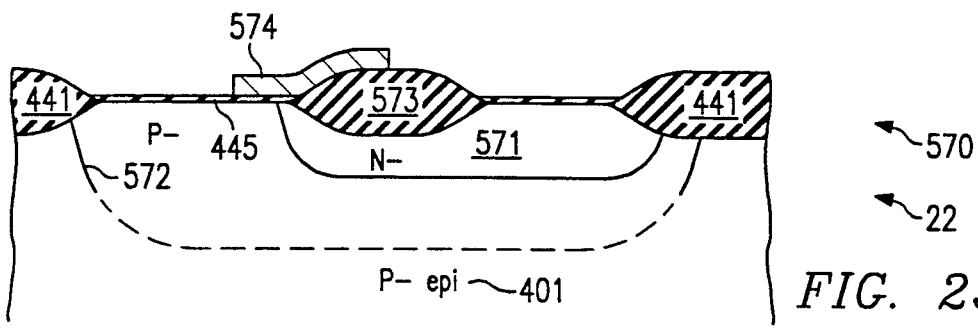

Turning next to FIG. 23f, the poly 2 layer is deposited, doped, patterned and etched to leave a conductive gate 574. The gate 574 is disposed partially on the moat oxide region 573 and partially on gate oxide 445 to the left of oxide region 573.

Figure 23G:
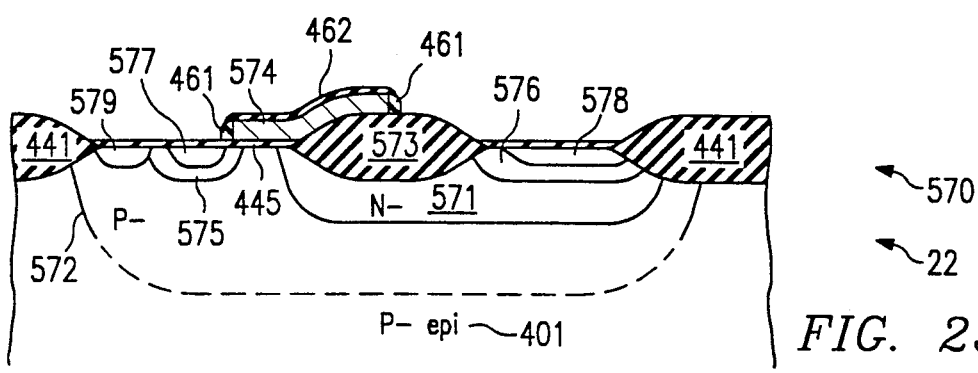

In FIG. 23g, sidewall oxide regions 461 are formed on the lateral sides of the gate 573, and a cap oxide 462 is formed on the upper surface thereof. A low density diffusion (n−) implant is next patterned and phosphorus is implanted and eventually diffused to create source/drain regions 575 and 576. Using the same patterned photoresist mask, regions 577 and 578 are created with an arsenic implant. A (p) type source/drain implantation is used with a patterned layer of photoresist (not shown) to create the (p+) back gate connection region 579.

Figure 23H:
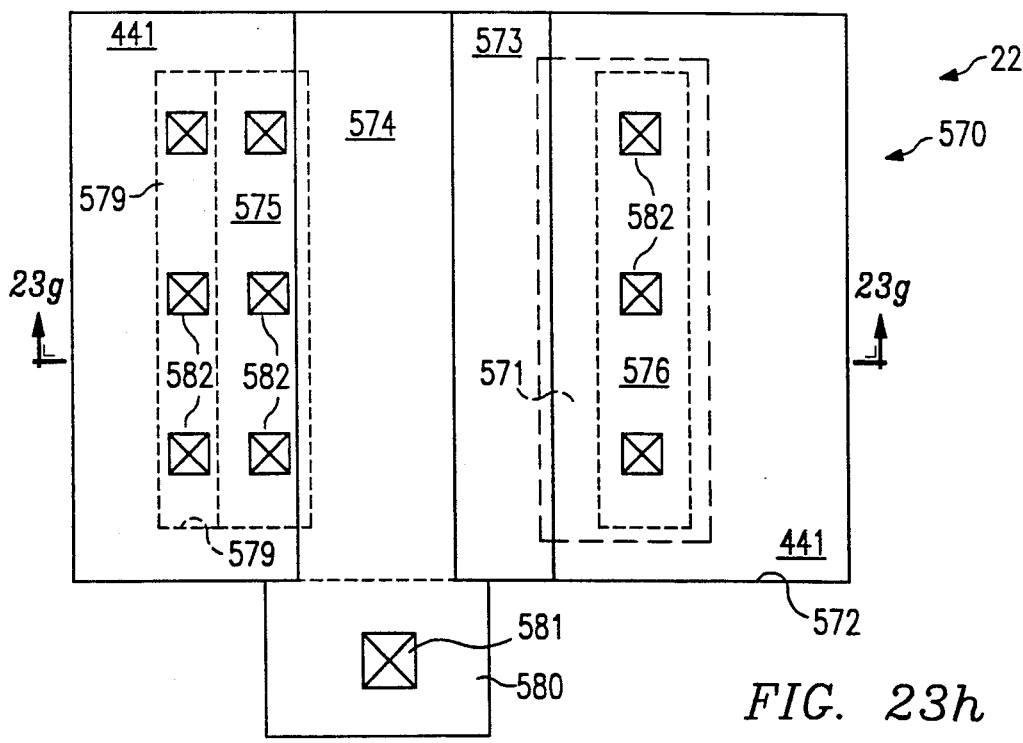
FIG. 23h is a schematic plan view of the transistor shown in FIG. 23g, FIG. 23g being taken substantially along line 23g—23g of FIG. 23h.

FIG. 23h is a schematic plan view of the reduced gate oxide stress p-channel field effect transistor 570. The top, bottom and left sides of the back gate connection region 579 are self-aligned to the lateral edge of the moat oxide 441. The right side of the back gate connection region 579 is defined by a layer of patterned photoresist (not shown), and another layer of patterned photoresist is used to define the left edge of the source/drain region 575. The top and bottom edges of the source/drain region 575 are self-aligned to respective edges of the moat oxide 441, while the right edge thereof is self-aligned to the sidewall oxide 461 (see FIG. 23g) on the nearest side of the gate 573. Source/drain region 576 is completely self-aligned by the lateral edges of the moat oxide regions 441 and 573.

With reference to FIGS. 23g and 23h, the LOCOS oxide region 573 is situated under the drain end of the conductive gate 574 in order to avoid problems with gate oxide breakdown. A large voltage will appear from gate 574 to the (n+) drain region 578, large enough to rupture most normal thin oxides. The inclusion of the oxide region 573 eliminates this problem. Gate 574 is expanded to include contact pad 580, to which a contact 581 is made. Contact 582 are made to regions 579, 575 and 576.

Figure 24G:
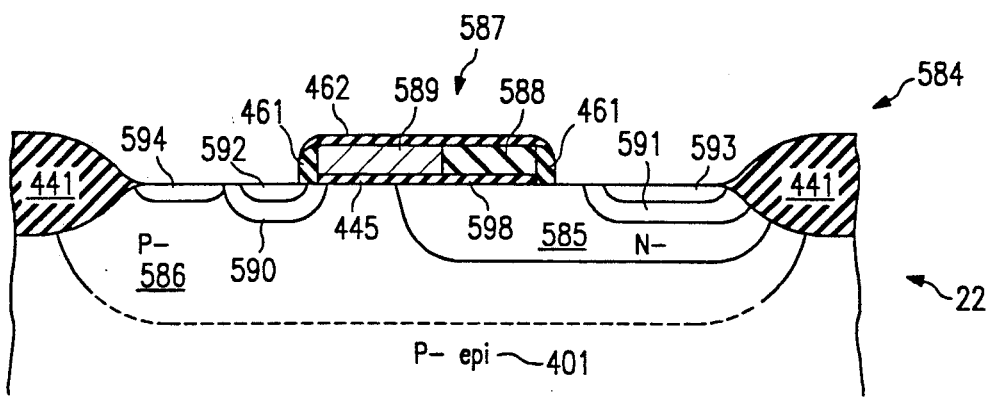
FIG. 24g is a highly magnified schematic sectional view of a back-gated n-channel extended-drain field effect transistor with reduced gate oxide stress fabricated according to the integrated process described herein.
Figure 24H:
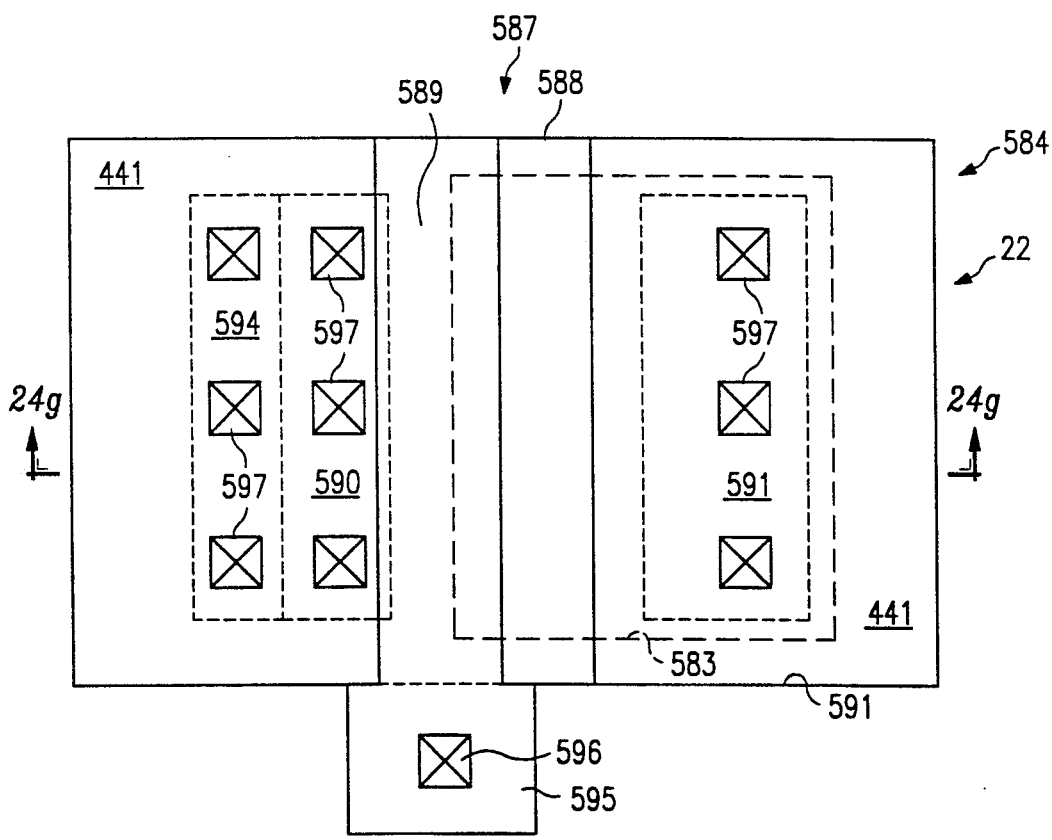
FIG. 24h is a schematic plan view of the field effect transistor shown in FIG. 24g, FIG. 24g being taken substantially along line 24g—24g of FIG. 24h.

Referring next to FIGS. 24g and 24h, an alternative embodiment of a high-voltage power field effect transistor having reduced gate insulator stress is illustrated. The process steps corresponding to FIGS. 16a–16f have been omitted as being straight forward in view of the steps performed in FIGS. 23a and 23c–g.

In FIG. 24g, a highly magnified sectional view of a largely completed field effect transistor 584 is shown. Like transistor 570 (see FIG. 23g), a low-voltage n-tank 585 is implanted, followed by a high-voltage p-tank 586. Localized oxide 441 defines a moat for the active device area 584.

After the growth of a high-voltage gate oxide 445 and a $V_t$ adjust implant, the poly 2 layer that will form the gate indicated generally at 587 is deposited. However, instead of a blanket doping of the gate 587, a section 588 thereof is covered with a mask, such as patterned photoresist, such that section 588 of the gate 587 will not receive any phosphorus dopant. The remaining section 589 of the gate 587 does receive phosphorus during the POCl$_3$ doping step. The gate 587 is then defined in an etch step.

Another approach to the formation of the gate 587 is to mask it off completely during the POCl$_3$ poly doping step, and dope the gate 587 instead during the (n+) source/drain implantation stage. Under this alternative embodiment, the (n+) source/drain mask is extended to cover portion 588 of the poly gate 587, while leaving portion 589 exposed to the phosphorus and arsenic dopants. The intrinsic, i.e., undoped portion 588 acts as an insulator.

Either during or after the completion of the gate 587, (n) type source/drain regions 590 and 591 are implanted into the epitaxial layer 401. The mask used to define the step will control the position of the eventual left edge of the source region 590. The drain region 591 can either be self-aligned to the edges of the moat oxide 441 and the sidewall oxide 461, or the drain region 591 can be spaced away from the gate 587 by an appropriate layer of patterned photoresist. FIG. 24g shows the source/drain implantation 591 as spaced away from the gate 587, while the plan view shown in FIG. 24h shows the implantation 591 self-aligned to the gate 587.

The implantations 590 and 591 are performed with phosphorus, whose atoms diffuse by a substantial amount laterally and vertically from their initial sites of implantation under subsequent thermal steps. The phosphorus implantations 590 and 591 are followed by arsenic implantations 592 and 593, creating corresponding (n+) regions. The arsenic ions are not nearly as mobile as the phosphorus ions, yielding a graded into (n+) source and drain regions.

A subsequent mask is used to define the (p+) region 594 used for contacting the p-tank 586 as a back gate connection.

FIG. 24h is a plan view of device 584, FIG. 24g being taken substantially along line 24g—24g of FIG. 24h. The moat oxide 441 is used to define the top, bottom and left sides of the back gate connection region 594, the top and bottom sides of the source region 590, and the top, bottom and right sides of the drain region 591. Unlike the corresponding device 570 shown in FIGS. 23g and 23h, there is no thick oxide underneath the gate 587. The doped portion 589 of the gate 587 is extended to a pad 595, where it is contacted from first metal through an appropriate contact 596. Contacts 597 are provided to connect the terminals of transistor 584 to points external to the device.

Returning momentarily to FIG. 24g, since the intrinsic poly gate region 588 acts as an insulator, its potential will change as the gate/drain potential changes. The region 598 of the gate oxide layer 445 can have a high electric field that would normally break down the gate oxide in a normal (doped gate) transistor. However, since the undoped gate portion 588 is only capacitively coupled to the drain 591, and has a high-resistance contact to doped gate portion 589, the voltage experienced at portion 598 can now be lower than the oxide breakdown voltage. The provision of an undoped gate portion 588 in the place of a field oxide region 573 (see FIG. 23g) allows the area used by transistor 584 to be smaller, and thus increases power efficiency per area of the chip 22. Further, since a thin oxide 445 is formed underneath the entirety of the gate 587, the gain or transconductance of the transistor 584 is higher. The transistor 584 is especially useful in an automobile microcontroller as a transistor within the voltage regulator 78 or other microcontroller component exposed directly to 12-volt battery voltage, as it is more able to withstand the 60-volt transients which sometimes are experienced in automotive power supplies.

Figure 25G:
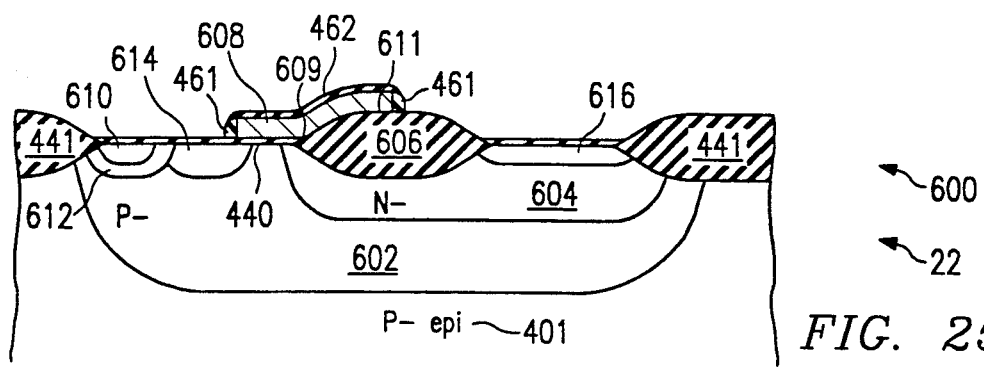
FIG. 25g is a highly magnified schematic sectional view of a back-gated, extended-drain p-channel field effect transistor with reduced gate oxide stress fabricated according to the integrated process described herein.
Figure 25H:
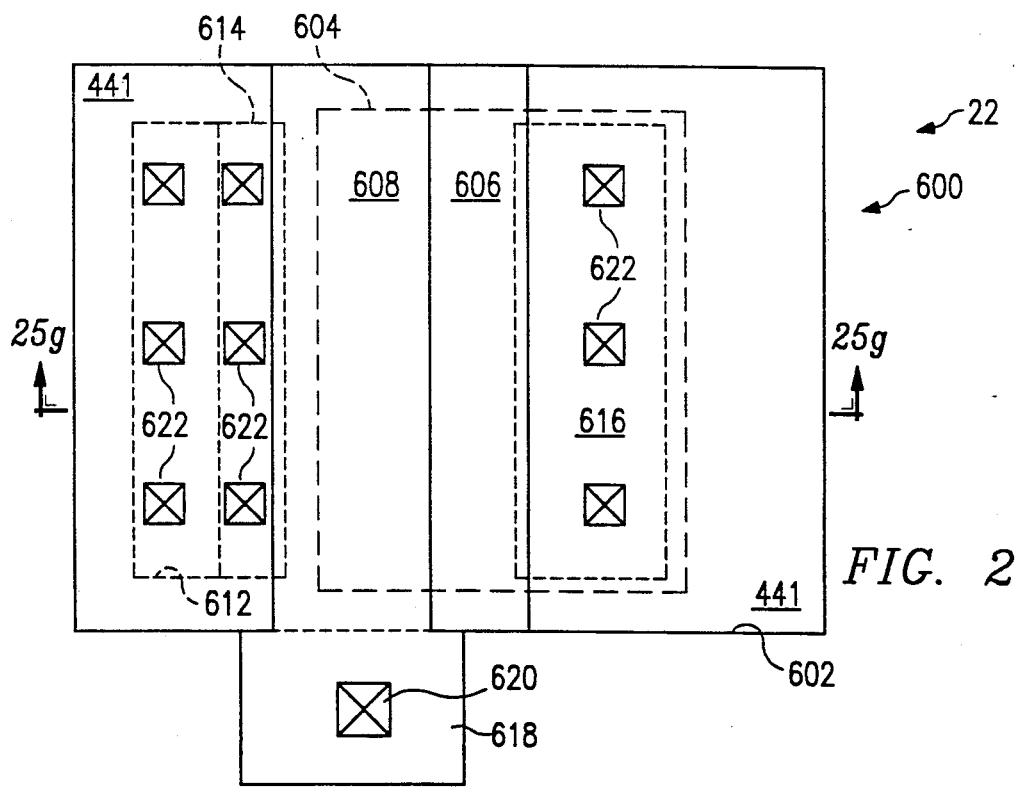
FIG. 25h is a schematic plan view of the field effect transistor shown in FIG. 25g, the section shown in FIG. 25g being taken substantially along line 25g—25g of FIG. 25h.

Referring now to FIGS. 25g and 25h, another insulated field effect transistor indicated generally at 600 is illustrated, transistor 600 being somewhat similar to the one shown in FIGS. 23a and 23c through 23h. The transistor 600 is a p-channel version of the field effect transistor 570. Sectional views corresponding to FIGS. 16a-16f have been omitted as being largely similar to views 23a and 23c—23f. The highly magnified schematic sectional view shown in FIG. 25g corresponds to FIG. 16g, and FIG. 25h is a plan view of the same cell, FIG. 25g being taken substantially along the line 25g—25g of FIG. 25h. Like the cell 570 illustrated in FIGS. 23a and 23c-23h, the field effect transistor 600 has an increased tolerance for 60 volt transients as are commonly experienced in automobile electric systems, as the gate insulator 445 of this cell 600 experiences reduced stress when subjected to the voltages.

During the time that the high-voltage n-tanks are implanted, high-voltage n-tank 602 is implanted in the device area 600. This is followed in due course by the implantation of a low-voltage p-tank 604 to occupy an area of the high-voltage n-tank 602 somewhat offset from its center. The high-voltage n-tank 602 is subjected to a high-voltage $V_t$ adjust implant (not shown) at the same time that this adjust happens to other high-voltage n-tanks on the chip 22.

Appropriate channel stop regions (not shown) are implanted at the periphery of the n-tank 602. The nitride/oxide mask 438 (see, e.g., FIG. 23d) is patterned and etched so as to leave exposed a central area within tanks 602 and 604. When the localized oxidation step subsequently occurs (see FIGS. 16e, 23e), a relatively thick central oxide region 606 will be grown at the same time that the moat oxide 441 is grown, preferably positioned to the right of the (p−) tank 604 boundary.

A high-voltage gate oxide layer 445 is grown on the remaining, exposed silicon surfaces of tanks 602 and 604. Then, a conductive poly 2 gate 608 is deposited, doped, patterned and etched to leave the conductive gate structure 608 as shown. Conductive gate 608 crosses a lateral margin 609 of the oxide island 606, and extends for a substantial distance on a top face 611 thereof. Another substantial portion of the conductive gate 608 extends across tank 602 beyond the leftmost lateral margin of the (p−) tank 604.

Sidewall oxide 461 and cap oxide 462 are added as previously described for other devices manufactured during the integrated process. During the implantation of the (n+) source/drain regions, a layer of photoresist (not shown) is used to define the right implant limit of a low density (n−) diffusion 612, preferably implanted using phosphorus. This is followed with an (n+) implant 610 of arsenic. Regions 610 and 612 constitute a back gate connection to the (n−) tank 602. In the (p+) source/drain implantation step, a layer of photoresist (not shown) is used to define the leftmost lateral margin of the source region 614. The remaining lateral edges of source region 614 and a drain region 616 are self-aligned to either the leftmost lateral margin of the conductive gate 608 (as augmented by the sidewall oxide 461), or by corresponding lateral margins of the oxide island 606 and the moat oxide 441.

FIG. 25h is a schematic plan view of the field effect transistor 600. The conductive gate 618 extends upwardly on to the top surface of the oxide or stripe 606 (appearing as an island in the section shown substantially along line 25g—25g). The top, bottom and left sides of the (n+) back gate connection 612 are defined by the moat oxide 441. The right margin is defined by a layer of patterned photoresist (not shown). The top and bottom margins of the (p+) source region 614 are defined by the moat oxide 441, its left boundary being defined by the patterned (p+) source/drain diffusion layer of photoresist (not shown), and its rightmost boundary self-aligned to the left margin of the conductive gate 618. The (p+) drain region 616 is self-aligned on all of its margins to the moat oxide 441 and its extension 606. The conductive gate 608 is extended beyond the limits of the n-tank 602 to a pad 618, and an appropriate contact 620 is made to the gate 608 from metal 1 (not shown). Also, contacts 622 are made from various metal 1 conductors to the implanted regions 612, 614 and 616.

While central oxide stripes and non-doped portions of control gates have been illustrated in conjunction with a drain-extended field effect transistor, these techniques for reducing gate oxide stress can be used for any field effect transistor subjected to unusually high-voltages.

VERTICAL DMOS TRANSISTOR

Figure 26G:
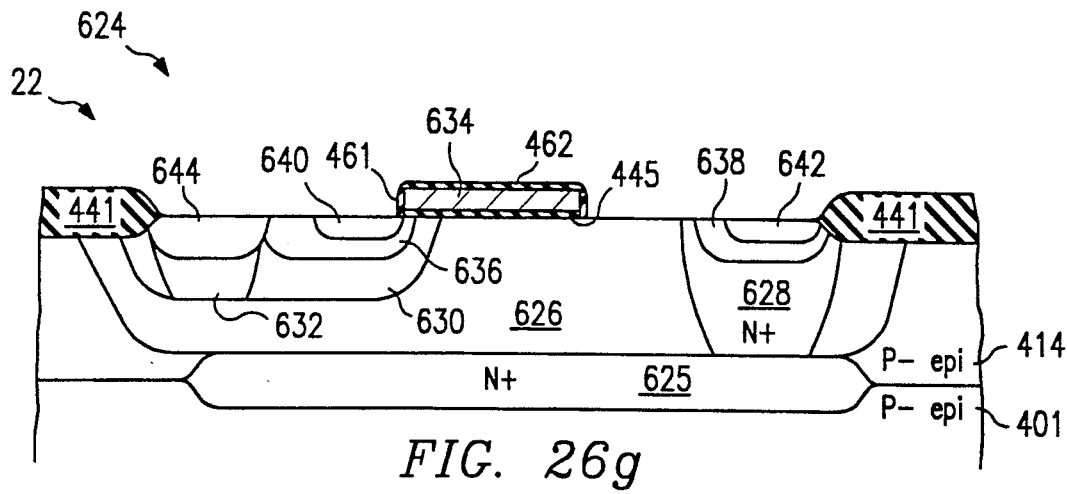
FIG. 26g is a highly magnified schematic sectional view of a back-gated, vertical n-channel field effect transistor fabricated according to the integrated process described herein.
Figure 26H:
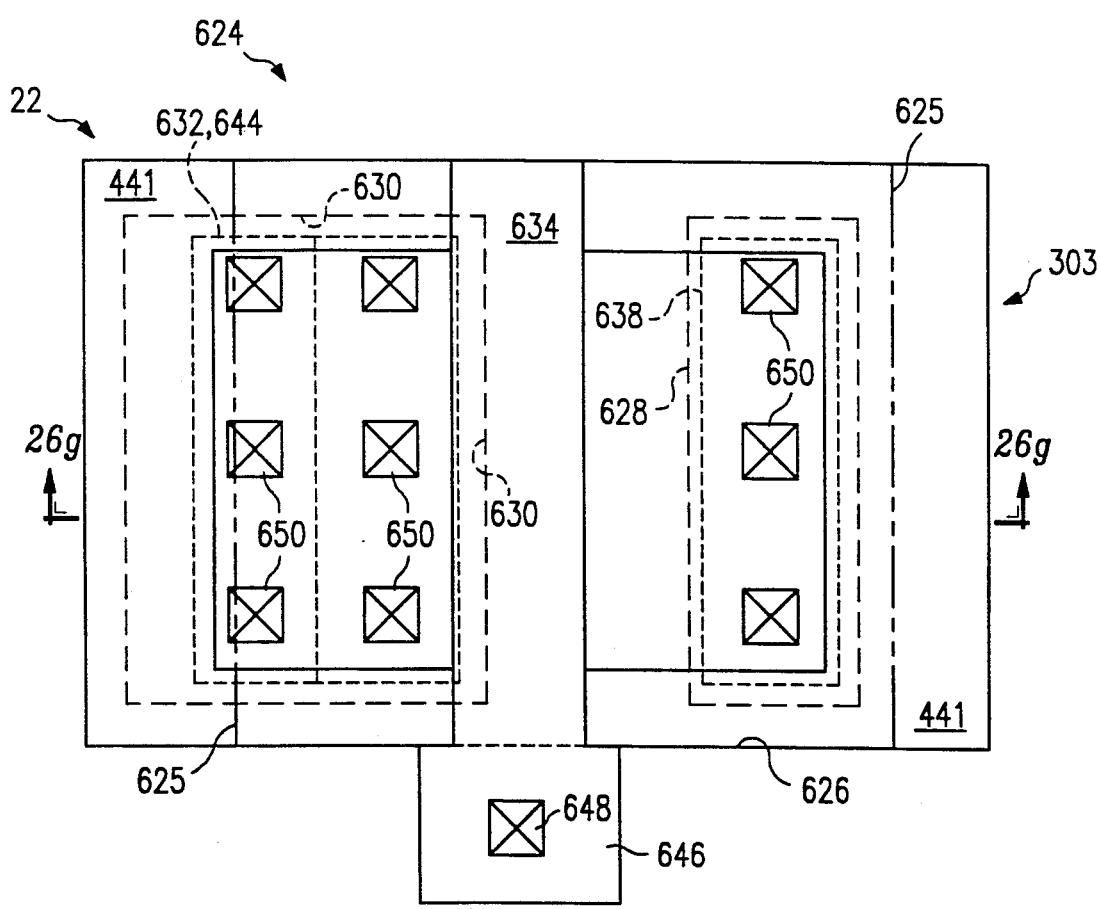
FIG. 26h is a schematic plan view of the vertical field effect transistor shown in FIG. 26g, the sectional view shown in FIG. 26g being taken substantially along line 26g—26g of FIG. 26h.

FIGS. 26g and 26h are highly magnified schematic sectional and plan views of an n-channel vertical DMOS transistor fabricated according to the integrated process described herein. FIGS. 26a-26f have been omitted as largely straightforward in view of similar fabrication steps for other devices described above. FIG. 26g corresponds to FIG. 16g, and also is taken substantially along line 26g—26g of FIG. 26h.

The (n+) buried source/drain region 625 is formed at the same time as the formation of the (n+) buried layer 413 as shown in FIG. 16a. A second (p−) epitaxial layer 156 is formed on top of the (n+) buried layer 625. An (n−) high-voltage n-tank 626 is implanted into the surface of the epitaxial layer 414 for this device 624. Next, a deep (n+) diffusion 628 is made to connect the (n+) buried layer 625 to points exterior to the device 624.

A high-voltage (p−) tank region 630 is defined by patterned photoresist (not shown) and implanted into the epitaxial layer 414 such that it is enclosed by the (p−) tank 626. The (n−) tank 630 occupies a left portion of the surface of the (n−) tank 626. Then, a deep (p+) diffusion 632 is implanted within the (n−) tank 630, preferably in order to extend completely through the (p−) tank 630. The deep (p+) region 632 thereby created will act as a back gate to control the conductance of the channel region formed by the (p−) tank 630.

Localized oxide 441 is grown on the periphery of device 624 to define a moat for the various source/drain regions subsequently implanted and to isolate the transistor 624 from adjacent devices. A gate oxide 445 is grown to a depth of approximately 500 Angstroms to take the high-voltage stresses that will be incident on the transistor 624. After a high-voltage $V_t$ adjust implant, a poly 2 layer, used for the control gate for most of the other devices on chip 22, is deposited, doped, patterned and etched to leave a control gate 634 which extends over the right lateral margin of the (n−) tank 630. Substantial portions of the control gate 634 reside over both the (n−) tank 626 and the (p−) tank 630.

After the acquisition of sidewall oxide regions 461 and a cap oxide 462, the control gate 634 is used to partially self-align a low density implant 636, preferably of phosphorus, to create a source region 636. At this same time, an (n−) contact region 638 is formed to contact the deep (n+) region 628.

This is immediately followed by an implantation of arsenic using the same patterned mask used to define nonself-aligned edges of the (n−) regions 636 and 638. The second (n+) implant is done with arsenic and creates regions 640 and 642. The phosphorus used to form the low density diffused region 636 diffuses outward to achieve the boundaries as shown. The phosphorus used in defining region 638 does likewise, but in this case, is just an additional portion of dopant to render the deep (n+) contact region more conductive. The rightmost edges of the regions 638 and 642 are self-aligned to the lateral margin of the moat oxide 441.

Following the (n+) source/drain implantations, a (p+) implant is patterned using photoresist and implanted to be partially self-aligned to the left interior margin of the moat oxide 441. This provides a back gate contact region 644.

FIG. 26h is a schematic plan view of the transistor 624, FIG. 26g being taken substantially along line 26g—26g of FIG. 26h. The n-tank diffusion 626 is shown by the enclosing solid rectangular line. The left and right limits of the (n+) buried layers 625 are shown by a dotted and dashed line. The top and bottom limits of the buried layer 625 can be chosen to be the same or substantially the same as the corresponding limits of the high-voltage n-tank 626. The lateral limits of the (p−) tank 630 are entirely within the (n−) high-voltage tank 626, and are represented by a dotted line in FIG. 26h. The deep (n+) diffusion 628 is represented by a long rectangle on the right side of poly 2 gate 634. The left margin of the deep (n+) diffusion 628 may also be the left margin of the (n+) contact region 638, and so this latter region is not represented in FIG. 26h. The deep (p+) region 632 has implantation limits similar to those of the (p+) contact region 644. However, as above explained, the deep (p+) region 632 is implanted prior to the formation of the moat oxide 441, while the contact region 644 is implanted to be self-aligned on its top, bottom and leftmost edges to the lateral edge of the moat oxide 441. Source/drain region 636 is likewise self-aligned on its top and bottom edges to the edge of the moat oxide 441, and on its right side to the edge of the conductive gate 634, as augmented by sidewall oxide 461 (see FIG. 26g). The deep (n+) contact regions 638 and 642 are self-aligned on their top, bottom and right sides to appropriate lateral margins of the moat oxide 441.

The fabrication sequence used to build the transistor 624 allows a high doping concentration of arsenic in the (n+) source/drain region 640. Prior techniques used the conductive gate 634 to self-align the implant of the equivalent (p−) tank 630; however, because the phosphorus making up the region 636 diffuses faster than heavier atoms in the silicon epitaxial layer, devices were difficult to obtain at the (n+) dopant concentrations used herein. Therefore, the (n+) region 640 in prior devices necessarily had to have less dopant in it, and was therefore less conductive, increasing the resistance of the device and decreasing the efficiency of the transistor per amount of chip area occupied thereby.

The conductive gate 634 is extended to a pad 646, and an appropriate contact 648 is made from the pad 646 to a metal one conductor (not shown). Contacts 650 are also made from appropriate metal 1 conductors (not shown) to the (p+) back gate connection region 644, the source/drain region 636 and the deep (n+) contact region 638.

VERTICAL NPN TRANSISTOR

FIGS. 27a, 27b, 27d and 27f-g are highly magnified schematic sectional views of a vertical NPN transistor which may be fabricated according to the integrated process described herein. The process fabrication steps and final structure are similar to the lateral NPN transistor illustrated in FIGS. 22a-b, 22d and 22f-h.

At the time of the formation of the (n+) buried layers, as for example for the vertical DMOS transistor 410 (FIGS. 16a-g), an (n+) buried layer 772 is grown on top of the (p−) epitaxial layer 401. After the formation of the (n+) buried layer 772, the monocrystalline semiconductor material is completed by a (p−) epitaxial layer 414.

A high-voltage n-tank 774 is next implanted into the epitaxial layer 401, as defined by the nitride/oxide mask 564. The high-voltage n-tank 774 will contain the rest of the structure with the exception of the (n+) buried layer 772. Subsequently, a deep (n+) diffusion 776 is formed to conductively connect the (n+) buried layer 772 to points external to the device 770.

Figure 27A:
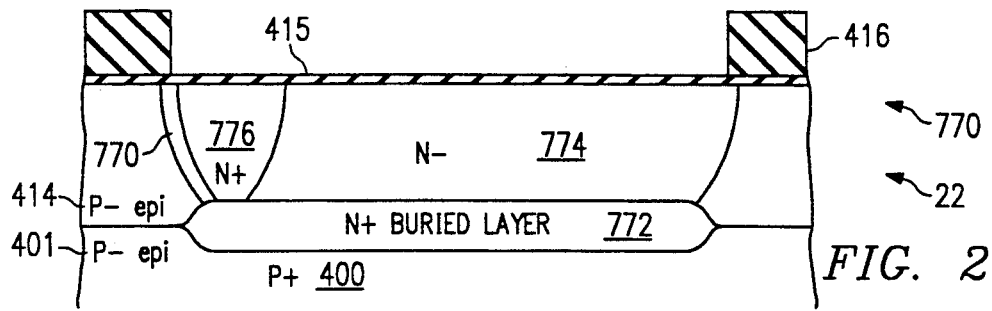
FIGS. 27a-b, 27d and 27f-g are highly magnified schematic sectional views of successive stages in the fabrication of a buried-collector, vertical NPN bipolar transistor according to the integrated process described herein.
Figure 27B:
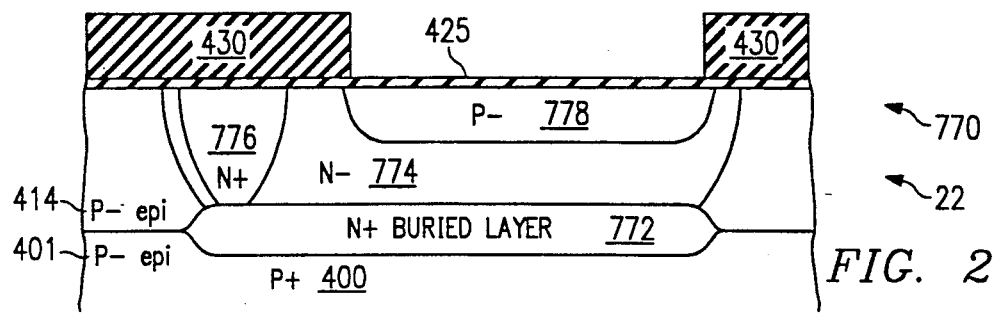

Turning now to FIG. 27b, a patterned layer 430 of photoresist is used to define a high-voltage p-tank 778. The (p−) tank 778 is formed inside the n-tank 774 so as to be spaced from the deep (n+) diffusion 776.

Figure 27D:
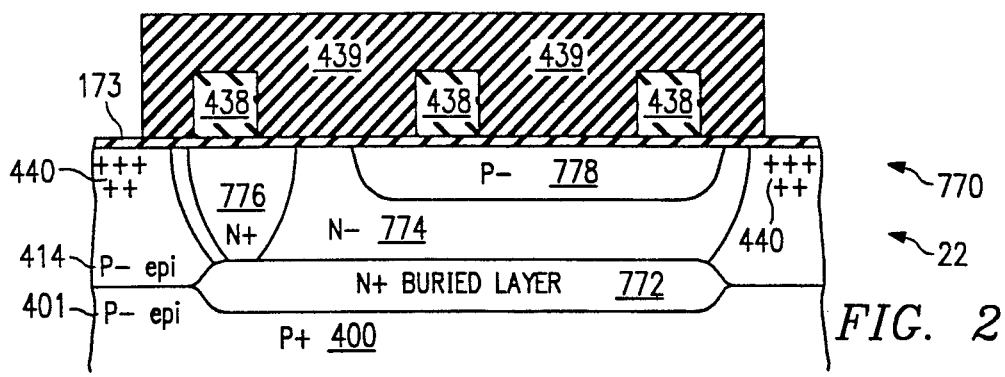
Figure 27F:
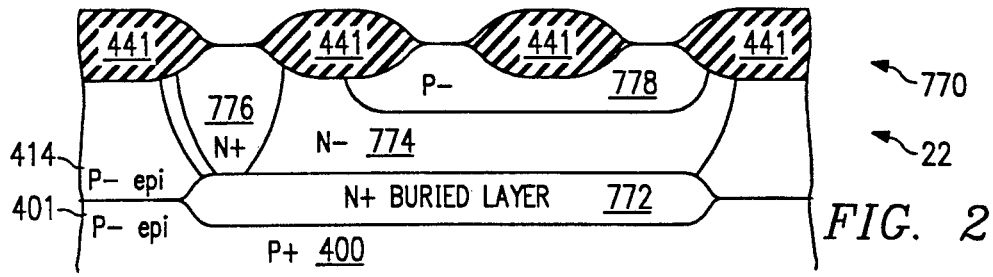

Nothing of import happens to device 770 in the stage corresponding to FIG. 16c. In FIG. 27d, corresponding to FIG. 16d in the main integrated process sequence, a nitride/oxide layer 438 is formed, patterned and etched to define those areas of the epitaxial layer 414 where localized oxide is not wanted. A layer 439 of photoresist is patterned in order to provide a mask for the implantation of (p+) channel stop regions 440. After the channel stop implant, the photoresist layer 439 is stripped and the chip 22 is subjected to a long thermal step in order to create localized or moat oxide regions 441 (FIG. 27f).

Figure 27G:
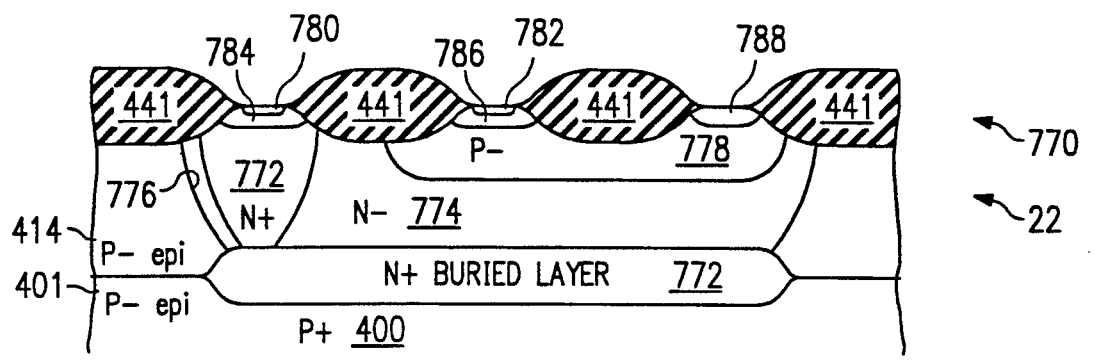

The remaining important fabrication steps are shown in FIG. 27g. The moat oxide 441 is used to completely self-align the implantation of n-type low density diffused regions 784 and 786. The same photoresist mask is used to implant (n+) regions 780 and 782. Regions 780 and 784 form a deep diffusion contact region for the (n+) buried collector 772. Regions 782 and 786 together constitute an emitter for this vertical NPN device. Lastly, the moat oxide 441 is used to completely self-align the implantation of a (p+) base contact region 788 for the connection to base 778.

Figure 27H:
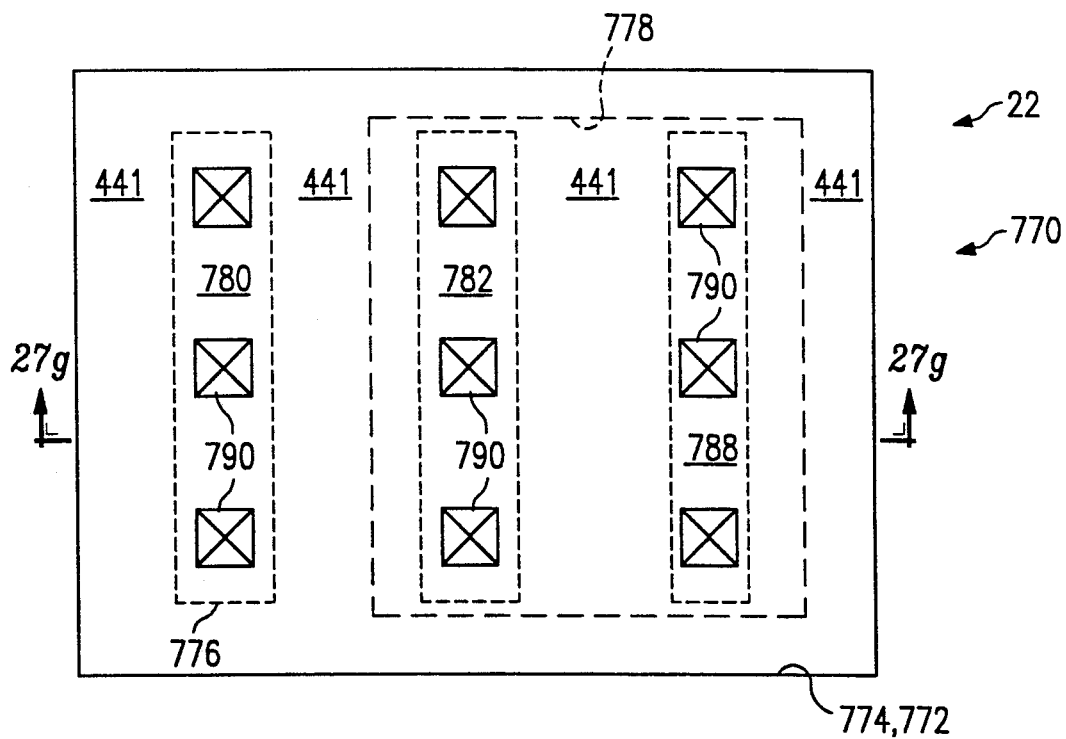
FIG. 27h is a schematic plan view of the buried-collector vertical NPN transistor shown in FIG. 27g, FIG. 27g being taken substantially along line 27g—27g of FIG. 27h.

A schematic plan view of the vertical NPN transistor 770 is given in FIG. 27h. The high-voltage n-tank and the approximate lateral limits of the buried layer 772 are shown by the enclosing rectangular solid line. Within this boundary are the deep (n+) connecting diffusion 776, shown by a dashed line, and the high-voltage (p−) tank 778. The lateral margins of the moat oxide 441 are used to self-align the implantations for the buried collector contact region 780, the emitter 782 and the base contact region 788. Appropriate contacts 790 are made to each of the regions 780, 782 and 788.

In the vertical NPN transistor 770 described in conjunction with FIGS. 27a–b, 27d and 27f–h, as well as the lateral NPN transistor shown in FIGS. 22a–b, 22d, and 22f–h, a high-voltage p-tank is used instead of a low-voltage p-tank in order to get a lower dopant concentration, a narrower base region, and a higher $h_{FE}$.

VERTICAL DMOS TRANSISTOR WITH TRENCH CONNECTIONS

Figure 28:
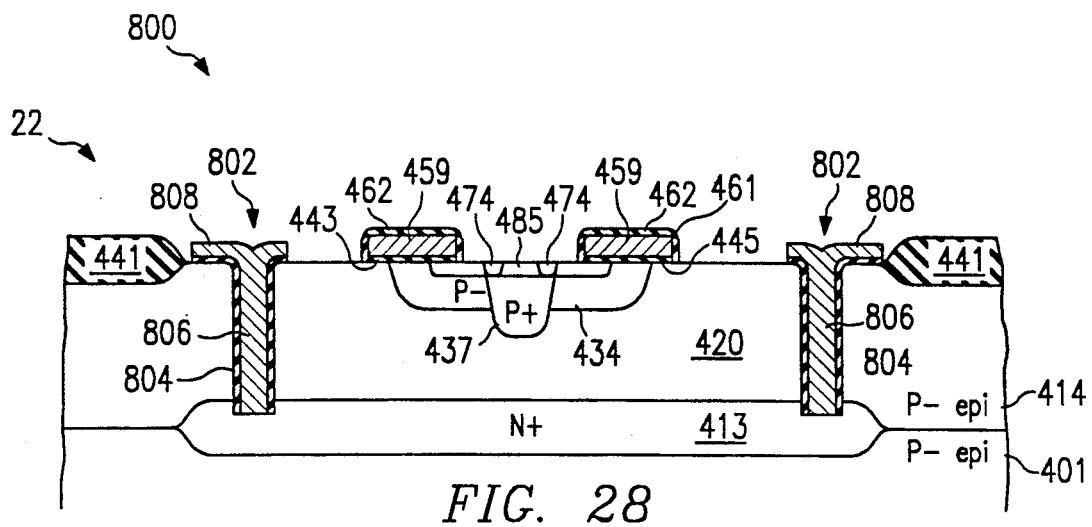
FIG. 28 is a highly magnified schematic sectional view of a vertical DMOS transistor fabricated according to the integrated process described herein, illustrating the use of trench connections to a buried layer.

FIG. 28 is a schematic sectional view of a vertical DMOS transistor 800 that is an alternative embodiment to the vertical DMOS transistor 410 shown, for example, in FIGS. 16g-1 and 16h-1. FIG. 28 corresponds to the process stage shown in FIG. 16g; prior processing steps have been omitted as being largely redundant to the description of process steps already described for other devices.

The fabrication of the VDMOS transistor 800 proceeds in substantially the same manner as transistor 410 for most of the process flow. An (n+) buried layer 413 is formed on the epitaxial layer 401, and a second (p−) epitaxial layer portion 414 is formed on top of this. A high-voltage n-tank 420 is implanted into the epitaxial layer 414 to contain the device. This is followed by the implantation of the (p−) low-voltage tank 434 and the deep (p+) diffusion 437. Channel stops (not shown) are implanted at the periphery of the device 800, followed by the selective oxidation of the epitaxial surface to produce the moat oxide 441.

Next, a 500 Angstrom high-voltage oxide 445 is grown on the surface, followed by a $V_t$ adjust implant and by the deposition, doping, patterning and etching of a preferably annular poly 2 gate 459.

At this point, the process departs from the usual process flow in that the chip surface is masked to leave only areas in which the trenches 802 are to be etched. An anisotropic plasma etch is used to etch trenches 802 through the high-voltage n-tank 420 into the (n+) buried layer 413. Once trenches 802 have been dug, a thermal oxide 804 is grown on the sides (and the bottoms) of trenches 802. The chip is once again patterned, and an anisotropic etch removes the oxide from the bottoms of trenches 802. Trenches 802 may be joined to form one long annular trench.

The old layer of photoresist is stripped and a new layer of photoresist is formed on the surface and patterned for the deposition of a third poly layer. The third poly layer is patterned and etched to produce (n+) polysilicon plugs 806 which fill the trenches 802. Contact extensions 808 of the poly plugs 806 are left after the etch to provide contact points for metal 1 contacts (not shown).

Alternatively, the trenches 802 can be etched subsequent to the formation of the high-voltage gate oxide 445, but prior to the deposition of the poly layer 459. The poly plugs 806 and the poly 2 conductive gates 459 would then be deposited, patterned and etched as shown. The polysilicon used to create plugs 806 should be pre-doped; therefore, if the same poly that is used to fill trenches 802 is used for the poly 2 layer, the poly material should be pre-doped instead of doped in situ.

The trenches 802 shown in FIG. 28 represent a technical advantage over the deep (n+) method of connection to the buried layer 413. This is because the deep (n+) regions (see, e.g., region 421 in FIG. 16g-1) diffuse laterally as well as vertically. A thick epitaxial layer 414 necessary for high-voltage applications, in turn forcing large spacings for the deep (n+) diffusions. Using the trench method of connection, however, the design rules for the transistor 800 can be independent of the need for large spacings for the deep (n+) diffusions, thus saving space.

Figure 29:
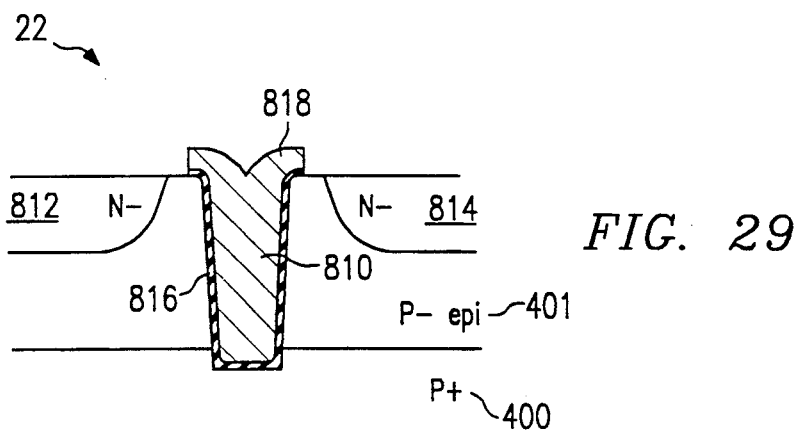
FIG. 29 is a highly magnified schematic sectional view of a polysilicon-field trench used for isolation purposes.
Figure 30:
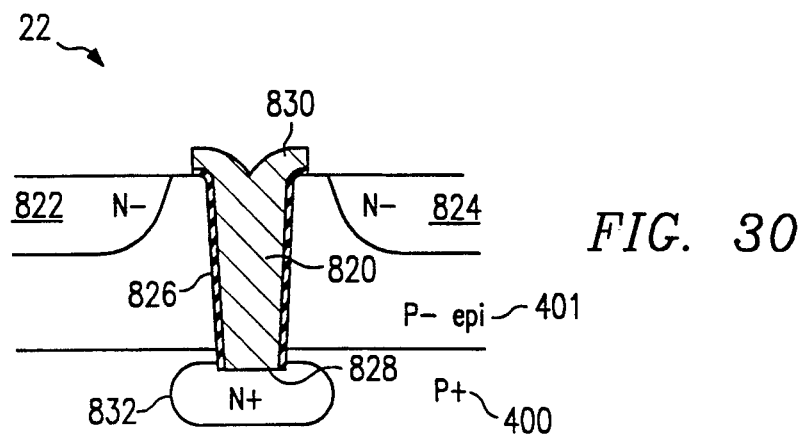
FIG. 30 is a highly magnified schematic sectional view of another polysilicon-field trench used for device isolation purposes.

FIGS. 29 and 30 illustrate alternative uses of trenches on the chip 22 for isolation purposes. In FIG. 29, which is a highly magnified schematic elevational view, a trench 810 has been etched through the epitaxial layer 401 until it meets the (p+) substrate 400. The trench 810 is positioned between, for example, a high-voltage (n−) tank 812, and a neighboring high-voltage n-tank 814. After the trench 810 is etched, a thermal oxide 816 is grown on its walls and bottom, and the trench 810 is filled with (n+) poly 818. The trench 810 provides an isolating structure between the (n−) tanks 812 and 814 that may be used instead of, or in addition to, moat oxide.

FIG. 30 illustrates yet another alternative embodiment, in which a trench 820 has been etched between a first high-voltage (n−) tank 822 and a second tank 824. A thermal oxide 826 is grown on the sides of the trench 820, but is anisotropically etched off of the bottom 828 of the trench. The trench is then filled with an (n+) poly layer 830 as before. However, since the bottom has been left exposed to the (p+) silicon substrate 400, and out-diffusing (n+) region 832 will be created from dopant supplied by the (n+) poly 830. This provides additional isolation.

Figure 31A:
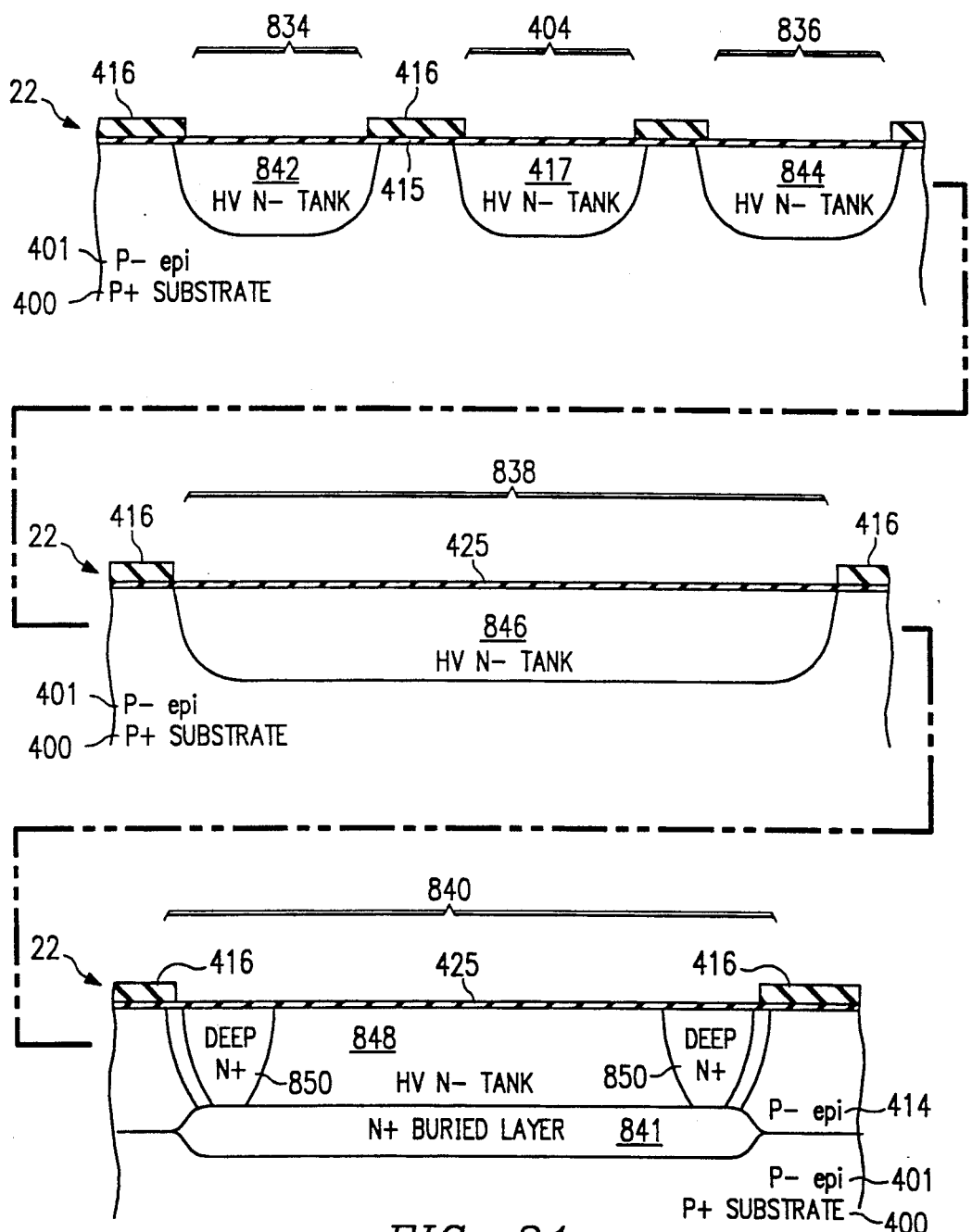
FIGS. 31a-31g (including 31b-1) are highly magnified schematic sectional views of successive stages in the fabrication of tank-isolated field effect transistors and lateral and vertical DMOS power transistors with early source/drain processing.

Turning now to FIGS. 31a–g, further devices are illustrated which may be fabricated according to the integrated process described herein. These devices include an isolated low-voltage n-channel field effect transistor 834, an isolated n-channel field effect transistor 836 for the gating of an EEPROM array, another lateral DMOS transistor 836 and another vertical DMOS transistor 840. Turning first to FIG. 31a, a high-voltage n-tank 842 for transistor 834 and a high-voltage n-tank 844 for the EEPROM transistor 836 are implanted into the semiconductor epitaxial layer 401. The provision of these high-voltage n-tanks is the principal modification of these transistors 834 and 836 in comparison to their cognates, transistors 403 and 405 (see FIGS. 16a–g). A high-voltage n-tank 846 is implanted for the lateral DMOS transistor 838, and a further high-voltage n-tank 848 is implanted for the vertical DMOS transistor 840. Previous to the implantation of the high-voltage n-tanks 842, 417, 844, 846 and 848, an (n+) buried layer 841 was formed at the top of the epitaxial layer 401, and a further (p−) epitaxial layer 414 (see FIG. 16a) was formed on top of the (n+) buried layer 841 to complete the silicon in which the high-voltage n-tank 848 would later be formed.

Following this step, deep (n+) regions 850 are implanted into the high-voltage n-tank 848 with a dopant concentration and an implantation energy sufficient to reach the (n+) buried layer 841, giving a conductive connection from the phase of the epitaxial layer 414 to the (n+) buried layer 841.

Figure 31B:
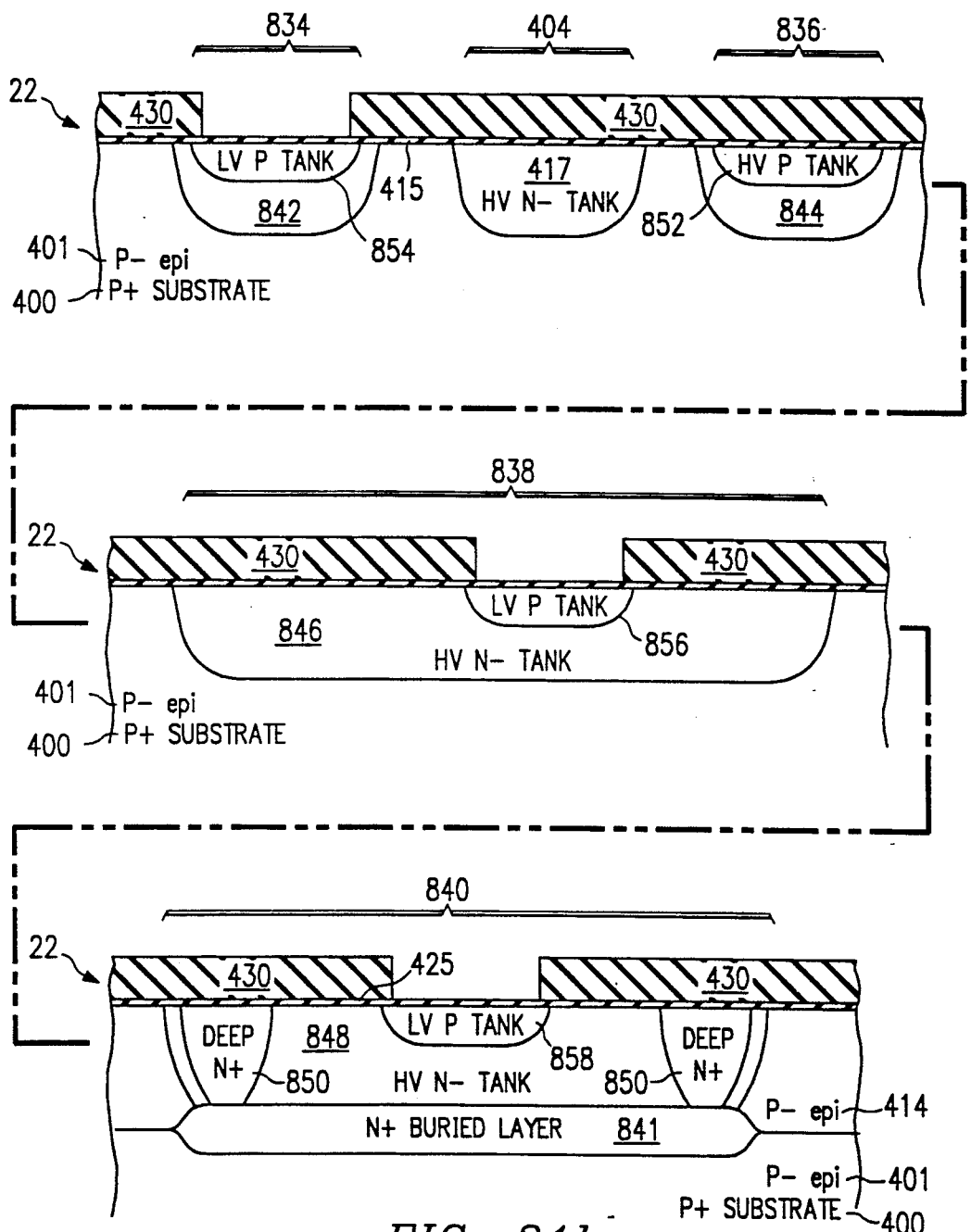
Figures 1, 31B:
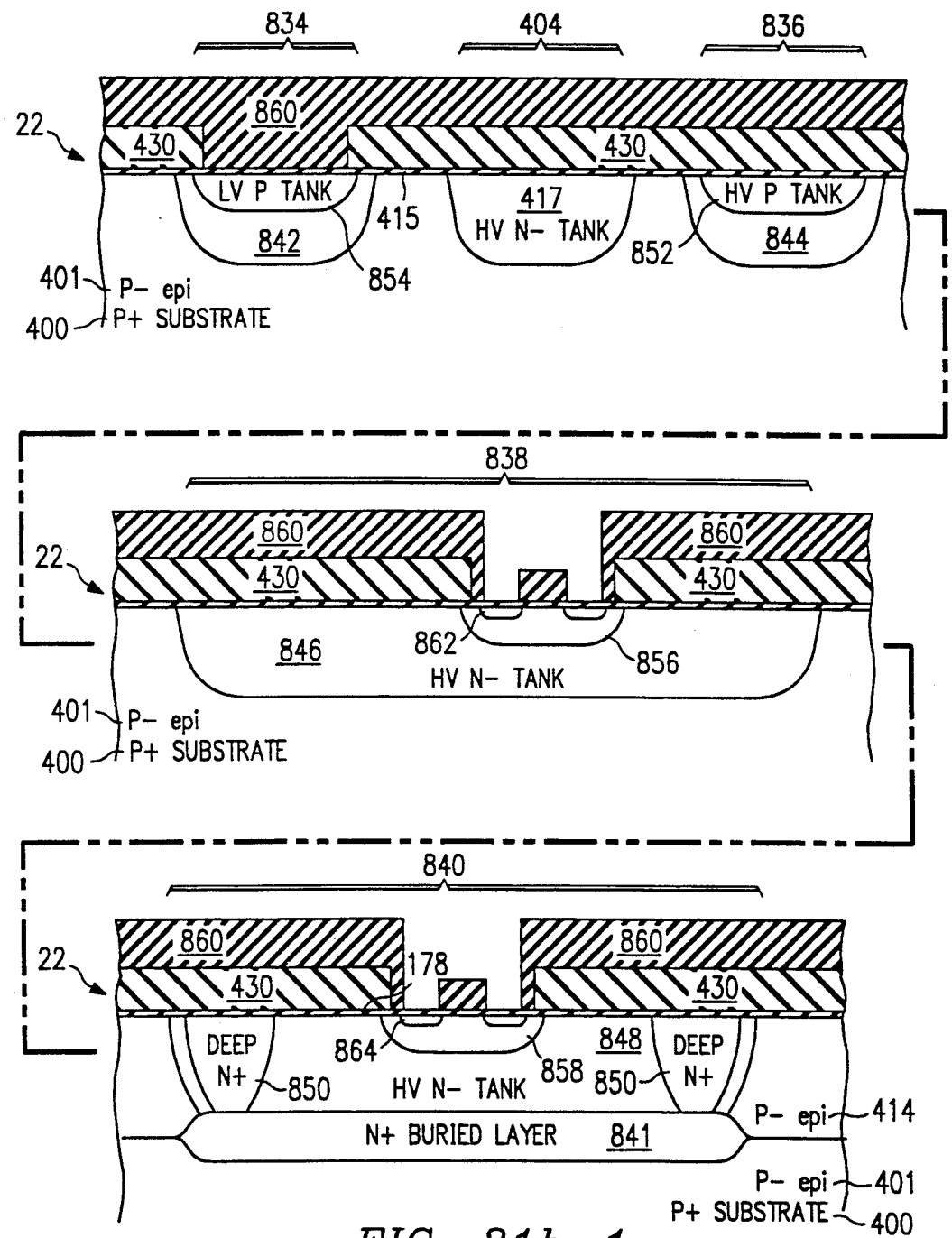

Turning next to FIG. 31b, the implantation of low and high-voltage p-tanks for devices 834, 836, 838 and 840 are next shown. A photoresist layer (not shown) masks off the entirety of the chip 22 except for areas in which high-voltage p-tanks are to be implanted. An implantation follows to establish the high-voltage p-tank 852. The patterned photoresist layer is then stripped and a new photoresist layer 430 is deposited on the surface of the epitaxial layer 401 and patterned to define low-voltage p-tanks. The low-voltage p-tank implant is then performed, for example, with boron at about $1 \times 10^{14}$ ions/cm$^2$ and at an implantation energy of approximately 40 KeV, to establish a low-voltage p-tank 854 for the low-voltage n-channel transistor 834, a low-voltage p-tank 856 centered in the middle of the high-voltage n-tank 846 for the LDMOS transistor 838, and a low-voltage p-tank 858 as centered in the middle of the high-voltage n-tank 848 and spaced from the deep (n+) diffusions 850 for the vertical DMOS transistor 840.

FIG. 31b-1 shows a stage of the processing intermediate between FIGS. 16b and 16c for the devices 834, 836, 838 and 840. After the implantation of the low-voltage p-tanks 854–858, a second layer 860 of photoresist is deposited over the surface of the chip 22 and patterned as shown. An (n+) implantation is next performed, preferably with arsenic, at a dose of $5 \times 10^{15}$ ions/cm$^2$ and an implantation energy of approximately 546 KeV. This implant step produces an annular highly doped (n+) region 862 within the lateral margins of the low-voltage p-tank 856, and a similar annular highly doped region 864 contained by the low-voltage p-tank 858.

Figure 31C:
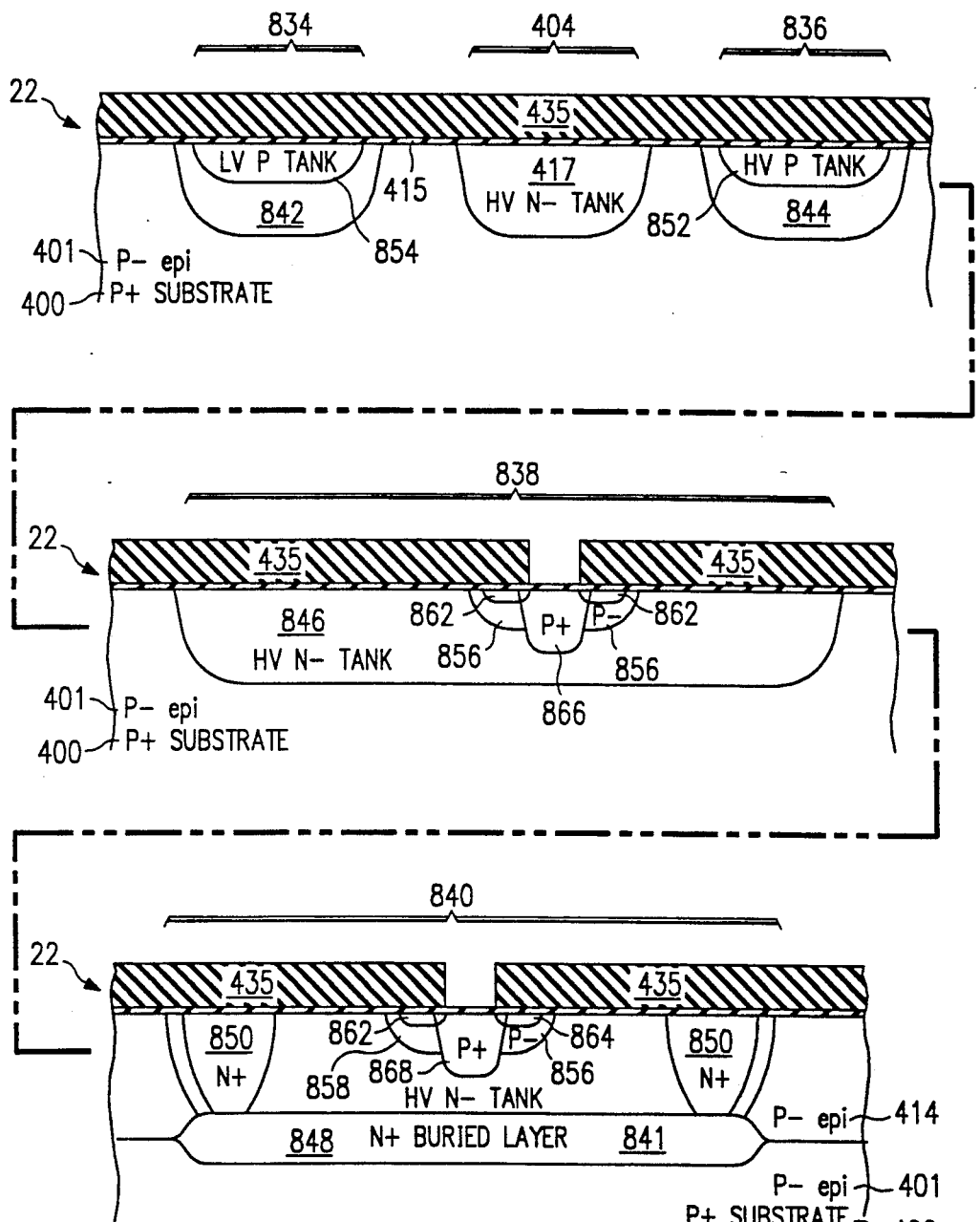

Turning next to FIG. 31c, stages in the fabrication process for these devices are shown that correspond to those shown in FIG. 16c. A layer 435 of photoresist is next deposited on the chip and patterned for a deep (p+) diffusion. This may be performed, for example, with boron at about $1 \times 0 \times 10^{12}$ ions/cm$^2$ and at an implantation energy of approximately 40 KeV. This implantation step will produce deep (p+) regions 866 and 868.

Figure 31D:
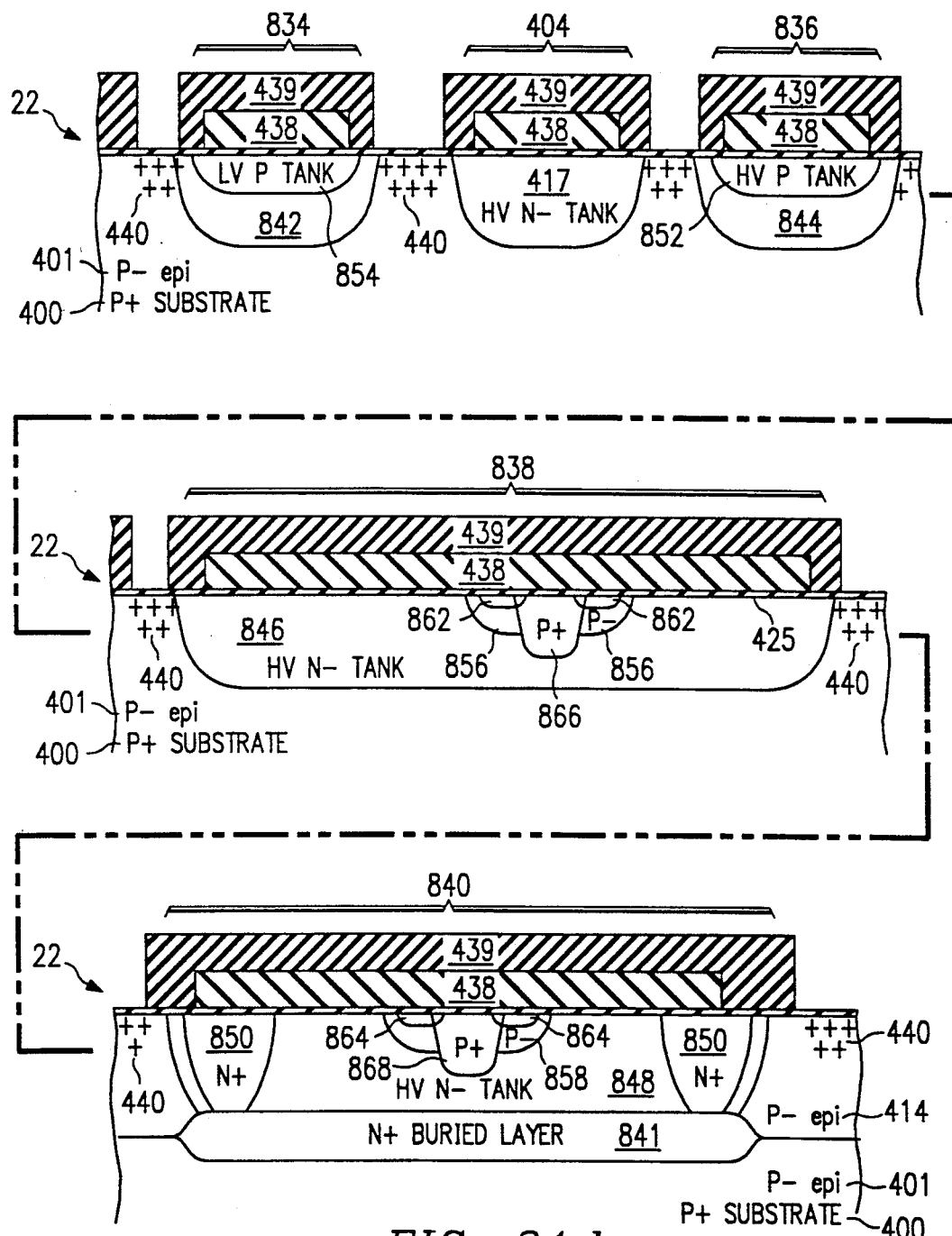
Figure 31E:
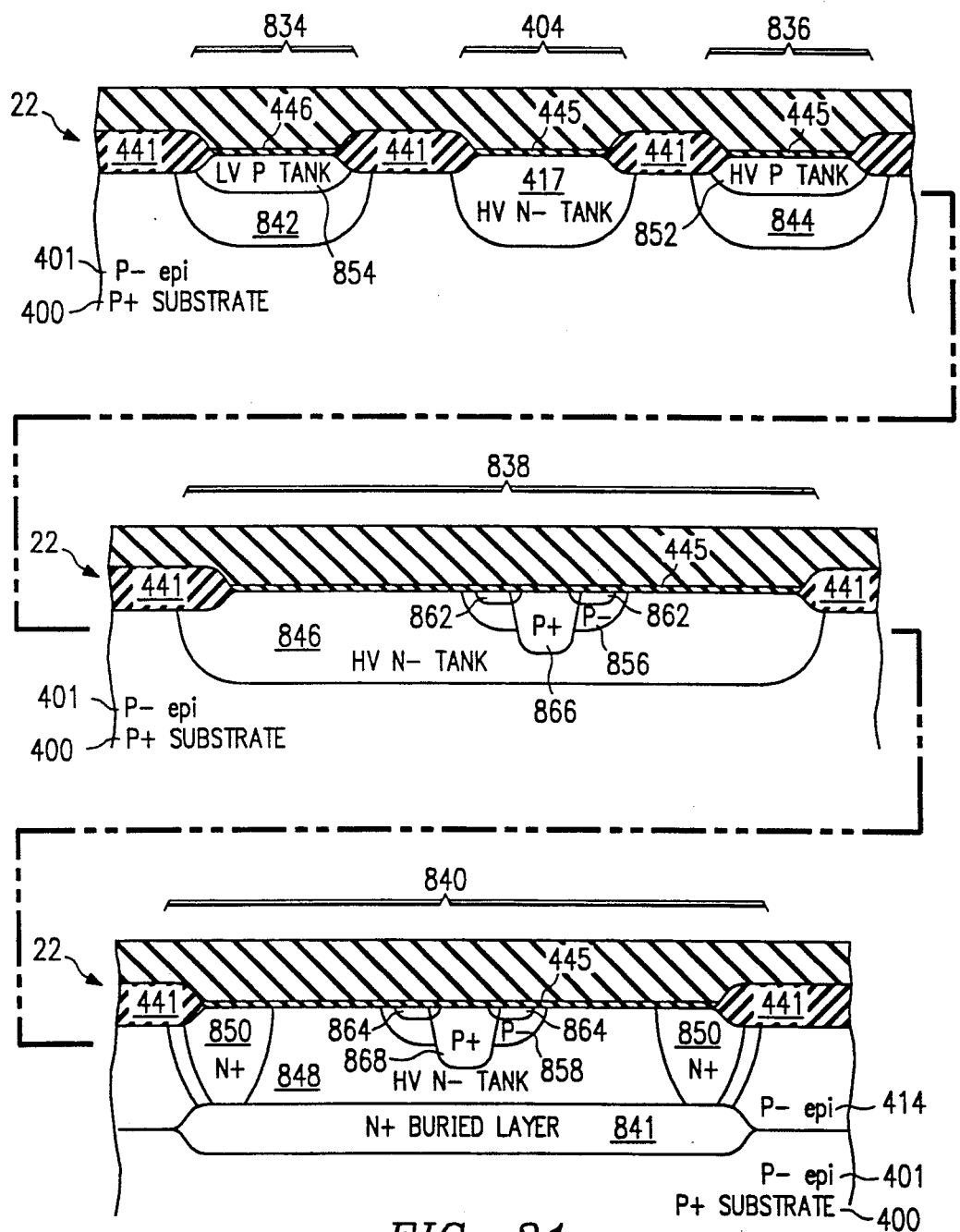

In FIG. 31d, a nitride/oxide mask 438 is formed on a previously existing oxide layer 425 and is patterned and etched to produce a moat oxide mask. This mask 438 is augmented with a layer of patterned photoresist 439 to form a mask for the implantation of (p+) channel stop regions 440, represented in this figure only by pluses. The photoresist layer 439 is then stripped, and the chip is subjected to a long thermal step in order to grow isolating oxide regions 441 (FIG. 31e). After the growth of the isolating oxide regions 441, the mask 438 is removed. A high-voltage gate oxide 445 is next grown on the surfaces of the tanks 417, 852, 846 and 848. At this time, a high-voltage N $V_T$ implant is performed with boron into the high-voltage n-tank 417. A high-voltage $V_T$ adjust implant is performed next for future P-type channel regions into the high-voltage p-tank 852. Next, a low-voltage $V_T$ adjust implant is performed into the low-voltage n and p-tanks, including the low-voltage p-tank 842 and p-tanks 856 and 858.

Figure 31F:
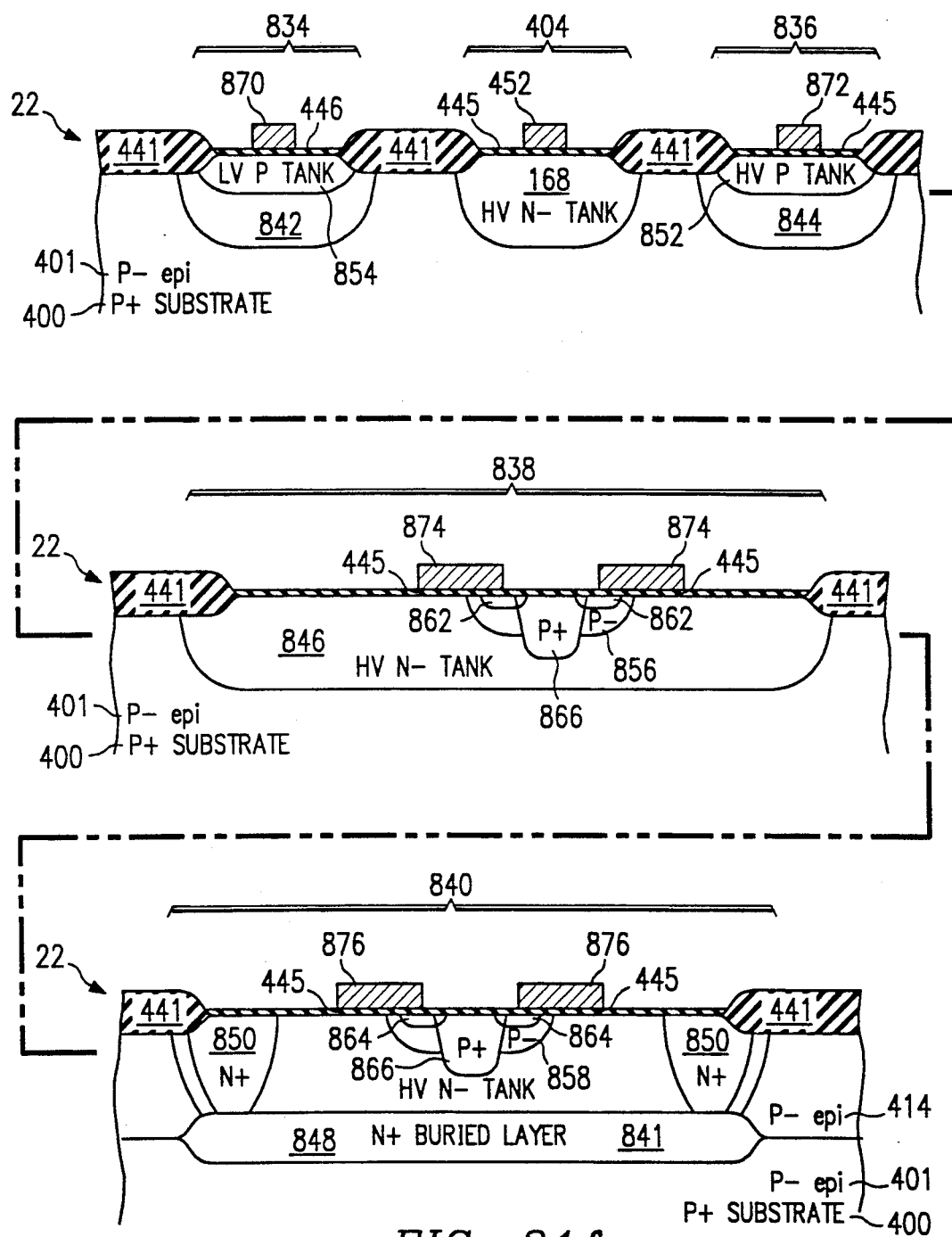

Further steps of the integrated process as applied to these devices are shown in FIG. 31f. The patterning and implanting of a tunnel diode is next performed for devices other than those shown, as well as the growth of a Fowler-Nordheim tunneling window (not shown). Then, a second layer of polycrystalline silicon (not shown; the first layer was deposited, patterned and etched in conjunction with a FAMOS EEPROM cell that is also not shown in this series) is deposited, doped, patterned and etched to form (n+) poly gates 870, 452, 872, an annular poly gate 874 for the LDMOS transistor 838, and an annular gate 876 for the VDMOS transistor 840.

Figure 31G:
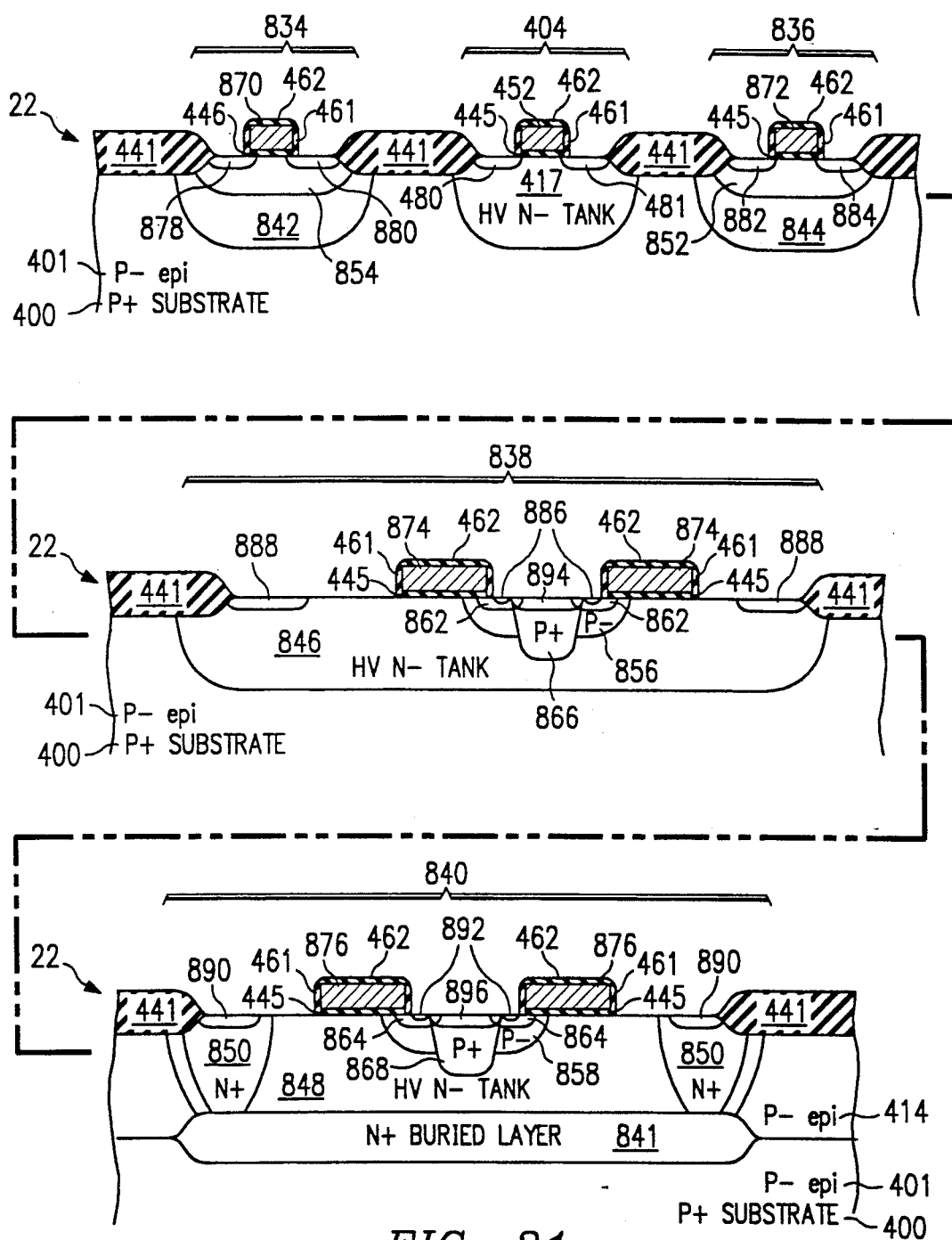

Further steps of the integrated process as applied to devices 834, 836, 838 and 840 are shown in FIG. 31g. Sidewall oxide structures 461 are added to the various poly gates 870, 452, 872, 874 and 876. This is followed by the formation of a cap oxide 462 on the exposed surfaces of the polysilicon gates 452 and 870–876.

A layer of photoresist (not shown) is used to define a plurality of n-type source/drain implants. While most of these are self-aligned to corresponding sidewall oxide or moat oxide structures, the (n+) source/drain implants for the LDMOS transistor 838 and the VDMOS transistor 840 are not. A first, low-density diffusion source/drain implant, the so-called LDD implant, is made with phosphorus into source/drain regions 878 and 880 for low-voltage n-channel field effect transistor 834, regions 480 and 481 for transistor 404, regions 882 and 884 for the high-voltage EEPROM-gating n-channel transistor 836, an annular source/drain region 886 for the LDMOS transistor 838, an annular source/drain region 888 near the periphery of the high-voltage n-tank 846 for the LDMOS transistor 838, a source/drain contact region 890 which is located at the face of the (n+) deep diffusion annular region 850, and an annular interior source/drain region 892 for the VDMOS transistor 840. This LDD implantation is immediately followed with an arsenic implantation using the same patterned photoresist layer (not shown).

Another layer of photoresist (not shown) is patterned for the (p+) source/drain implants. The implanting of a deep (p+) contact region 894 is performed for the LDMOS transistor 838 to be substantially coincident with the lateral facial margins of the deep (p+) region 866. The (p+) source/drain implant step also creates a central deep (p+) contact region 896 for the VDMOS transistor 840. End process steps, including deposition of mid level insulator, first level metal, a second mid level insulator, and second level metal, are performed according to processes well known in the art.

Where the epitaxial layer 461 is (p−), as it is for the preferred embodiment, the back gates of the n-channel transistors are common. The (n−) tanks 842 and 844 give extra pn junctions for isolation, allowing the use of negative voltages with respect to the epitaxial layer 461. Further, the enclosing tanks 842 and 844 give additional protection from transient voltages. This makes the isolated transistors 834 and 836 especially useful for automobile microcontrollers and other chips subject to 60-volt transient voltages.

The early implantation of the (n+) regions 862 and 864 provide an alignment-insensitive DMOS channel length in a process compatible with CMOS logic and EEPROM and EPROM cells. That is, the channel length created by the (p−) tanks 856 and 858 is made independent of the position of the annular gates 874 and 876.

GATED THYRISTOR, FOURTH PHYSICAL EMBODIMENT

Figure 33:
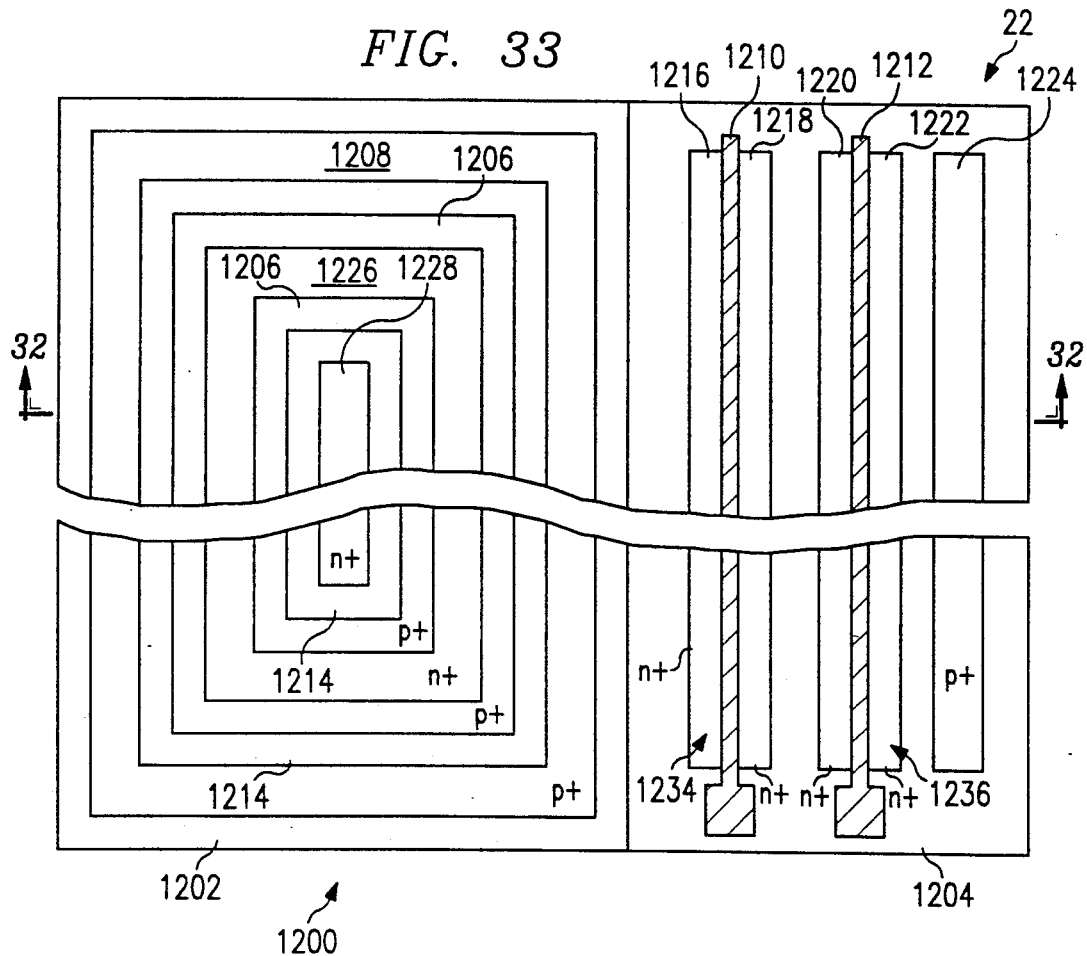
FIG. 33 is a highly magnified schematic plan view of the thyristor shown in FIG. 32, FIG. 32 being taken substantially along line 32—32 of FIG. 33.
Figure 34:
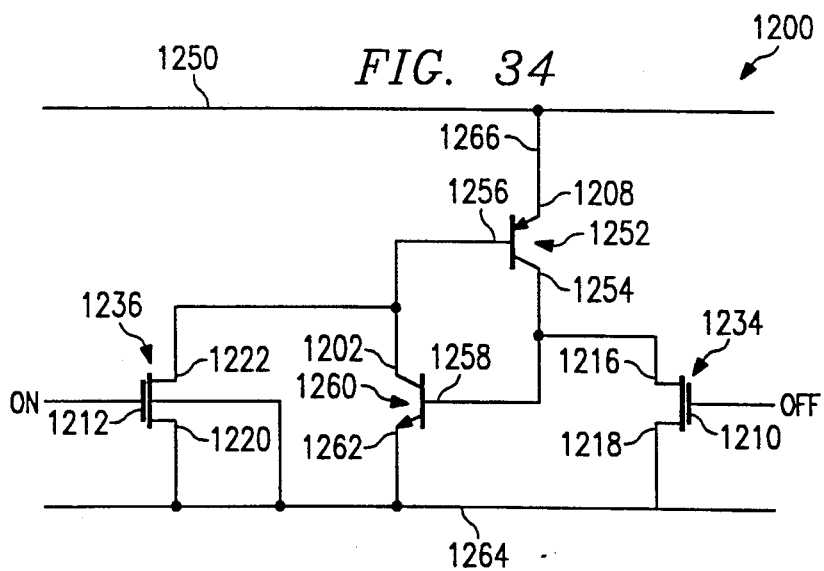
FIG. 34 is a schematic electrical circuit diagram of the thyristor shown in FIGS. 32 and 33.

A fourth physical embodiment of a gated thyristor is shown in FIGS. 32-34, and is indicated generally at 1200. Referring first to FIG. 32, which is a schematic, highly magnified elevational view of a portion of chip 22 in which the thyristor 1200 is formed, they thyristor 1200 may be formed in a (p−) epitaxial layer 208 in addition to, or in substitution for, the other thyristors described herein.

An (n−) tank 1202 is first implanted into the surface of the epitaxial layer 208. This can be performed within the low voltage (n) tank step shown in FIG. 15, or alternatively, in the high-voltage (n) tank step. A low-voltage (p) tank implant creates (p−) tank 1204 which is implanted to be adjacent the (n−) tank 1202. (p+) region 1206 may be implanted during either the low voltage (p) tank step or in the deep (p+) diffusion step shown in FIG. 15. The (p+) region 1206 is formed as an endless ring.

A (p+) emitter ring 1208 is implanted to be within the (n−) tank 1202, but laterally outwardly spaced from the (p+) ring 1206.

Highly doped polycrystalline silicon field effect transistor gates 1210 and 1212 are formed to be insulatively disposed above the surface of the (p−) tank 1204. These, and field oxide structures 1214, are used to either partially or totally self-align an (n+) implant to create source and drain regions 1216, 1218, 1220 and 1222 inside the (p−) tank 1204. A (p+) back gate contact region 1224 is implanted into the (p−) tank at the same time that region 1208 is formed.

(N+) regions 1226 and 1228 may be implanted at the same time as regions 1216-1222. Collector contact region 1228 is connected by suitable contacts and a conductor represented by line 1230 to drain region 1222. Base ring 1206 is connected by suitable conductive contacts and a conductor, both represented by line 1232, to the drain 1216. Drain 1216, gate 1210 and source 1218, in conjunction with (p−) tank 1204, form an OFF field effect transistor indicated generally at 1234. Source 1220, gate 1212 and drain 1222, when taken in conjunction with the channel region provided by the (p) tank 1204, form an ON transistor indicated generally at 1236. An ON signal may be supplied to the gate 1212 via a conductor 1238, while an OFF signal may be provided to the gate 1210 via a suitable conductor 1240. The sources 1218 and 1220 are connected by suitable contacts and a conductor, both of which are represented by line 1242, to (n+) emitter ring 1226.

FIG. 33 is a plan view of the thyristor 1200. The PNP and NPN bipolar thyristors are built as concentric rings of implantation all contained within the (n) tank 1202. The gate and field effect transistors 1234 and 1236 are laid out as linear stripes within the adjacent (p) tank region 1204. Appropriate metallization (not shown) connects the components of the gating transistors 1234 and 1236 to various regions within the (n) tank 1202, as is schematically indicated in the sectional view given in FIG. 32. The (p+) back gate connection region 1224 is also laid out as a linear stripe in parallel with the (n+) source/drain implantations 1216-1222.

FIG. 34 is an electrical schematic circuit diagram of the thyristor 1200. A top rail 1250 is connected to the emitter 1208 of a first PNP bipolar transistor indicated generally at 1252. A base 1256 of the PNP transistor 1252 is formed by the (n+) contact region 1228 and the tank 1202. A collector 1254 of the PNP transistor 1252 is formed by the (p+) ring 1206, as is the base 1258 of the NPN transistor indicated generally at 1260. The collector 1202 of NPN transistor 1260 is formed by the (n−) tank region 1202 and (n+) contact region 1228 as shown in FIG. 32. The emitter 1228 of NPN transistor 1260 is connected by a suitable conductive contact and conductor 1262 to a ground or second supply voltage rail 1264. Emitter 1208 of PNP transistor 1252 is connected to the top rail 1250 by conductor 1266. The field effect switching transistors 1236 and 1234 are connected as shown in FIGS. 34 and 32.

Although the present invention and its advantages have been described in detail, it should be understood that various changes, substitutions and alterations can be made herein without departing from the spirit and scope of the invention as defined by the appended claims.

What is claimed is:

1. A gated thyristor formed at a face of semiconductor layer of a first conductivity type, comprising:
    a first well formed at said face to be of a second conductivity type opposite said first conductivity type;
    a second well of a first conductivity type formed at said face to be enclosed by said first well;
    an emitter region of said second conductivity type formed at said face to be enclosed by said second well;
    first and second highly doped regions formed at said face to be of said first conductivity type, said first highly doped region formed within said first well and said second highly doped region formed in said first well and at least partially within said second well, a subregion of said first well spacing apart said first and second highly doped regions and operable to act as a base of a first bipolar transistor;
    third, fourth and fifth highly doped regions formed at said face to be of said second conductivity type, said third and fourth highly doped regions spaced from said first well, said fifth highly doped region formed to be at least partially within said first well, channel regions of said semiconductor layer spacing apart said third region from said fourth region and said fourth region from said fifth region, said third region and said fifth region spaced apart, conductive gates insulatively disposed over said channel regions; and
    said third region conductively connected to said second highly doped region, said fourth region conductively connected to said emitter region.

2. The thyristor of claim 1, wherein said first conductivity type is (p).

3. A gated thyristor formed at a face of a semiconductor layer of a first conductivity type, comprising:
    a first tank formed at a face to be of said second conductivity type opposite said first conductivity type;
    a second tank formed at said face to be of said first conductivity type and within said first tank;
    a first highly doped region formed at said face within said second tank to be of said second conductivity type;
    a second highly doped region formed at said face adjoining said first and said second tanks and to be of said first conductivity type;
    a third highly doped region formed at said face to be of said first conductivity type, a channel subregion of said first tank spacing said second highly doped region from said third highly doped region, said third highly doped region formed within said first tank and spaced from said second tank;

a conductive gate insulatively disposed adjacent said channel subregion so as to control the conductance thereof, said third highly doped region and said conductive gate conductively coupled together;

a fourth highly doped region of said second conductivity type formed at said face at a margin of said first tank and a portion of said semiconductor layer outside of said first tank;

a fifth highly doped region of said second conductivity type formed at said face and spaced from said first tank, a second channel subregion of said semiconductor layer spacing said fourth region from said fifth region, a second conductive gate insulatively disposed adjcaent said second channel subregion;

a sixth highly doped subregion of said second conductivity type formed at said face of said semiconductor layer, a third channel subregion of said semoconductor layer spacing said sixth region from said fifth region, said sixth region spaced from said fourth region and from said first tank;

a first conductive connection coupling together said fifth region and said first region, a second conductive connection coupling together said sixth region and said second region, a source of a first signal coupled to said third conductive gate to turn said thyristor on, a source of a second signal coupled to said second conductive gate to turn said thyristor off.

4. The gated thyristor of claim 3, wherein said first conductivity type is (p).

5. An automotive electrical system, comprising:

a gated thyristor formed at a face of a semiconductor layer of a first conductivity type, said semiconductor layer forming a portion of a monolithic integrated circuit chip, said thyristor including:

a first tank formed at said face to be of said second conductivity type;

a second tank formed at said face to be of said first conductivity type and within said first tank;

a first highly doped region formed at said face within said second tank to be of said second conductivity type;

a second highly doped region formed at said face adjoining said first and said second tanks and to be of said first conductivity type;

a third highly doped region formed at said face to be of said first conductivity type, a channel subregion of said first tank spacing said second highly doped region from said third highly doped region, said third highly doped region formed within said first tank and spaced from said second tank;

a conductive gate insulatively disposed adjacent said channel subregion so as to control the conductance thereof, said third highly doped region and said conductive gate conductively coupled together;

a fourth highly doped region of said second conductivity type formed at said face at a margin of said first tank and a portion of said semiconductor layer outside of said first tank;

a fifth highly doped region of said second conductivity type formed at said face and spaced from said first tank, a second channel subregion of said semiconductor layer spacing said fourth region from said fifth region, a second conductive gate insulatively disposed adjacent said second channel subregion;

a sixth highly doped subregion of said second conductivity type formed at said face of said semiconductor layer, a third channel subregion of said semiconductor layer spacing said sixth region from said fifth region, said sixth region spaced from said fourth region and from said first tank;

a first conductive connection coupling together said fifth region and said first region, a second conductive connection coupling together said sixth region and said second region;

logic circuitry formed on said chip to generate first and second control signals, a source of said first control signal coupled to said third conductive gate to turn said thyristor on, a source of second control signal coupled to said second conductive gate to turn said thyristor off; and a peripheral electrical device coupled to said third region for sinking operating current thereto, a battery coupled to said peripheral electrical device for supplying said operating current, a ground terminal coupled to said first highly doped region.

6. The automotive electrical system of claim 5, wherein said peripheral device is an exterior electrical lamp.

7. The automotive electrical system of claim 5, wherein said peripheral device comprises a solenoid.

8. A gated thyristor formed at a face of a semiconductor layer of a conductivity type, comprising:

a first tank region having a second conductivity type opposite said first conductivity type;

an annular second tank region of said first conductivity type formed at said face to laterally surround said first tank region;

a third highly doped region of said first conductivity type formed within said first tank region near said second annular tank region;

a fourth highly doped region of said second conductivity type formed within said third highly doped region;

fifth, sixth, seventh and eighth highly doped regions formed to be of said second conductivity type in said semiconductor layer and spaced from said first and second tank regions, a first channel subregion of said semiconductor layer spacing said fifth and sixth highly doped regions, a first conductive gate insulatively disposed adjacent said first channel subregion, a second channel subregion of said semiconductor layer spacing said seventh and eight highly doped regions, a second conductive gate insulatively disposed adjaent said second channel subregion, said fifth and sixth highly doped regions spaced from said seventh and eighth highly doped regions;

a first conductive connection coupling said fifth region with said first tank region, first and second voltage supplies, said first voltage supply supplying a voltage substantially different from that supplied by said second voltage supply, a second conductive connection coupling together said sixth region, said fourth region and said second voltage supply;

a third conductive connection coupling said seventh region with said first tank; and a fourth conductive connection coupling said first voltage supply, said eighth region and said second annular tank region.

9. The gated thyristor of claim 8, and further comprising:
a second semiconductor layer of said first conductivity type, a third semiconductor layer of said second conductivity type disposed between said second semiconductor layer and said semiconductor layer.

10. The gated thyristor of claim 8, wherein said first tank region extends from said face to said second semiconductor layer.

11. The gated thyristor of claim 8, and further comprising a guard ring of said second conductivity type formed from said face to said second layer and to surround said second annular tank region.

12. The gated thyristor of claim 8, wherein said third and fourth highly doped regions are annular.

13. The gated thyristor of claim 11, and further comprising a highly doped contact region of said second conductivity type disposed laterally inwardly of said third and fourth highly doped regions.

* * * * *